(12) United States Patent
Saito et al.

(10) Patent No.: US 7,220,499 B2
(45) Date of Patent: May 22, 2007

(54) CPP GIANT MAGNETORESISTIVE HEAD HAVING ANTIFERROMAGNETIC FILM DISPOSED IN REAR OF ELEMENT

(75) Inventors: Masamichi Saito, Niigata-ken (JP); Yoshihiro Nishiyama, Niigata-ken (JP); Yosuke Ide, Niigata-ken (JP); Eiji Umetsu, Niigata-ken (JP); Naoya Hasegawa, Niigata-ken (JP); Yasuo Hayakawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 280 days.

(21) Appl. No.: 10/823,484

(22) Filed: Apr. 13, 2004

(65) Prior Publication Data
US 2004/0207962 A1    Oct. 21, 2004

(30) Foreign Application Priority Data

| Apr. 18, 2003 | (JP) | ............................. 2003-114189 |
| Jul. 10, 2003 | (JP) | ............................. 2003-195159 |
| Feb. 24, 2004 | (JP) | ............................. 2004/047756 |

(51) Int. Cl.
*G11B 5/127*    (2006.01)

(52) U.S. Cl. .................. 428/811.5; 428/811.2; 428/815; 428/816; 360/324.11

(58) Field of Classification Search ...................... None
See application file for complete search history.

(56) References Cited

U.S. PATENT DOCUMENTS

| 5,739,987 | A  * | 4/1998  | Yuan et al. ............. 360/327.32 |
| 6,023,395 | A    | 2/2000  | Dill et al. |
| 6,052,263 | A    | 4/2000  | Gill |
| 6,219,212 | B1   | 4/2001  | Gill et al. |
| 6,259,586 | B1   | 7/2001  | Gill |
| 6,292,335 | B1 * | 9/2001  | Gill ....................... 360/324.11 |
| 6,327,121 | B1 * | 12/2001 | Nagasawa et al. ..... 360/324.11 |
| 6,330,136 | B1   | 12/2001 | Wang et al. |
| 6,381,105 | B1   | 4/2002  | Huai et al. |

(Continued)

FOREIGN PATENT DOCUMENTS

EP    1 416 474 A2    5/2004

(Continued)

OTHER PUBLICATIONS

Search Report dated Jul. 21, 2004 for British Patent Application No. GB 0408133.7.

*Primary Examiner*—Kevin M. Bernatz
(74) *Attorney, Agent, or Firm*—Brinks Hofer Gilson & Lione

(57) ABSTRACT

A CPP giant magnetoresistive head includes lower and upper shield layers with a predetermined distance therebetween, and a giant magnetoresistive element (GMR) including pinned and free magnetic layers disposed between the upper and lower shield layers with a nonmagnetic layer interposed between the pinned and free magnetic layers. A current flows perpendicularly to the film plane of the GMR. The magnetoresistive head further includes an antiferromagnetic layer (an insulating AF of Ni—O or $\alpha$-Fe$_2$O$_3$) provided in the rear of the GMR in a height direction to make contact with the upper or lower surface of a rear portion of the pinned magnetic layer which extends in the height direction, and an exchange coupling magnetic field is produced at the interface with the upper or lower surface, so that the magnetization direction of the pinned magnetic layer is pinned by the exchange coupling magnetic field in the height direction.

40 Claims, 37 Drawing Sheets

U.S. PATENT DOCUMENTS

| | | | |
|---|---|---|---|
| 6,466,419 B1 * | 10/2002 | Mao | 360/324.12 |
| 6,501,626 B1 | 12/2002 | Gill | |
| 6,519,117 B1 | 2/2003 | Gill | |
| 7,035,059 B2 * | 4/2006 | Gill | 360/324.11 |
| 2002/0044389 A1 | 4/2002 | Seigler | |
| 2002/0172840 A1 | 11/2002 | Terada et al. | |
| 2003/0053270 A1 | 3/2003 | Gill | |
| 2003/0179515 A1 * | 9/2003 | Pinarbasi | 360/324.11 |

FOREIGN PATENT DOCUMENTS

| | | |
|---|---|---|
| GB | 2 390 217 | 12/2003 |
| JP | 2000-123325 | 4/2000 |
| JP | 2001-266313 | 9/2001 |
| JP | 2001-307307 | 11/2001 |
| JP | 2002-232040 | 8/2002 |
| JP | 2002-305338 | 10/2002 |
| JP | 2002-314168 | 10/2002 |
| JP | 2002-319112 | 10/2002 |

* cited by examiner

CPP GIANT MAGNETORESISTIVE HEAD HAVING ANTIFERROMAGNETIC FILM DISPOSED IN REAR OF ELEMENT

This application claims the benefit of priority to Japanese Patent Application Nos. 2003-114189, 2003-195159 and 2004-047756, herein incorporated by reference.

BACKGROUND OF THE INVENTION

1. Field of the Invention

The present invention relates to a CPP (Current Perpendicular to the Plane) giant magnetoresistive head in which a sensing current flows in the thickness direction (perpendicularly to the film plane).

2. Description of the Related Art

Giant magnetoresistive (GMR) elements used for hard disk devices and magnetic sensors are roughly divided into a CIP (Current in the Plane) type in which a sensing current flows in parallel with the film plane of each of layers constituting an element, and a CPP (Current Perpendicular to the Plane) type in which a sensing current flows perpendicularly to the film plane of each of the layers constituting an element.

FIG. 55 is a longitudinal sectional view showing the structure of a CPP-GMR head using a conventional CPP-GMR element. A CPP-GMR head 100 comprises a lower shield layer 110 extending in the X direction shown in the drawing, a lower nonmagnetic metal film 120 formed on the lower shield layer 110 at its center in the X direction, and a free magnetic layer 131, a nonmagnetic metallic material layer 132, a pinned magnetic layer 133, an antiferromagnetic layer 134, and an upper nonmagnetic metal film 140, which are laminated on the lower nonmagnetic metal film 120. The CPP-GMR head 100 further comprises an upper shield layer 150 formed over the upper nonmagnetic metal film 140 to extend in the X direction, hard bias layers 163 formed in contact with parts of the free magnetic layer 131 and both sides of the nonmagnetic layer 132, insulating layers 161 filling in the respective spaces between the hard bias layers 163 and the lower shield layers 110, and insulating layers 164 filling in the respective spaces between the hard bias layers 163 and the upper shield layer 150. Furthermore, bias underlying layers 162 are disposed between the hard bias layers 163 and the insulating layers 161.

In the CPP-GMR head having the above-described construction, a sensing current also flows through the antiferromagnetic layer 134 comprising, for example, Pt—Mn. The antiferromagnetic layer 134 has a resistivity of about 200 μΩ·cm which is significantly higher than those of the nonmagnetic metal films 120 and 140, the free magnetic layer 131, and the pinned magnetic layer 133. Also, the antiferromagnetic layer 134 must be thickly formed for maintaining antiferromagnetic characteristics. For example, when the distance between the upper and lower shields is about 600 Å, the thickness of the antiferromagnetic layer 134 is about 200 Å. When the thick antiferromagnetic layer 134 having high resistivity is provided, the antiferromagnetic layer 134 has high resistance and thus generates heat when the sensing current flows therethrough. Since the temperature of the whole of the head is increased by the generated heat (Joule heat), the reliability and high-frequency characteristics of the head deteriorate. Also, the thick antiferromagnetic layer 134 causes a difficulty in decreasing the shield distance between the upper and lower shield layers, thereby causing an disadvantage to increasing the recording density.

Therefore, it has been recently proposed to omit the antiferromagnetic layer 134. However, in order to stabilize magnetization of the pinned magnetic layer 133 without using the antiferromagnetic layer 134, the material used for forming the pinned magnetic layer 133 is greatly limited, and it is thus difficult to improve a change (ΔR·A) in magnetoresistance per unit area. Also, when the magnetization of the pinned magnetic layer 133 is stabilized without using the antiferromagnetic layer 134, the magnetization of the pinned magnetic layer 133 is weakly pinned. Therefore, when the direction of a sensing current magnetic field generated by passing the sensing current is different from the direction of a magnetic moment of the pinned magnetic layer 133, the sensing current magnetic field has the problem of fluctuating the magnetization direction of the pinned magnetic layer 133.

In a CIP-GMR head, only about 10 percent of a sensing current flows through an antiferromagnetic layer, and the sensing current never flows through shield layers, thereby causing none of the above problems.

SUMMARY OF THE INVENTION

Accordingly, it is an object of the present invention to provide a CPP giant magnetoresistive head capable of strongly pinning magnetization of a pinned magnetic layer while decreasing Joule heat, promoting a higher recording density with narrowing of the distance between reproduction shields, and increasing a change (ΔR·A) in magnetoresistance per unit area and a sensing current to obtain high output.

The present invention has been achieved in consideration of the following facts: an antiferromagnetic layer for pinning magnetization of a pinned magnetic layer can be provided outside of a sensing current path to avoid the heat generation from the antiferromagnetic layer and decrease Joule heat even when the sensing current flows, magnetization of the pinned magnetic layer can be strongly pinned when the area of contact between the pinned magnetic layer and the antiferromagnetic layer is large, and a sensing current loss can be further decreased by using an insulating antiferromagnetic layer.

A CPP giant magnetoresistive head of the present invention comprises lower and upper shield layers with a predetermined shield distance therebetween, and a giant magnetoresistive element comprising a pinned magnetic layer, a free magnetic layer, and a nonmagnetic layer interposed between the pinned magnetic layer and the free magnetic layer, which are disposed between the upper and lower shield layers, a current flowing perpendicularly to the film plane of the giant magnetoresistive element, wherein an antiferromagnetic layer is provided in the rear of the giant magnetoresistive element in a height direction, for pinning the magnetization direction of the pinned magnetic layer in the height direction.

The antiferromagnetic layer is preferably provided in contact with the rear end surface of the pinned magnetic layer in the height direction or the upper or lower surface of a rear portion of the pinned magnetic layer in the height direction.

The antiferromagnetic layer provided in contact with the rear end surface of the pinned magnetic layer in the height direction produces an exchange coupling magnetic field in the interface with the rear end surface in the height direction, and the magnetization direction of the pinned magnetic layer is pinned by the exchange coupling magnetic field.

When the antiferromagnetic layer is provided in contact with the upper or lower surface of the rear portion of the pinned magnetic layer in the height direction, at least a portion of the pinned magnetic layer extends to the rear of the magnetoresistive element in the height direction. In this case, the antiferromagnetic layer produces an exchange coupling magnetic field in the interface with the upper or lower surface of the rear portion of the pinned magnetic layer, which extends in the height direction, and the magnetization direction of the pinned magnetic layer is pinned by the exchange coupling magnetic field. In this configuration, the area of contact between the pinned magnetic layer and the antiferromagnetic layer is larger than that of the case in which the antiferromagnetic layer is provided in contact with the rear end surface of the pinned magnetic layer in the height direction, thereby pinning the magnetization direction of the pinned magnetic layer by a greater exchange coupling magnetic field.

The dimension of the pinned magnetic layer in the height direction is preferably larger than that in the track width direction. When the dimension of the pinned magnetic layer in the height direction is larger than that in the track width direction, shape anisotropy occurs in parallel with the height direction, and magnetization pinning of the pinned magnetic layer can also be strengthened by the shape anisotropy.

The pinned magnetic layer preferably comprises a magnetic material having a positive magnetostriction constant and is exposed at a surface facing a recording medium. In this case, the symmetry of two-dimensional isotropic stress applied to the pinned magnetic layer is broken to apply uniaxial tensile stress to the pinned magnetic layer in parallel with the height direction. This inverse magnetostrictive effect stabilizes the magnetization direction of the pinned magnetic layer in an uniaxial direction parallel to the height direction.

The pinned magnetic layer may be formed in a laminated ferrimagnetic structure comprising first and second pinned magnetic layers which are laminated with a nonmagnetic intermediate layer provided therebetween. In the giant magnetoresistive element, the nonmagnetic layer and the free magnetic layer may be formed above or below the second pinned magnetic layer.

As a contact form between the pinned magnetic layer and the antiferromagnetic layer, for example, first to sixth forms are given. In the first to third forms, the nonmagnetic layer and the free magnetic layer are formed on the second pinned magnetic layer, while in the fourth to sixth forms, the nonmagnetic layer and the free magnetic layer are formed below the second pinned magnetic layer.

In the first form in which the nonmagnetic layer and the free magnetic layer are formed on the second pinned magnetic layer, each of the first pinned magnetic layer, the nonmagnetic intermediate layer and the second pinned magnetic layer extends to the rear of the nonmagnetic layer and the free magnetic layer in the height direction, and the antiferromagnetic layer is formed on the rear portion of the second pinned magnetic layer which extends in the height direction. In this way, when the antiferromagnetic layer contacts the upper surface of the second pinned magnetic layer, a wide contact area (an area where an exchange coupling magnetic field occurs) can be secured between the second pinned magnetic layer and the antiferromagnetic layer to stably and strongly pin the magnetization of the pinned magnetic layer, as compared with the case in which the antiferromagnetic layer contacts the rear end of the second pinned magnetic layer in the height direction.

Also, nonmagnetic metal films are preferably interposed between the lower shield layer and the first pinned magnetic layer and between the free magnetic layer and the upper shield layer, for relieving the concentration of the sensing current in the lower shield layer and the upper shield layer. The nonmagnetic metal film may comprise a nonmagnetic metallic material containing at least one element of Au, Ag, Cu, Ru, Rh, Ir, Pd, Ni—Cr, (Ni—Fe)—Cr, and Cr. Particularly, the nonmagnetic metal film interposed between the lower shield layer and the first pinned magnetic layer preferably comprises any one of Ta/Cu, Ta/Ru/Cu, Ta/Cr, Ta/Ni—Cr, Ta/(Ni—Fe)—Cr, and Cr, for causing the nonmagnetic metal layer to function as a seed layer including the first pinned magnetic layer in the magnetoresistive element. The seed effect of the nonmagnetic metal film also stabilizes magnetization pinning of the first pinned magnetic layer. However, when the nonmagnetic metallic material used for forming the nonmagnetic metal film contains Cr, the Cr content preferably exceeds 20 atomic percent.

Practically, an insulating layer is interposed between the antiferromagnetic layer and the upper shield layer. As a result, substantially no sensing current flows through the antiferromagnetic layer to decrease a shunt loss, thereby improving reproduction output. Instead of interposing the insulating layer, an insulating antiferromagnetic layer may be used as the antiferromagnetic layer. Alternatively, an antiferromagnetic metal layer in contact with the upper surface of the second pinned magnetic layer and an insulating antiferromagnetic layer laminated on the antiferromagnetic metal layer may be used as the antiferromagnetic layer. When the antiferromagnetic metal layer is interposed between the pinned magnetic layer and the insulating antiferromagnetic layer, the pinned magnetic layer sufficiently couples with the insulating antiferromagnetic layer to produce a great exchange coupling magnetic field. The insulating antiferromagnetic layer comprises, for example, Ni—O or $\alpha$-Fe$_2$O$_3$, and the antiferromagnetic metal layer comprises, for example, Pt—Mn or Ir—Mn.

In the second form in which the nonmagnetic layer and the free magnetic layer are formed on the second pinned magnetic layer, each of the first pinned magnetic layer, the nonmagnetic intermediate layer and the second pinned magnetic layer extends to the rear of the nonmagnetic layer and the free magnetic layer in the height direction, and the antiferromagnetic layer is formed in contact with the lower surface of the rear portion of the first pinned magnetic layer which extends in the height direction. In this form, a wide contact area (an area where an exchange coupling magnetic field occurs) can be secured between the first pinned magnetic layer and the antiferromagnetic layer to stably and strongly pin the magnetization of the pinned magnetic layer.

Also, a nonmagnetic metal film is preferably provided on the lower shield layer, for relieving the concentration of the sensing current. When the nonmagnetic metal film is provided, the antiferromagnetic layer is formed on the rear end portion of the nonmagnetic metal film in the height direction, and the first pinned magnetic layer is practically formed over the antiferromagnetic layer and the nonmagnetic metal film. The nonmagnetic metal film provided on the lower shield layer preferably comprises any one of Ta/Cu, Ta/Ru/Cu, Ta/Cr, Ta/Ni—Cr, Ta/(Ni—Fe)—Cr, and Cr, for causing the nonmagnetic metal layer to function as a seed layer including the first pinned magnetic layer in the magnetoresistive element. In order to relieve the concentration of the sensing current, a nonmagnetic metal film comprising a nonmagnetic metallic material containing at last one element of Au, Ag, Cu, Ru, Rh, Ir, Pd, Ni—Cr, (Ni—Fe)—Cr, and Cr may also be interposed between the upper shield layer and the free magnetic layer. However, when the nonmagnetic metallic material used for forming the nonmagnetic metal film contains Cr, the Cr content preferably exceeds 20 atomic percent.

An insulating layer is practically interposed between the upper shield layer and the rear portion of the second pinned magnetic layer which extends in the height direction.

In order to eliminate a sensing current loss, the insulating antiferromagnetic layer is preferably used as the antiferromagnetic layer. The insulating antiferromagnetic layer may comprise Ni—O or $\alpha$-$Fe_2O_3$.

In the third form, a magnetostrictive enhancement layer is further provided immediately below the first pinned magnetic layer and interposed between the first pinned magnetic layer and the antiferromagnetic layer in a rear region in the height direction in the second form. The magnetostrictive enhancement layer preferably has the same composition as the antiferromagnetic layer and has a disordered crystal structure thinner than the antiferromagnetic layer, and produces mismatch strain in the interface with the first pinned magnetic layer. When the crystal structures of the magnetostrictive enhancement layer and the first pinned magnetic layer are distorted in the interface therebetween, the magnetostriction of the first pinned magnetic layer is increased to enhance magnetization pinning of the first pinned magnetic layer and the pinned magnetic layer due to the inverse magnetostrictive effect.

Each of the antiferromagnetic layer and the magnetostrictive enhancement layer preferably comprises a Z—Mn alloy (wherein Z is at least one element of Pt, Pd, Ir, Rh, Ru, Os, Ni, and Fe).

In order to distort the crystal structures of the magnetostrictive enhancement layer and the first pinned magnetic layer, the crystal of the first pinned magnetic layer is preferably epitaxial or heteroepitaxial to the crystal of the magnetostrictive enhancement layer.

When the magnetostrictive enhancement layer comprises the Z—Mn alloy, the magnetostrictive enhancement layer has a face-centered cubic structure near at least the interface with the first pinned magnetic layer, and an equivalent crystal plane represented by {111} plane is preferentially oriented in parallel with the interface.

The thickness of the magnetostrictive enhancement layer is preferably 5 Å to 50 Å. Within this thickness range, the magnetostrictive enhancement layer comprising the Z—Mn alloy maintains the face-centered cubic structure (fcc) which is the crystal structure at the time of deposition. When the thickness of the magnetostrictive enhancement layer exceeds 50 Å, the crystal structure of the magnetostrictive enhancement layer is converted to a CuAuI ordered face-centered tetragonal structure (fct) exhibiting antiferromagnetic characteristics when heat of about 250° C. is applied. However, even when the thickness of the magnetostrictive enhancement layer exceeds 50 Å, the magnetostrictive enhancement layer maintains the face-centered cubic structure (fcc), which is the crystal structure at the time of deposition, unless heat of about 250° C. is applied.

The Z element content of the Z—Mn alloy used for forming the antiferromagnetic layer and the magnetostrictive enhancement layer is preferably 40 atomic percent to 95 atomic percent. Within this range, the first pinned magnetic layer takes a positive large value of magnetostriction constant, and thus magnetization of the first pinned magnetic layer is further stabilized.

The first pinned magnetic layer preferably has a face-centered cubic structure near at least the interface with the magnetostrictive enhancement layer, and an equivalent crystal plane represented by {111} plane is preferentially oriented in parallel with the interface. Since, as described above, the magnetostrictive enhancement layer has a face-centered cubic (fcc) structure, and an equivalent crystal plane represented by {111} plane is preferentially oriented in parallel with the interface with the first pinned magnetic layer, the constituent atoms of the first pinned magnetic layer easily overlap the constituent atoms of the magnetostrictive enhancement layer. Namely, both layers are epitaxially jointed together. However, there is a predetermined difference or more between the nearest neighbor interatomic distance in {111} plane of the first pinned magnetic layer and the nearest neighbor interatomic distance in {111} plane of the magnetostrictive enhancement layer. Therefore, the constituent atoms of the first pinned magnetic layer overlap the constituent atoms of the magnetostrictive enhancement layer while distorting the crystal structures of both layers near the interface therebetween, thereby increasing the magnetostriction of the first pinned magnetic layer.

When the first pinned magnetic layer comprises Co or $Co_nFe_m$ ($m \leq 20$ and $n+m=100$), the first pinned magnetic layer has a face-centered cubic structure, and an equivalent crystal plane represented by {111} plane is preferentially oriented in parallel with the interface.

The first pinned magnetic layer may have a body-centered cubic structure (bcc) near at least the interface with the magnetostrictive enhancement layer, and an equivalent crystal plane represented by {110} plane is preferentially oriented in parallel with the interface. In this case, the constituent atoms of the first pinned magnetic layer easily overlap the constituent atoms of the magnetostrictive enhancement layer, and both layers are heteroepitaxially jointed together. However, there is a predetermined difference or more between the nearest neighbor interatomic distance in {110} plane of the first pinned magnetic layer and the nearest neighbor interatomic distance in {111} plane of the magnetostrictive enhancement layer. Therefore, the crystal structures of the first pinned magnetic layer and the magnetostrictive enhancement layer are distorted near the interface therebetween, thereby increasing the magnetostriction of the first pinned magnetic layer.

When the first pinned magnetic layer comprises $Co_nFe_m$ ($m \geq 20$ and $n+m=100$), the first pinned magnetic layer has a body-centered cubic structure (bcc), and an equivalent crystal plane represented by {110} plane is preferentially oriented in parallel with the interface with the magnetostrictive enhancement layer. $Co_nFe_m$ ($m \geq 20$ and $n+m=100$) having a body-centered cubic structure has a greater magnetostriction constant than that of Co or $Co_nFe_m$ ($m \leq 20$ and $n+m=100$) having a face-centered cubic structure, particularly with a composition near m=50, thereby exhibiting the greater inverse magnetostrictive effect. $Co_nFe_m$ ($m \geq 20$ and $n+m=100$) having a body-centered cubic structure has high coercive force and can thus strengthen magnetization pinning of the first pinned magnetic layer.

Furthermore, the first pinned magnetic layer may have a face-centered cubic structure near the interface with the magnetostrictive enhancement layer, an equivalent crystal plane represented by {111} plane being preferentially oriented in parallel with the interface, and the first pinned magnetic layer may have a body-centered cubic structure near the interface with the nonmagnetic intermediate layer, an equivalent crystal plane represented by {110} plane being preferentially oriented in parallel with the interface. In this way, when the first pinned magnetic layer has the body-centered cubic structure near the interface with the nonmagnetic intermediate layer, magnetostriction of the first pinned magnetic layer is increased to exhibit the great inverse magnetostrictive effect. On the other hand, when the first pinned magnetic layer has the face-centered cubic structure near the interface with the magnetostrictive enhancement layer, the pinned magnetic layer, the nonmagnetic intermediate layer and the free magnetic layer have constant crystal orientation, thereby increasing the change ΔR·A in magnetoresistance per unit area.

When the first pinned magnetic layer has a composition of Co or $Co_nFe_m$ (m≦20 and n+m=100) near the interface with the magnetostrictive enhancement layer, and a composition of $Co_nFe_m$ (m≧20 and n+m=100) near the interface with the nonmagnetic intermediate layer, the first pinned magnetic layer has a face-centered cubic structure in which an equivalent crystal plane represented by {111} plane is preferentially oriented in parallel with the interface with the magnetostrictive enhancement layer near the interface, and has a body-centered cubic structure in which an equivalent crystal plane represented by {110} plane is preferentially oriented in parallel with the interface with the nonmagnetic intermediate layer near the interface. Also, when the composition comprises $Co_nFe_m$ (m≧20 and n+m=100) near the interface with the nonmagnetic intermediate layer, a RKKY interaction between the first pinned magnetic layer and the second pinned magnetic layer through the nonmagnetic intermediate layer is desirably strengthened. The first pinned magnetic layer has a Fe concentration gradually increasing from the interface with the magnetostrictive enhancement layer to the interface with the nonmagnetic intermediate layer.

In the third form, nonmagnetic metal films may be interposed between the lower shield layer and the first pinned magnetic layer and between the free magnetic layer and the upper shield layer. The nonmagnetic metal film preferably comprises a nonmagnetic metallic material containing at least one element of Au, Ag, Cu, Ru, Rh, Ir, Pd, Ni—Cr, (Ni—Fe)—Cr, and Cr. Particularly, the nonmagnetic metal film interposed between the lower shield layer and the first pinned magnetic layer preferably comprises any one of Ta/Cu, Ta/Ru/Cu, Ta/Cr, Ta/Ni—Cr, Ta/(Ni—Fe)—Cr, and Cr, for causing the nonmagnetic metal layer to function as a seed layer including the first pinned magnetic layer in the magnetoresistive element. However, when the nonmagnetic metallic material used for forming the nonmagnetic metal film contains Cr, the Cr content preferably exceeds 20 atomic percent.

Practically, an insulating layer is interposed between the upper shield layer and the second pinned magnetic layer rearwardly extending in the height direction.

The antiferromagnetic layer is preferably an insulating antiferromagnetic layer, for eliminating a sensing current loss. The insulating antiferromagnetic layer may comprise Ni—O or $α-Fe_2O_3$.

In the fourth form, the nonmagnetic layer and the free magnetic layer are provided below provided the second pinned magnetic layer, and the first pinned magnetic layer extends to the rear of the free magnetic layer, the nonmagnetic layer, the second pinned magnetic layer and the nonmagnetic intermediate layer in the height direction. Also, the antiferromagnetic layer is in contact with the upper surface of the rear portion of the first pinned magnetic layer extending in the height direction. In this way, when the antiferromagnetic layer is in contact with the upper surface of the rear portion of the first pinned magnetic layer, a wide contact area (an area where an exchange coupling magnetic field occurs) can be secured between the first pinned magnetic layer and the antiferromagnetic layer to stably and strongly pin the magnetization of the pinned magnetic layer.

Also, nonmagnetic metal films are preferably interposed between the lower shield layer and the free magnetic layer and between the first pinned magnetic layer and the upper shield layer. The nonmagnetic metal film may comprise a nonmagnetic metallic material containing at least one element of Au, Ag, Cu, Ru, Rh, Ir, Pd, Ni—Cr, (Ni—Fe)—Cr, and Cr. Particularly, the nonmagnetic metal film interposed between the lower shield layer and the free magnetic layer preferably comprises any one of Ta/Cu, Ta/Ru/Cu, Ta/Cr, Ta/Ni—Cr, Ta/(Ni—Fe)—Cr, and Cr, for causing the nonmagnetic metal layer to function as a seed layer for the magnetoresistive element including the first pinned magnetic layer. However, when the nonmagnetic metallic material used for forming the nonmagnetic metal film contains Cr, the Cr content preferably exceeds 20 atomic percent.

The nonmagnetic metal film interposed between the first pinned magnetic layer and the upper shield layer may comprise a first upper nonmagnetic metal film disposed to cover the upper surface of the antiferromagnetic layer, and a second upper nonmagnetic metal film disposed over the first upper nonmagnetic metal film and the first pinned magnetic layer. The first upper nonmagnetic metal film practically comprises Cr for causing the first upper nonmagnetic metal film to function as a stopper in the RIE (reactive ion etching) step of forming the antiferromagnetic layer.

Practically, an insulating layer is disposed below the first pinned magnetic layer and in the rear of the free magnetic layer, the nonmagnetic layer, the second pinned magnetic layer and the nonmagnetic intermediate layer in the height direction.

The antiferromagnetic layer preferably comprises an insulating antiferromagnetic layer or a laminate of an antiferromagnetic metal layer in contact with the first pinned magnetic layer and an insulating antiferromagnetic layer laminated on the antiferromagnetic metal layer. When the antiferromagnetic metal layer is interposed between the pinned magnetic layer and the insulating antiferromagnetic layer, a greater exchange coupling magnetic field can be produced. The insulating antiferromagnetic layer comprises, for example, Ni—O or $α-Fe_2O_3$, and the antiferromagnetic metal layer comprises, for example, Pt—Mn or Ir—Mn.

In the fifth form, the nonmagnetic layer and the free magnetic layer are formed below the second pinned magnetic layer, each of the second pinned magnetic layer, the nonmagnetic intermediate layer and the first pinned magnetic layer extends to the rear of the nonmagnetic layer and the free magnetic layer in the height direction, and the antiferromagnetic layer is formed in contact with the upper surface of the rear portion of the first pinned magnetic layer which extends in the height direction. In this way, when the antiferromagnetic layer is formed in contact with the upper surface of the rear portion of the first pinned magnetic layer, a wide contact area (an area where an exchange coupling magnetic field occurs) can be secured between the first pinned magnetic layer and the antiferromagnetic layer to stably and strongly pin the magnetization of the pinned magnetic layer. Also, not only the first pinned magnetic layer but also the whole of the pinned magnetic layer rearwardly extends in the height direction, and thus magnetic coupling between the first and second pinned magnetic layers due to a RKKY interaction can be strengthened.

Furthermore, an antioxidative layer comprising an inoxidizable nonmagnetic material may be provided between the nonmagnetic layer and the second pinned magnetic layer. The antioxidative layer is formed to a thickness of as small as 5 Å to 10 Å. The antioxidative layer with a thickness in this range prevents surface oxidation of the nonmagnetic layer even when the nonmagnetic layer and the second pinned magnetic layer are discontinuously deposited by separate steps, thereby preventing deterioration of the giant magnetoresistive effect of the giant magnetoresistive element.

In the fifth form, nonmagnetic metal films are preferably provided between the lower shield layer and the free magnetic layer and between the first pinned magnetic layer and the upper shield layer. As described above, the nonmagnetic metal film may comprise a nonmagnetic metallic material containing at least one element of Au, Ag, Cu, Ru, Rh, Ir, Pd, Ni—Cr, (Ni—Fe)—Cr, and Cr. The nonmagnetic metal film interposed between the first pinned magnetic layer and the upper shield layer may comprise a first upper nonmagnetic metal film disposed to cover the upper surface of the antiferromagnetic layer, and a second upper nonmagnetic metal film disposed over the first upper nonmagnetic metal film and the first pinned magnetic layer. In this case, the first upper nonmagnetic metal film preferably comprises Cr. The nonmagnetic metal film interposed between the lower shield layer and the free magnetic layer preferably comprises any one of Ta/Cu, Ta/Ru/Cu, Ta/Cr, Ta/Ni—Cr, Ta/(Ni—Fe)—Cr, and Cr, for causing the nonmagnetic metal layer to function as a seed layer for the magnetoresistive element including the first pinned magnetic layer. However, when the nonmagnetic metallic material used for forming the nonmagnetic metal film contains Cr, the Cr content preferably exceeds 20 atomic percent.

An insulating layer is practically interposed below the second pinned magnetic layer and in the rear of the free magnetic layer and the nonmagnetic layer in the height direction.

The antiferromagnetic layer preferably comprises an insulating antiferromagnetic layer or a laminate of an antiferromagnetic metal layer in contact with the first pinned magnetic layer and an insulating antiferromagnetic layer laminated on the antiferromagnetic metal layer. The insulating antiferromagnetic layer comprises, for example, Ni—O or $\alpha$-Fe$_2$O$_3$, and the antiferromagnetic metal layer comprises, for example, Pt—Mn or Ir—Mn.

In the sixth form, the nonmagnetic layer and the free magnetic layer are formed below the second pinned magnetic layer, each of the first pinned magnetic layer, the nonmagnetic intermediate layer and the second pinned magnetic layer extends to the rear of the nonmagnetic layer and the free magnetic layer in the height direction, and the insulating antiferromagnetic layer is formed in contact with the lower surface of the rear portion of the second pinned magnetic layer which extends in the height direction. In this way, when the insulating antiferromagnetic layer is formed in contact with the lower surface of the rear portion of the second pinned magnetic layer, a wide contact area (an area where an exchange coupling magnetic field occurs) can be secured between the first pinned magnetic layer and the antiferromagnetic layer to stably and strongly pin the magnetization of the pinned magnetic layer. Also, not only the first pinned magnetic layer but also the whole of the pinned magnetic layer rearwardly extends in the height direction, and thus magnetic coupling between the first and second pinned magnetic layers due to a RKKY interaction can be strengthened. The insulating antiferromagnetic layer may comprise, for example, Ni—O or $\alpha$-Fe$_2$O$_3$.

In each of the first to sixth forms, part or entirety of the second pinned magnetic layer may comprise Fe—Co—Cu (wherein Fe>10 atomic percent, Co>30 atomic percent, and Cu>5 atomic percent), Fe—Co—Cu—X (wherein X is at least one element of Pt, Pd, Mn, Si, Au, and Ag), or CO$_2$MnY (wherein Y is at least one element of Ge, Si, Sn, and Al). Similarly, part or entirety of the free magnetic layer may comprise Fe—Co—Cu (wherein Fe>10 atomic percent, Co>30 atomic percent, and Cu>5 atomic percent), Fe—Co—Cu—X (wherein X is at least one element of Pt, Pd, Mn, Si, Au, and Ag), or CO$_2$MnY (wherein Y is at least one element of Ge, Si, Sn, and Al).

The present invention can be applied to not only a CPP giant magnetoresistive head comprising a single spin-valve giant magnetoresistive element, but also a CPP giant magnetoresistive head comprising a dual spin-valve giant magnetoresistive element. The dual spin-valve type comprises lower and upper shield layers with a predetermined shield distance therebetween, and a dual spin-valve giant magnetoresistive element comprising a lower pinned magnetic layer, a lower nonmagnetic layer, a free magnetic layer, an upper nonmagnetic layer and an upper pinned magnetic layer, which are laminated in turn between the upper and lower shield layers, a current flowing perpendicularly to the film plane of the giant magnetoresistive element. This CPP giant magnetoresistive head of the present invention is characterized in that an antiferromagnetic layer is provided in the rear of the giant magnetoresistive element in the height direction, for pinning the magnetization directions of the lower pinned magnetic layer and the upper pinned magnetic layer in the height direction.

Specifically, the lower pinned magnetic layer and the upper pinned magnetic layer preferably extend to the rear of the free magnetic layer, the lower nonmagnetic layer and the upper nonmagnetic layer in the height direction, and the antiferromagnetic layer produces an exchange coupling magnetic field in each of the interface with the upper surface of the rear portion of the lower pinned magnetic layer and the interface with the lower surface of the rear portion of the upper pinned magnetic layer, each of the rear portions extending in the height direction. Therefore, the magnetization directions of the lower pinned magnetic layer and the upper pinned magnetic layer are pinned by the respective exchange coupling magnetic fields. The antiferromagnetic layer preferably comprises an insulating antiferromagnetic layer or an antiferromagnetic layer comprising a laminate of an antiferromagnetic metal layer in contact with the lower pinned magnetic layer and an insulating antiferromagnetic layer in contact with the upper pinned magnetic layer. When the antiferromagnetic metal layer is interposed between the pinned magnetic layer and the insulating antiferromagnetic layer, coupling between the pinned magnetic layer and the insulating antiferromagnetic layer is improved to further strengthen an exchange coupling magnetic field acting on the pinned magnetic layer. The insulating antiferromagnetic layer comprises, for example, Ni—O or $\alpha$-Fe$_2$O$_3$, and the antiferromagnetic metal layer comprises, for example, Pt—Mn or Ir—Mn.

In another form, each of a lower pinned magnetic layer and an upper pinned magnetic layer extends to the rear of a free magnetic layer, a lower nonmagnetic layer and an upper nonmagnetic layer in the height direction. An antiferromagnetic layer preferably comprises a first antiferromagnetic layer for pinning the magnetization direction of the lower pinned magnetic layer in the height direction by an exchange coupling magnetic field produced in the interface with the lower surface of the lower pinned magnetic layer, and a second antiferromagnetic layer for pinning the magnetization direction of the upper pinned magnetic layer in the height direction by an exchange coupling magnetic field produced in the interface with the lower surface of the upper pinned magnetic layer. The first antiferromagnetic layer is preferably an antiferromagnetic metal layer comprising, for example, Pt—Mn or the like, and the second antiferromagnetic layer is preferably an insulating antiferromagnetic layer comprising, for example, Ni—O or $\alpha\text{-Fe}_2\text{O}_3$.

In the CPP giant magnetoresistive head of each of the forms, practically, the nonmagnetic layer is a Cu layer, and the magnetic intermediate layer is a Ru layer.

In the present invention, an antiferromagnetic layer is provided in the rear of a giant magnetoresistive element, for pinning the magnetization direction of a pinned magnetic layer, and thus the antiferromagnetic layer is absent from the flowing path of a sensing current to prevent the heat generation from the antiferromagnetic layer even when the sensing current flows therethrough. Therefore, the Joule heat generated by passing the sensing current is significantly decreased to suppress an increase in the element temperature and improve reliability. Also, an increase in recording density can be promoted with narrowing of the reproduction shield distance.

Furthermore, in the present invention, at least a portion of the pinned magnetic layer extends to the rear of the giant magnetoresistive element in the height direction, and the antiferromagnetic layer provided in the rear of the giant magnetoresistive element in the height direction is in contact with the upper or lower surface of the extending rear portion of the pinned magnetic layer. Therefore, a wide contact area (an area where an exchange coupling magnetic field occurs) can be secured between the pinned magnetic layer and the antiferromagnetic layer, thereby stably and strongly pinning magnetization of the pinned magnetic layer.

Furthermore, in the present invention, magnetization pinning of the pinned magnetic layer is strengthened by the inverse magnetostrictive effect, shape anisotropy and the seed effect, and thus magnetization of the pinned magnetic layer is little fluctuated, thereby increasing a change $\Delta R \cdot A$ in magnetoresistance per unit area. Even if the direction of a sensing current magnetic field is different from the direction of magnetic moment (synthetic magnetic moment) of the pinned magnetic layer, magnetization of the pinned magnetic layer is not fluctuated by the sensing current magnetic field, thereby increasing the sensing current density and output.

Furthermore, in the present invention, an insulating antiferromagnetic layer is provided for pinning the magnetization direction of the pinned magnetic layer, and thus the sensing current does not flow into the insulating antiferromagnetic layer, thereby suppressing a current loss and increasing output.

BRIEF DESCRIPTION OF THE DRAWINGS

FIGS. 9A and 9B are partial sectional views showing a step of a method for manufacturing the CPP giant magnetoresistive head shown in FIGS. 6 to 8, in which FIG. 9A is a partial section view from a surface facing a recording medium, and FIG. 9B is a partial sectional view taken along a central line of the element in parallel with the height direction;

FIGS. 10A and 10B are partial sectional views showing a step after the step shown in FIG. 9, in which FIG. 10A is a partial section view from the surface facing the recording medium, and FIG. 10B is a partial sectional view taken along a central line of the element in parallel with the height direction;

FIGS. 11A and 11B are partial sectional views showing a step after the step shown in FIG. 10, in which FIG. 11A is a partial section view from the surface facing the recording medium, and FIG. 11B is a partial sectional view taken along a central line of the element in parallel with the height direction;

FIGS. 12A and 12B are partial sectional views showing a step after the step shown in FIG. 11, in which FIG. 12A is a partial section view from the surface facing the recording medium, and FIG. 12B is a partial sectional view taken along a central line of the element in parallel with the height direction;

FIGS. 48A and 48B are partial sectional views showing a step after the step shown in FIG. 47, in which FIG. 48A is a partial section view from the surface facing the recording medium, and FIG. 48B is a partial sectional view taken along a central line of the element in parallel with the height direction;

DESCRIPTION OF THE PREFERRED EMBODIMENTS

The present invention will be described below with reference to the drawings. In each of the drawings, the X direction corresponds to the track width direction, the Y direction corresponds to the direction of a leakage magnetic field from a recording medium, and the Z direction corresponds to the moving direction of the recording medium and the lamination direction of layers which constitute a giant magnetoresistive element.

Figure 1:
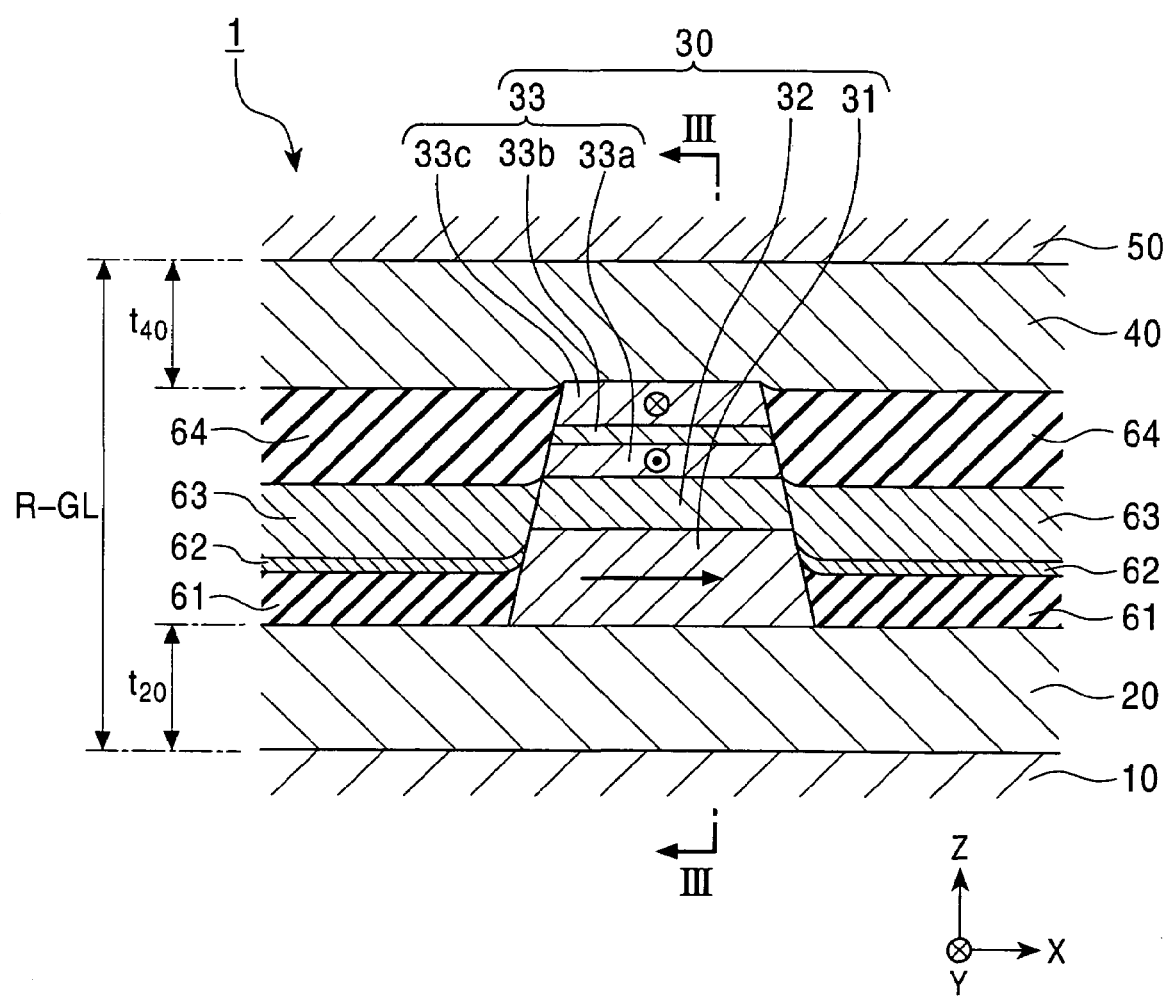
FIG. 1 is a longitudinal sectional view showing the structure of a CPP giant magnetoresistive head (CPP-GMR head) according to a first embodiment of the present invention, as viewed from a surface facing a recording medium.
Figure 2:
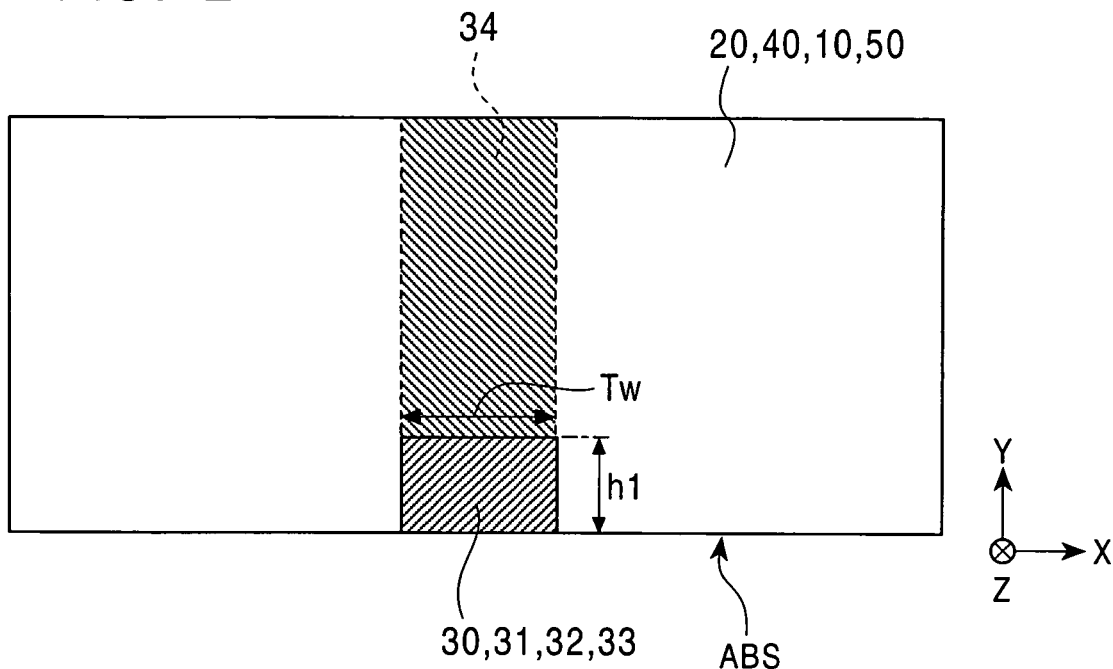
FIG. 2 is a XY plan view showing a range in which the upper large-area nonmagnetic metal film, the lower large-area nonmagnetic metal film and the GMR element shown in FIG. 1 are formed.
Figure 3:
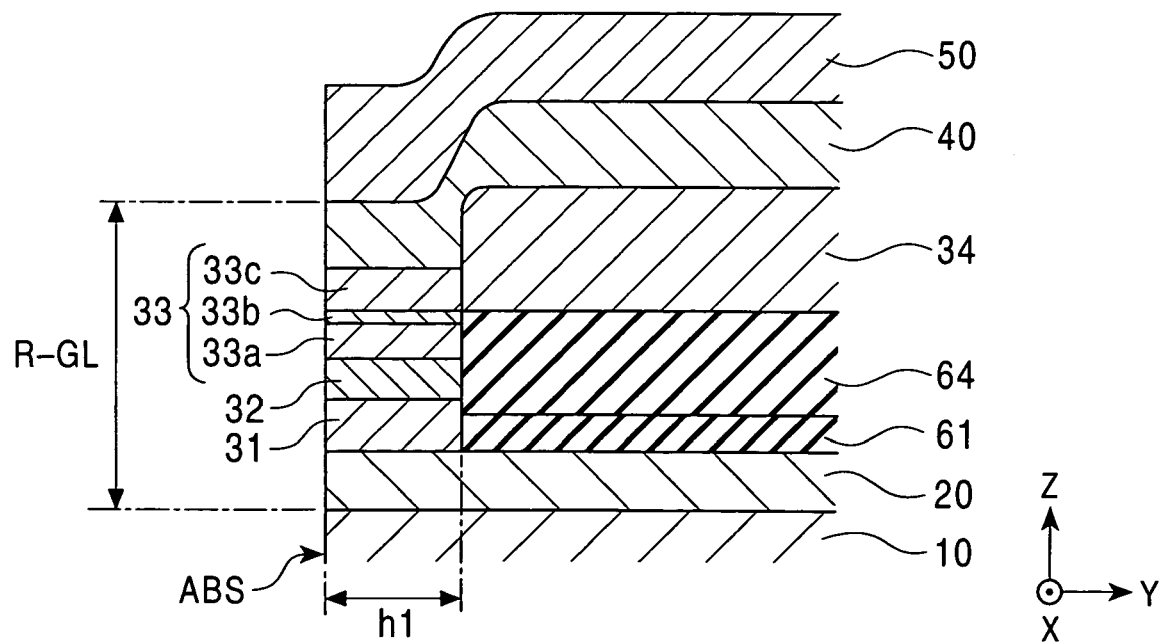
FIG. 3 is a sectional view taken along line III-III in FIG. 1.

FIGS. 1 to 5 show a CPP giant magnetoresistive head (CPP-GMR head) according to a first embodiment of the present invention. FIG. 1 is a partial sectional view showing the structure of a CPP-GMR head 1, as viewed from a surface facing the recording medium, and FIG. 2 is a schematic top plan view of a GMR element 30, and FIG. 3 is a partial sectional view showing the structure of the CPP-GMR head 1, taken along a central line of the element.

The CPP-GMR head 1 comprises lower and upper shield layers 10 and 50 with a predetermined shield distance R-GL therebetween in the Z direction shown in the drawing, a lower large-area nonmagnetic metal film 20, the GMR element 30 exhibiting a giant magnetoresistive effect, and an upper large-area nonmagnetic metal film 40, the lower and upper large-area nonmagnetic metal films 20 and 40 and the GMR element 30 being disposed between the lower and upper shield layers 10 and 50.

Each of the lower and upper shield layers 10 and 50 functions as a magnetic shield and an electrode, and is formed in a sufficiently wider area than that of the GMR element 30, as shown in FIGS. 1 and 2. Each of the lower and upper shield layers 10 and 50 is formed to a thickness of about 1 μm by using a soft magnetic material such as NiFe or the like for obtaining a sufficient magnetic shield effect.

The lower large-area nonmagnetic metal film 20 functions as a gap layer formed directly on the lower shield layer 10, and also functions as an electrode and a seed layer for regularly forming the GMR element 30. The upper large-area nonmagnetic metal film 40 functions as a gap layer disposed just below the upper shield layer 50, and also functions as an electrode together with the upper shield layer 50.

The lower large-area nonmagnetic metal film 20 and the upper large-area nonmagnetic metal film 40 are in direct contact with the lower surface (a free magnetic layer 31) and the upper surface (a second pinned magnetic layer 33c), respectively, of the GMR element 30. As shown in FIGS. 1 and 2, each of the lower and upper large-area nonmagnetic metal films 20 and 40 has an area which is sufficiently larger than that of the GMR element 30 and substantially the same as that of the lower shield layer 10 and the upper shield layer 50.

Each of the lower and upper large-area nonmagnetic metal films 20 and 40 comprises a nonmagnetic metallic material having lower resistivity than that of the lower and upper shield layers 10 and 50. For example, each of the lower and upper large-area nonmagnetic metal films 20 and 40 preferably comprises at least one element of Au, Ag, Cu, Ru, Rh, Ir, Pd, Ni—Cr, (Ni—Fe)—Cr, and Cr. When the material contains Cr, the Cr content preferably exceeds 20 atomic percent. Each of the lower and upper large-area nonmagnetic metal films 20 and 40 may comprise a single film or a laminated film. In this embodiment, the lower large-area nonmagnetic metal film 20 comprises, for example, any one of Ta/Cu, Ta/Ru/Cu, Ta/Cr, Ta/Ni—Cr, Ta/(Ni—Fe)—Cr, and Cr, for causing the lower large-area nonmagnetic metal film 20 to function as a seed layer of the GMR element 30.

Each of the lower and upper large-area nonmagnetic metal films 20 and 40 is formed to a thickness of ¼ or more of the shield distance R-GL. For example, when the shield distance R-GL is 480 Å to 800 Å, the thickness t20 or t40 of each of the lower and upper large-area nonmagnetic metal films 20 and 40 is preferably 60 Å to 300 Å. Within this thickness range, the resistivity of the large-area nonmagnetic metal films 20 and 40 can be decreased to about ⅕ to 1/10 of that of NiFe used as a material for forming the shield layers 10 and 50. Namely, the sheet resistance of the large-area nonmagnetic metal films 20 and 40 each having a thickness of 60 Å to 300 Å corresponds to the sheet resistance of a NiFe film having a thickness of 300 Å to 3000 Å. Therefore, the sensing current easily flows through the large-area nonmagnetic metal films 20 and 40 to relieve the concentration of the sensing current in the interfaces between the large-area nonmagnetic metal films 20 and 40 and the shield layers 10 and 50. Consequently, a resistance change due to the AMR effect of the lower and upper shield layers 10 and 50 can be suppressed to a low level. The thickness t20 of the lower large-area nonmagnetic metal film 20 may be the same as or different from that t40 of the upper large-area nonmagnetic metal film 40.

As shown in FIG. 1, the GMR element 30 is disposed at the substantially center of the shield layers 10 and 50 and the large-area nonmagnetic metal films 20 and 40 in the track width direction (the X direction shown in the drawing), and the GMR element 30 is sandwiched between the large-area nonmagnetic metal films 20 and 40 in the thickness direction. Since each of the large-area nonmagnetic metal films 20 and 40 is formed to a thickness of ¼ or more of the shield distance R-GL, the GMR element 30 is formed to a thickness of ¾ or less of the shield distance R-GL.

The GMR element 30 comprises the free magnetic layer 31, a nonmagnetic layer 32 and a pinned magnetic layer 33 which are laminated on the lower large-area nonmagnetic metal film 20 in that order from below. As shown in FIGS. 2 and 3, an antiferromagnetic layer 34 is provided in the rear of the GMR element 30 (strictly the free magnetic layer 31 and the nonmagnetic layer 32) in the height direction (the Y direction shown in the drawings), for pinning the magnetization direction of the pinned magnetic layer 33. The free magnetic layer 31, the nonmagnetic layer 32 and the pinned magnetic layer 33 have the same dimension (h1) in the height direction. The lower large-area nonmagnetic metal film 20, the free magnetic layer 31, the nonmagnetic layer 32, the pinned magnetic layer 33 and the upper large-area nonmagnetic metal film 40 are exposed at the surface (ABS) facing the recording medium, and the antiferromagnetic layer 34 is not exposed at the surface. In the GMR element 30, the pinned magnetic layer, the nonmagnetic layer and the free magnetic layer may be laminated in that order from below, which is opposite to the order in the embodiment shown in the drawings. Although not shown in the drawings of this embodiment, a seed layer may be formed immediately below the free magnetic layer 31, and a cap layer may be formed immediately above the pinned magnetic layer 33.

The pinned magnetic layer 33 comprises layers each comprising a magnetic material having a positive magnetostriction constant, and is exposed at the surface (ABS) facing the recording medium, as shown in FIG. 1. When the pinned magnetic layer 33 is exposed at the surface facing the recording medium, the symmetry of two-dimensional isotropic stress applied to the pinned magnetic layer 33 is broken to apply uniaxial tensile stress to the pinned magnetic layer 33 in parallel with the height direction. This inverse magnetostrictive effect stabilizes the magnetization direction of the pinned magnetic layer 33 in a direction parallel to the height direction.

In this embodiment, the pinned magnetic layer 33 has a laminated ferrimagnetic structure comprising a first pinned magnetic layer 33c and a second pinned magnetic layer 33a each comprising a magnetic material, and a nonmagnetic intermediate layer 33b disposed therebetween and comprising a nonmagnetic material.

The rear end of the first pinned magnetic layer 33c in the height direction (the Y direction) is in contact with the antiferromagnetic layer 34. The antiferromagnetic layer 34 contacts the rear end of the first pinned magnetic layer 33c in the height direction and produces an exchange coupling magnetic field between the antiferromagnetic layer 34 and the rear end in the height direction. Consequently, the magnetization direction of the first pinned magnetic layer 33c is pinned in the height direction by the exchange coupling magnetic field. The first and second pinned magnetic layers 33c and 33a have magnetizations antiparallel to each other due to a RKKY interaction therebetween through the nonmagnetic intermediate layer 33b. Namely, the magnetization direction of the second pinned magnetic layer 33a is antiparallel to the height direction.

Each of the first and second pinned magnetic layers 33c and 33a partially or entirely comprises Fe—Co—Cu (wherein Fe>10 atomic percent, Co>30 atomic percent, and Cu>5 atomic percent), Fe—Co—Cu—X (wherein X is at least one element of Pt, Pd, Mn, Si, Au, and Ag), or $CO_2MnY$ (wherein Y is at least one element of Ge, Si, Sn, and Al). The thickness of each of the first and second pinned magnetic layers 33c and 33a is, for example, about 10 Å to 70 Å. The nonmagnetic intermediate layer 33b is formed to a thickness by using a material so as to produce the RKKY interaction between the first and second pinned magnetic layers 33c and 33a. In this embodiment, the nonmagnetic intermediate layer 33b is formed to a thickness of about 3 Å to 10 Å by using, for example, Ru. The pinned magnetic layer 33 may have a single-layer structure or a laminated structure comprising a magnetic film instead of the laminated ferrimagnetic structure.

The antiferromagnetic layer 34 preferably comprises an antiferromagnetic material containing Mn and element Z (element Z is at least one element of Pt, Pd, Ir, Rh, Ru, and Os), or an antiferromagnetic material containing Mn and elements Z and Z' (element Z' is at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare earth elements). Such an antiferromagnetic material has excellent corrosion resistance and a high blocking temperature, and produces a great exchange coupling magnetic field at the interface between the antiferromagnetic layer 34 and the first pinned magnetic layer 33c. The antiferromagnetic layer 34 is preferably formed to a thickness of 80 Å to 300 Å. In this embodiment, the thickness of the antiferromagnetic layer 34 is about 150 Å.

The nonmagnetic layer 32 preferably comprises a conductive material with low electric resistance, and in this embodiment, the nonmagnetic layer 32 comprises, for example, Cu. The nonmagnetic layer 32 is formed to a thickness of about 25 Å, for example. The free magnetic layer 31 partially or entirely comprises Fe—Co—Cu (wherein Fe>10 atomic percent, Co>30 atomic percent, and Cu>5 atomic percent), Fe—Co—Cu—X (wherein X is at least one element of Pt, Pd, Mn, Si, Au, and Ag), or Co2MnY (wherein Y is at least one element of Ge, Si, Sn, and Al). The thickness of the free magnetic layer 31 is, for example, about 100 Å. Although the free magnetic layer 31 has a single-layer structure comprising a magnetic film, a laminated structure or laminated ferrimagnetic structure comprising magnetic films may be used. Furthermore hard bias layers 63 are in contact with both sides of the free magnetic layer 31 and the nonmagnetic layer 32, the hard bias layers 63 being magnetized in the track width direction. Also, a first or second insulating layer 61 or 64 with a thickness of several Å to several tens Å may be interposed between the GMR element 30 and each hard bias layer 63. The magnetization of the free magnetic layer 31 is aligned in the track width direction (the X direction) by a longitudinal bias magnetic field of each of the hard bias layers 63.

The first insulating layers 61, bias underlying layers 62, the hard bias layers 63, and the second insulating layers 64 are laminated in that order from below on both sides of the GMR element 30 in the track width direction, and disposed between the large-area nonmagnetic metal films 20 and 40.

The first and second insulating layers 61 and 64 comprise an insulating material, for example, $Al_2O_3$, $SiO_2$, or the like, and formed to fill in each of the spaces between the hard bias layers 63 (and the hard bias underlying layers 62) and the large-area nonmagnetic metal films 20 and 40. Namely, the first insulating layers 61 are formed on the lower large-area nonmagnetic metal film 20 to have such a thickness that they contact parts of both sides of the free magnetic layer 31. The second insulating layers 64 are formed on the respective hard bias layers 63 to have such a thickness that they contact both sides of the pinned magnetic layer 33.

The hard bias underlying layers 62 are provided for improving the characteristics (coercive force Hc and remanence ratio S) of the hard bias layers 63 and increasing the bias magnetic fields produced from the hard bias layers 63. Each of the hard bias underlying layers 62 preferably comprises a metal film having a body-centered cubic structure (bcc structure). Specifically, each of the hard bias underlying layers 62 preferably comprises at least one element of Cr, W, Mo, V, Mn, Nb, and Ta. Although the hard bias underlying layers 62 are preferably formed only below the respective hard bias layers 63, they may be slightly interposed between both sides of the free magnetic layer 31 and the hard bias layers 63. The thickness of each of the hard bias underlying layers 62 formed between both sides of the free magnetic layer 31 and the hard bias layers 63 in the track width direction is preferably 1 nm or less. When the hard bias underlying layers 62 are interposed between the hard bias layers 63 and the free magnetic layer 31, the hard bias layers 63 can be magnetically connected to the free magnetic layer 31 to prevent a buckling phenomenon in which the ends of the free magnetic layer 31 are influenced by a demagnetizing field, thereby facilitating magnetic domain control of the free magnetic layer 31.

Figure 4:
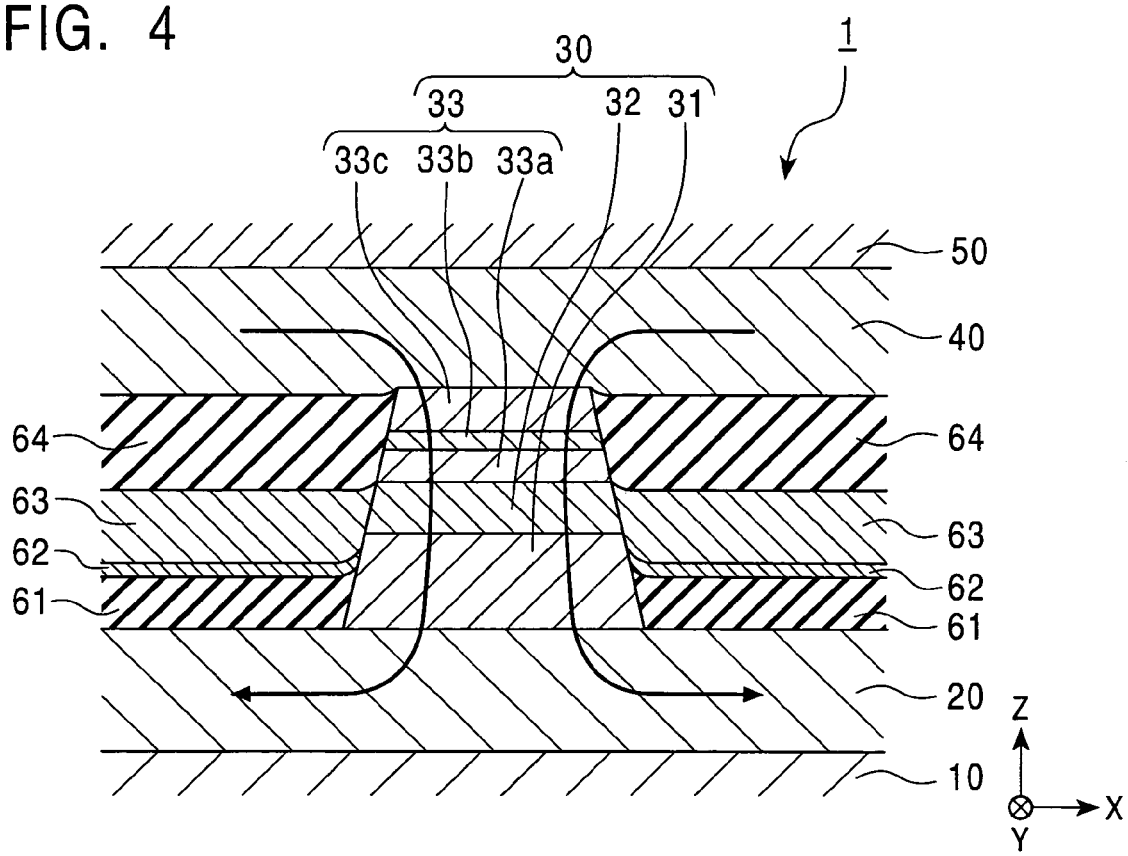
FIG. 4 is a conceptual view showing a current path produced by passing a sensing current from an upper shield layer to a lower shield layer.

In the CPP-GMR head 1 having the above-described whole structure, when the sensing current flows perpendicularly (in the thickness direction) to the film plane of the GMR element 30, a leakage magnetic field from the recording medium can be detected by using the giant magnetoresistive effect of the GMR element 30. In FIG. 4, an arrow shows a current path produced by passing the sensing current from the upper shield layer 50 to the lower shield layer 10.

As shown in FIG. 4, the sensing current supplied to the upper shield layer 50 mostly flows into the upper large-area nonmagnetic metal film 40 having lower resistivity than that of the upper shield layer 50. The sensing current flowing into the upper large-area nonmagnetic metal film 40 flows through the upper large-area nonmagnetic metal film 40 in parallel with the film plane because the upper large-area nonmagnetic metal film 40 is present in a wider area than that of the GMR element 30, and the sensing current flows from the interface between the upper large-area nonmagnetic metal film 40 and the pinned magnetic layer 33 to the GMR element 30 perpendicularly to the film plane (in the thickness direction). Then, the sensing current flows into the lower large-area nonmagnetic metal film 20 from the interface between the free magnetic layer 31 and the lower large-area nonmagnetic metal film 20. The sensing current flowing into the lower large-area nonmagnetic metal film 20 is mostly flows through the lower large-area nonmagnetic metal film 20 with lower resistivity in parallel with the film plane because the lower large-area nonmagnetic metal film 20 has lower resistivity than that of the lower shield layer 10 and is present in a wider area than that of the GMR element 30. The sensing current little flows through the lower shield layer 10 disposed below the GMR element 30.

In this current path, the sensing current is not concentrated above or below the range in which the GMR element 30 is formed. Namely, the current density at each of the interfaces between the large-area nonmagnetic metal films 20 and 40 and the shield layers 10 and 50 is decreased, and even when an AMR effect of the shield layers 10 and 50 occurs, noise (resistance change of the shield layers 10 and 50) due to the AMR effect is thus suppressed. When the sensing current is passed from the lower shield layer 10 to the upper shied layer 50, the same current path as shown in FIG. 4 can be formed except that the sensing current flows in the opposite direction.

As described above, the antiferromagnetic layer 34 is formed in the rear of the first pinned magnetic layer 33c in the height direction, for pinning the magnetization direction of the pinned magnetic layer 33 (the fist pinned magnetic layer 33c), and thus the antiferromagnetic layer 34 is absent from the current path shown in FIG. 4. The antiferromagnetic layer 34 generally has significantly higher resistivity than those of the GMR element 30 and the large-area nonmagnetic metal films 20 and 40, and the antiferromagnetic layer 34 is formed to a thickness of as large as 70 Å to 300 Å for obtaining antiferromagnetic characteristics, thereby producing great Joule heat when the current flows. Therefore, as in this embodiment, when the antiferromagnetic layer is absent from the current path, the antiferromagnetic layer does not generate heat even when the sensing current flows, and thus the temperature of the head is not excessively increased to improve reliability. Also, since the antiferromagnetic layer is absent from the current path, the high-frequency characteristics of the head are also improved.

Figure 55:
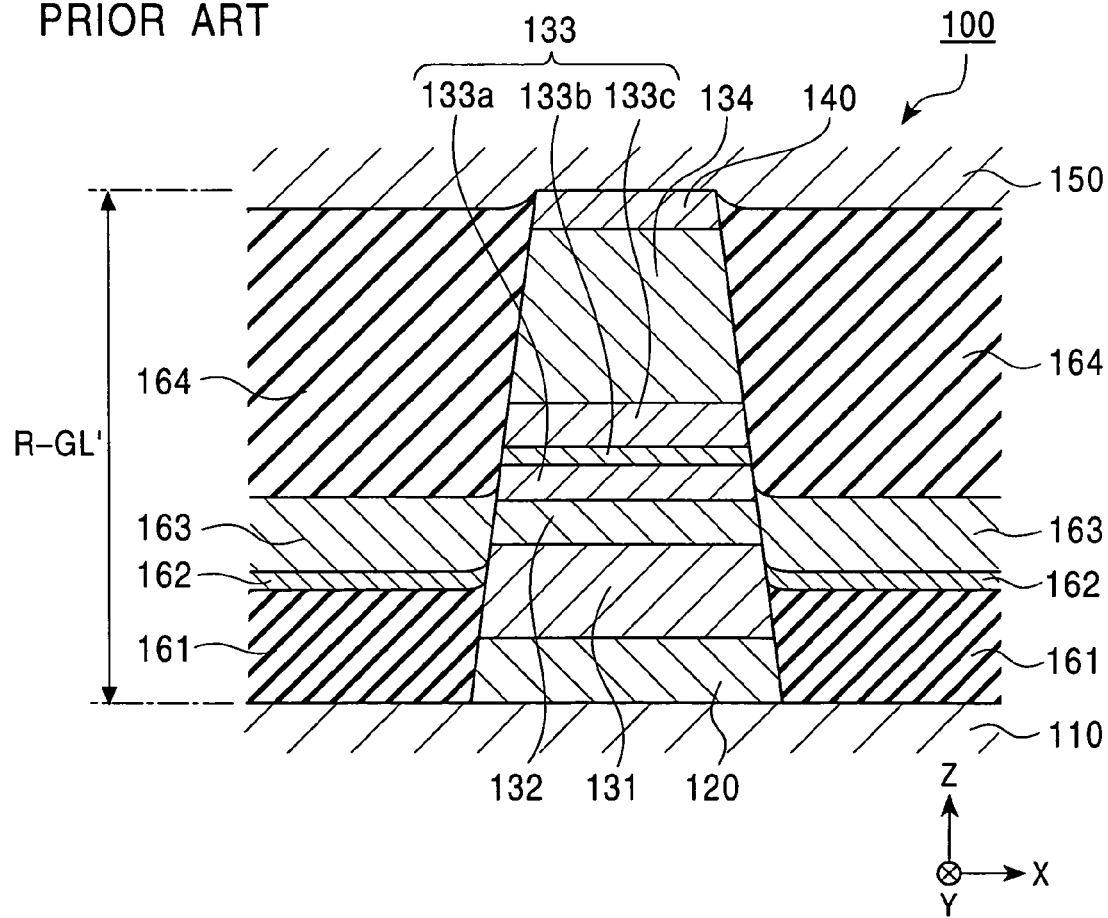
FIG. 55 is a longitudinal sectional view showing the structure of a conventional CPP giant magnetoresistive head, as viewed from a surface facing a recording medium.

In this embodiment, the antiferromagnetic layer is not provided in the current path, and thus the shield distance R-GL can be decreased, as compared with a conventional head. Furthermore, the upper and lower large-area nonmagnetic metal films 20 and 40 can be formed in larger thicknesses t20 and t40, respectively, as compared with a conventional head. As shown in FIG. 55, in the conventional head, the antiferromagnetic layer is formed thickly on the pinned magnetic layer, and thus the thickness of the nonmagnetic metal film cannot be sufficiently increased without increasing the shield distance R-GL'.

A method for manufacturing the CPP-GMR head 1 shown in FIG. 1 will be described below.

First, the lower shield layer 10, the lower large-area nonmagnetic metal film 20, the free magnetic layer 31, the nonmagnetic layer 32, the second pinned magnetic layer 33a, the nonmagnetic intermediate layer 33b, and the first pinned magnetic layer 33c are continuously deposited in a solid form in vacuum in that order from below. The material and thickness of each layer are the same as in the completed CPP-GMR head 1 shown in FIG. 1.

Next, a liftoff resist layer is formed on the first pinned magnetic layer 33c so as to cover an area substantially the same as or slightly smaller than the optical element area (track width dimension Tw and height dimension h1) of the GMR element 30 to be formed.

After the resist layer is formed, portions of the first pinned magnetic layer 33c, the nonmagnetic intermediate layer 33b, the second pinned magnetic layer 33a, the nonmagnetic layer 32, and the free magnetic layer 31, which are not covered with the resist layer, are removed by ion milling or the like. In this step, the GMR element 30 having a substantially trapezoidal shape having a track width dimension Tw and a height dimension h1 and comprising layers ranging from the free magnetic layer 31 to the first pinned magnetic layer 33c is left at the substantially center of the lower large-area nonmagnetic metal film 20 in the track width direction. Since the substances removed by ion milling partially re-adhere to both sides of the GMR element 30, the re-adhering substances are preferably removed by milling again.

Then, the first insulating layers 61, the bias underlying layers 62, the hard bias layers 63 and the second insulating layers 64 are continuously deposited by sputtering on both sides of the GMR element 30. The material and thickness of each layer are the same as in the completed CPP-GMR head 1 shown in FIG. 1. In sputtering deposition, the angle of sputtered particles is preferably about 90 degrees with the lower large-area nonmagnetic metal film 20. After sputtering deposition, the resist layer is removed.

After the resist layer is removed, the antiferromagnetic layer 34 is formed in the rear of the first pinned magnetic layer 33c in the height direction, as shown in FIGS. 2 and 3. Namely, a resist layer having an aperture corresponding to an antiferromagnetic layer formation area is formed over the first pinned magnetic layer 33c and the second insulating layers 64. Then, a portion of the second insulating films 64, which is not covered with the resist layer, is removed by ion milling, and the antiferromagnetic layer 43 is formed in the removed portion. After the antiferromagnetic layer 34 is formed, the resist layer is removed.

Then, the GMR element 30 is annealed in a magnetic field in the height direction (the Y direction shown in the drawings) to produce an exchange coupling magnetic field between the antiferromagnetic layer 34 and the first pinned magnetic layer 33c. For example, the annealing temperature is about 270° C., and the magnitude of the applied magnetic field is about 800 kA/m. In the annealing in the magnetic field, the magnetization direction of the first pinned magnetic layer 33c is pinned in the height direction, and the magnetization direction of the second pinned magnetic layer 33a is pinned in antiparallel to the height direction.

Figure 5:
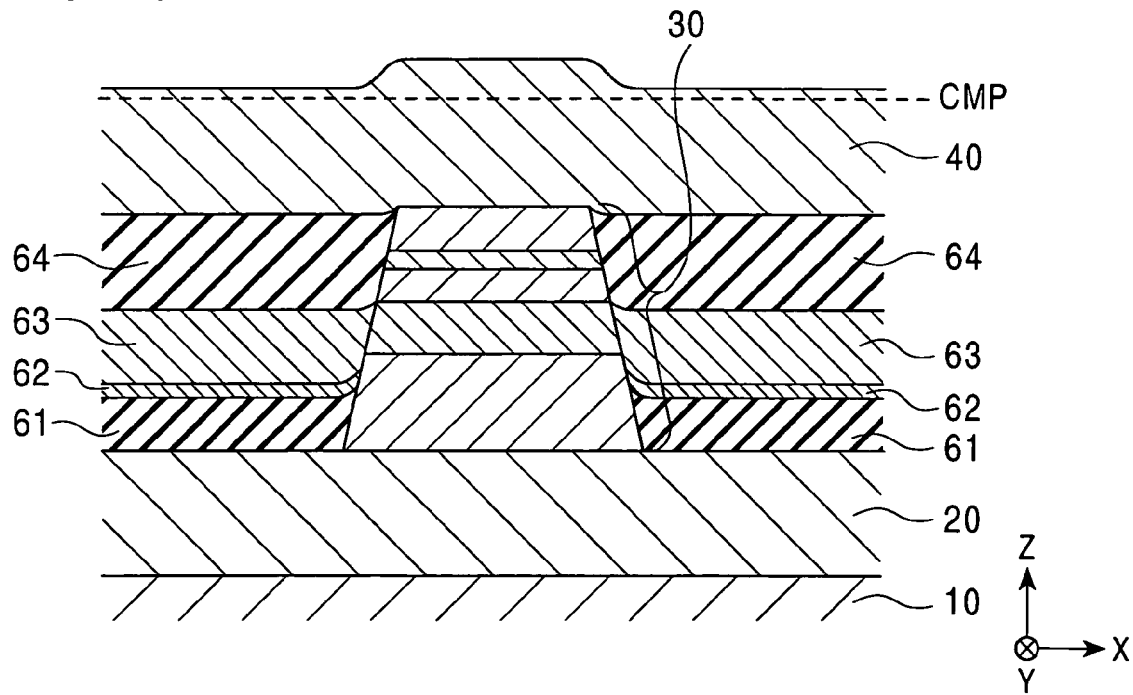
FIG. 5 is a longitudinal sectional view showing a step of a method for manufacturing the CPP giant magnetoresistive head shown in FIG. 1.

After the annealing, as shown in FIG. 5, the upper large-area nonmagnetic metal film 40 is deposited over the first pinned magnetic layer 33c and the second insulating layers 64 by sputtering, and the upper surface of the upper large-area nonmagnetic metal film 40 is subjected to CMP or ion milling. In the CMP or ion milling, the upper surface of the upper large-area nonmagnetic metal film 40 is planarized. The material of the upper large-area nonmagnetic metal film 40 and the thickness t40 after CMP are the same as in the completed CPP-GMR head 1 shown in FIG. 1.

Then, the upper shield layer 50 is deposited by sputtering on the planarized upper large-area nonmagnetic metal film 40. The upper shield layer 50 may be deposited by sputtering in succession to the upper large-area nonmagnetic metal film 40 during the deposition of the upper large-area nonmagnetic metal film 40.

The CPP-GMR head 1 shown in FIGS. 1 to 3 is completed by the above-described steps.

This embodiment comprises the metallic antiferromagnetic layer 34 comprising an antiferromagnetic material containing the element Z and Mn or an antiferromagnetic material containing the elements Z and Z' and Mn. However, an insulating antiferromagnetic layer comprising, for example, Ni—O or $\alpha$-Fe$_2$O$_3$ may be used instead of the antiferromagnetic layer 34. The insulating antiferromagnetic layer can suppress a sensing current loss to improve output. Also, in this embodiment, the upper large-area nonmagnetic metal film 40 is formed to cover the GMR element 30 and the second insulating layers 64. Therefore, the upper large-area nonmagnetic metal film 40 can be subjected to CMP to secure flatness, and flatness can also be secured in laminating a recording inductive head on the upper shield layer 50.

FIGS. 6 to 13 show a CPP giant magnetoresistive head (CPP-GMR head) according to a second embodiment of the present invention.

The second embodiment is most different from the first embodiment in that the lower and upper large-area nonmagnetic metal films 20 and 40 of the first embodiment are replaced by lower and upper nonmagnetic metal films 220 and 240, respectively, and the antiferromagnetic layer 34 in contact with the rear end surface of the second pinned magnetic layer in the height direction is replaced by an antiferromagnetic layer 234 in contact with the upper surface of a rear portion of a second pinned magnetic layer 231c which extends in the height direction. In the second embodiment, even when the nonmagnetic metal films 220 and 240 are not present in a wide area, the generation of Joule heat can be suppressed because the antiferromagnetic layer 234 is absent from a region where the sensing current flows. Furthermore, a sufficient contact area can be secured between the pinned magnetic layer 231 and the antiferromagnetic layer 234 to cause its own effect of more strongly pinning magnetization of the pinned magnetic layer 231.

Figure 6:
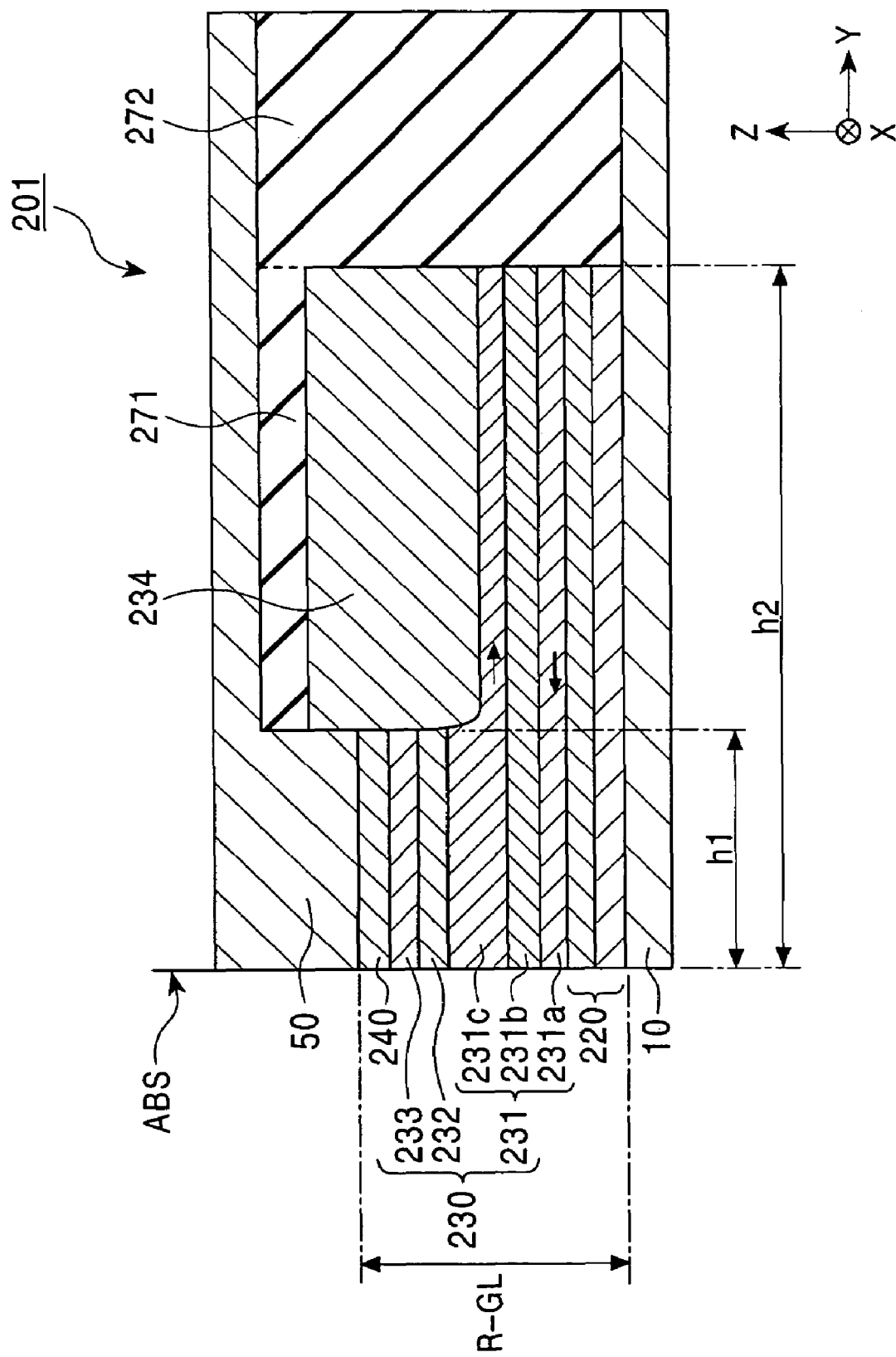
FIG. 6 is a partial sectional view showing the structure of a CPP giant magnetoresistive head according to a second embodiment of the present invention, taken along a central line of an element.
Figure 7:
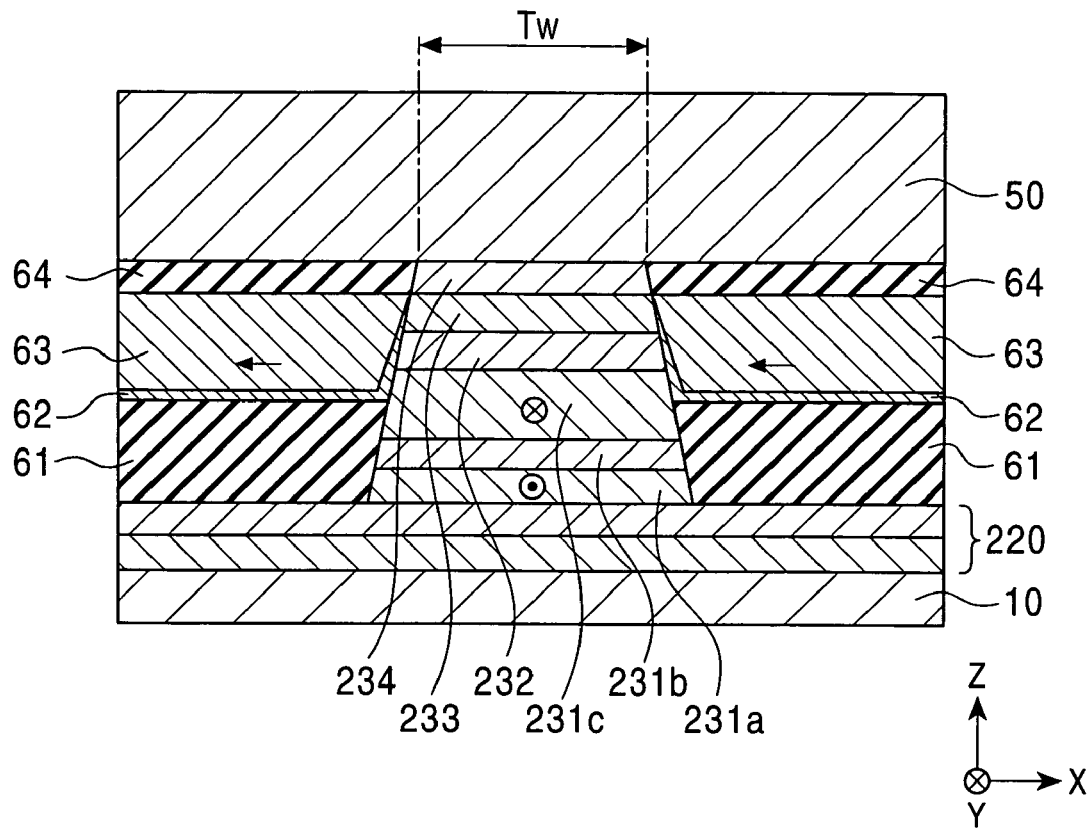
FIG. 7 is a partial sectional view showing the structure of the CPP giant magnetoresistive head shown in FIG. 6, as viewed from a surface facing a recording medium.
Figure 8:
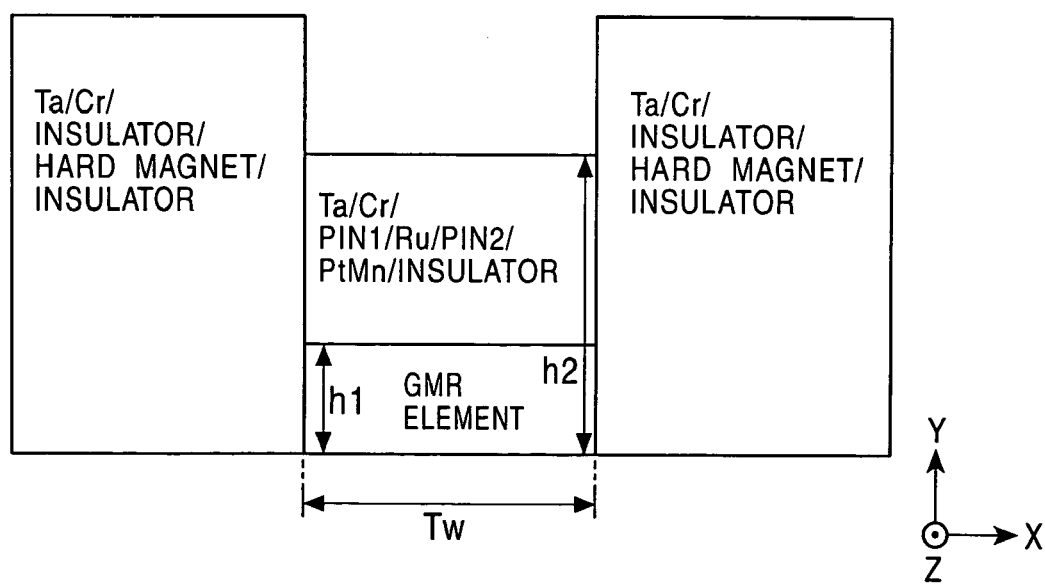
FIG. 8 is a schematic top plan view showing the GMR element shown in FIG. 6.

FIG. 6 is a partial sectional view showing the structure of a CPP-GMR head 201, taken along a central line of a GMR element 230, FIG. 7 is a partial sectional view showing the structure of the CPP-GMR head 201 as viewed from a surface facing a recording medium, and FIG. 8 is a schematic top plan view of the GMR element 230. In FIGS. 6 to 8, the functions, shapes, materials and thicknesses of layers denoted by the same reference numerals as those in the first embodiment shown in FIGS. 1 to 3 are the same as those in the first embodiment, and thus the description thereof is omitted.

The CPP-GMR head 201 comprises the GMR element 230 exhibiting the GMR effect when a sensing current is passed through the upper shield layer 10 and the lower shield layer 50 in the thickness direction. In the GMR element 230, the lamination order of the layers is opposite to that in the GMR element 30 of the first embodiment. Namely, in this embodiment, a pinned magnetic layer 231 (a first pinned magnetic layer 231a, a nonmagnetic intermediate layer 231b, and a second pinned magnetic layer 231c), a nonmagnetic layer 232, and a free magnetic layer 233 are laminated in that order from below.

Each of the layers of the pinned magnetic layer 231 comprises a magnetic material having a positive magnetostriction constant, and the end surface of the pinned magnetic layer 231 is exposed at the surface facing the recording medium, as shown in FIG. 6. When the end surface is exposed at the surface facing the recording medium, the symmetry of two-dimensional isotropic stress applied to the pinned magnetic layer 231 is broken to apply uniaxial tensile stress to the pinned magnetic layer 231 in parallel with the height direction. This inverse magnetostrictive effect stabilizes the magnetization direction of the pinned magnetic layer 231 in a uniaxial direction parallel to the height direction.

As shown in FIGS. 6 and 8, in the pinned magnetic layer 231, the first pinned magnetic layer 231a, the nonmagnetic intermediate layer 231b and a portion of the second pinned magnetic layer 231c extend to the rear of the nonmagnetic layer 232 and the free magnetic layer 233 in the height direction, and the height dimension h2 is larger than the track width dimension Tw. Therefore, shape anisotropy parallel to the height direction occurs in each of the first and second pinned magnetic layers 231a and 231c, and magnetization is also stabilized by the shape anisotropy in a uniaxial direction parallel to the height direction.

The thicknesses of the first pinned magnetic layer 231a and the nonmagnetic intermediate layer 231b are the same as those of the first pinned magnetic layer 33c and the nonmagnetic intermediate layer 33b, respectively, in the first embodiment. In the second pinned magnetic layer 231c, a portion (a rear region in the height direction) outside the element has a smaller thickness than that within the element. In this embodiment, the thickness of the portion within the element is about 50 Å, and the thickness of the portion outside the element is about 40 Å.

The lower nonmagnetic metal film 220 is formed immediately below the first pinned magnetic layer 231a to have a longer length than that of the first pinned magnetic layer 231a in the track width direction and substantially the same length as that of the first pinned magnetic layer 231a in the height direction. The lower nonmagnetic metal film 220 functions as an electrode together with the lower shield layer 10 and also functions as a seed layer for regularly forming each of the layers constituting the GMR element 230. The crystal grain size and crystal orientation of each of the layers of the GMR element 230 are controlled by the lower nonmagnetic metal film 220. The magnetization of each of the first and second pinned magnetic layers 231a and 231c is strengthened by the seed effect of the lower nonmagnetic metal film 220. The lower nonmagnetic metal film 220 may comprise the same nonmagnetic metallic material as that used for the lower large-area nonmagnetic metal film 20 of the first embodiment, and the thickness of the lower nonmagnetic metal film 220 is smaller than that of the lower large-area nonmagnetic metal film 20. In this embodiment, the lower nonmagnetic metal film 220 has a Ta/Cr two-layer structure.

The upper nonmagnetic metal film 240 is formed on the free magnetic layer 233 to have the same area as that of the free magnetic layer 233. The upper nonmagnetic metal film 240, a portion of the upper shield layer 50, the free magnetic layer 233, the nonmagnetic layer 232 and a portion of the second pinned magnetic layer 231c have a smoothly continuous rear end surface in the height direction. The upper nonmagnetic metal film 240 may comprise the same nonmagnetic metallic material as that used for the upper large-area nonmagnetic metal film 40 of the first embodiment, and the thickness is smaller than that of the upper large-area nonmagnetic metal film 40.

In the CPP-GMR head 201, the antiferromagnetic layer 234 for pinning the magnetization direction of the pinned magnetic layer 231 is provided in contact with the upper surface of the rear portion of the second pinned magnetic layer 231c in the rear of the GMR element in the height direction. Namely, the antiferromagnetic layer 234 is formed on the rear portion of the second pinned magnetic layer 231c which extends in the height direction, to make contact with the rear end surfaces of the upper nonmagnetic metal film 240, the free magnetic layer 233, the nonmagnetic layer 232, and a portion of the second pinned magnetic layer 231c in the height direction. The material and thickness of the antiferromagnetic layer 234 are the same as those of the antiferromagnetic layer 34 of the first embodiment.

The antiferromagnetic layer 234 produces an exchange coupling magnetic field at the interface with the second pinned magnetic layer 231c, so that the magnetization direction of the second pinned magnetic layer 231c is pinned in the height direction by the exchange coupling magnetic field. The first and second pinned magnetic layers 231a and 231c have antiparallel magnetization directions due to a RKKY interaction through the nonmagnetic intermediate layer 231b. Therefore, magnetization of the first pinned magnetic layer 231a is pinned in antiparallel to the height direction. In this embodiment, the magnetic moment per unit area (saturation magnetization Ms×thickness t) of the first pinned magnetic layer 231a is larger than that of the second pinned magnetic layer 231c, and thus the magnetization direction of the whole pinned magnetic layer 231 is the same as that of the first pinned magnetic layer 231a. In FIG. 6, the magnetization direction of the first pinned magnetic layer 231a is shown by a bold arrow, and the magnetization direction of the second pinned magnetic layer 231c is shown by a thin arrow.

As described above, in this embodiment, magnetization of each of the first and second pinned magnetic layers 231a and 231c is strongly pinned by uniaxial anisotropy due to the inverse magnetostrictive effect, shape anisotropy, and the seed effect of the lower nonmagnetic metal film 220.

Furthermore, a first backfill gap layer (insulating layer) 271 comprising an insulating material such as $Al_2O_3$ or $SiO_2$ is formed between the antiferromagnetic layer 234 and the upper shield layer 50, for preventing the sensing current from flowing toward the antiferromagnetic layer 234. As shown in FIG. 6, the first backfill gap layer 271, the antiferromagnetic layer 234, the second pinned magnetic layer 231c, the nonmagnetic intermediate layer 231b, the first pinned magnetic layer 231a and the lower nonmagnetic metal film 220 have the respective rear end surfaces at the same position in the height direction. In the rear of the first backfill gap layer 271, the antiferromagnetic layer 234, the second pinned magnetic layer 231c, the nonmagnetic intermediate layer 231b, the first pinned magnetic layer 231a and the lower nonmagnetic metal film 220 in the height direction, the space between the lower shield layer 10 and the upper shield layer 50 is filled with a second backfill gap layer (insulating layer) 272 comprising an insulating material such as $Al_2O_3$ or $SiO_2$.

Next, a method for manufacturing the CPP-GMR head 201 shown in FIGS. 6 to 8 according to an embodiment of the present invention will be described below with reference to FIGS. 9 to 12.

In FIGS. 9 to 12, FIG. A is a partial sectional view showing a step for manufacturing the CPP-GMR head 201, as viewed from the surface facing the recording medium, and FIG. B is a partial sectional view showing a step for manufacturing the CPP-GMR head 201 taken along a central line of the element in parallel with the height direction. Since the material and thickness of each layer are the same as those of the completed CPP-GMR head 201, the description thereof is omitted.

First, the lower nonmagnetic metal film 220, the first pinned magnetic layer 231a, the nonmagnetic intermediate layer 231b, the second pinned magnetic layer 231c, the nonmagnetic layer 232, the free magnetic layer 233, and the upper nonmagnetic metal film 240 are continuously deposited on the lower shield layer 10 in vacuum in that order from below. These layers are deposited by sputtering. In this deposition, the second pinned magnetic layer 231c is uniformly deposited to the same thickness as that of the element portion of the completed second pinned magnetic layer 231c within the element.

Next, a resist layer R1 is formed on the upper nonmagnetic metal film 240, for determining the track width dimension Tw of the GMR element 230 to be formed.

Figure 9A:
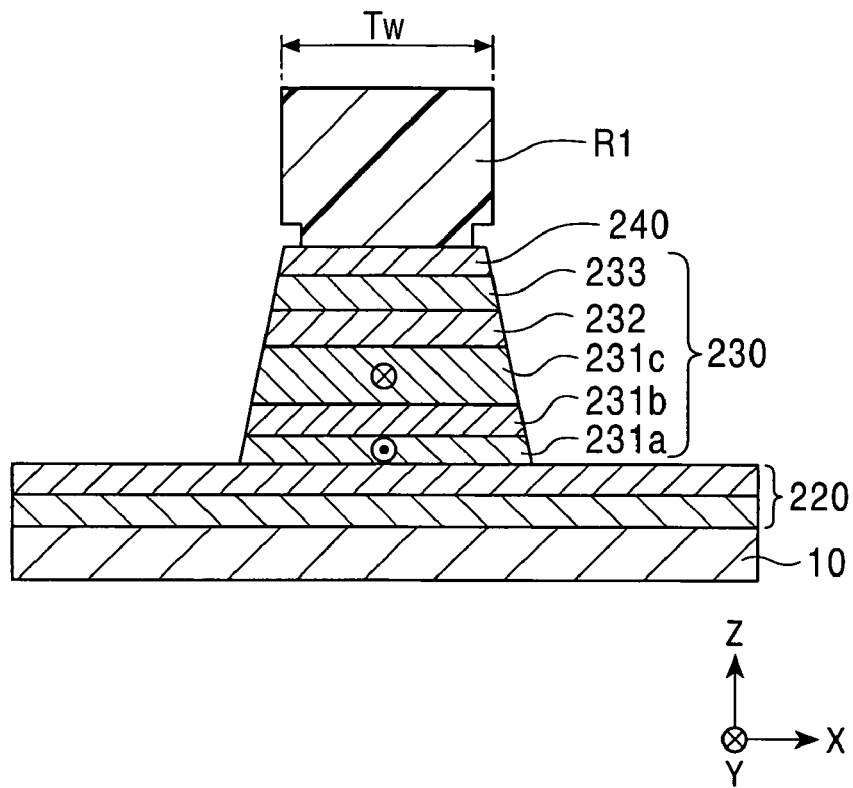
Figure 9B:
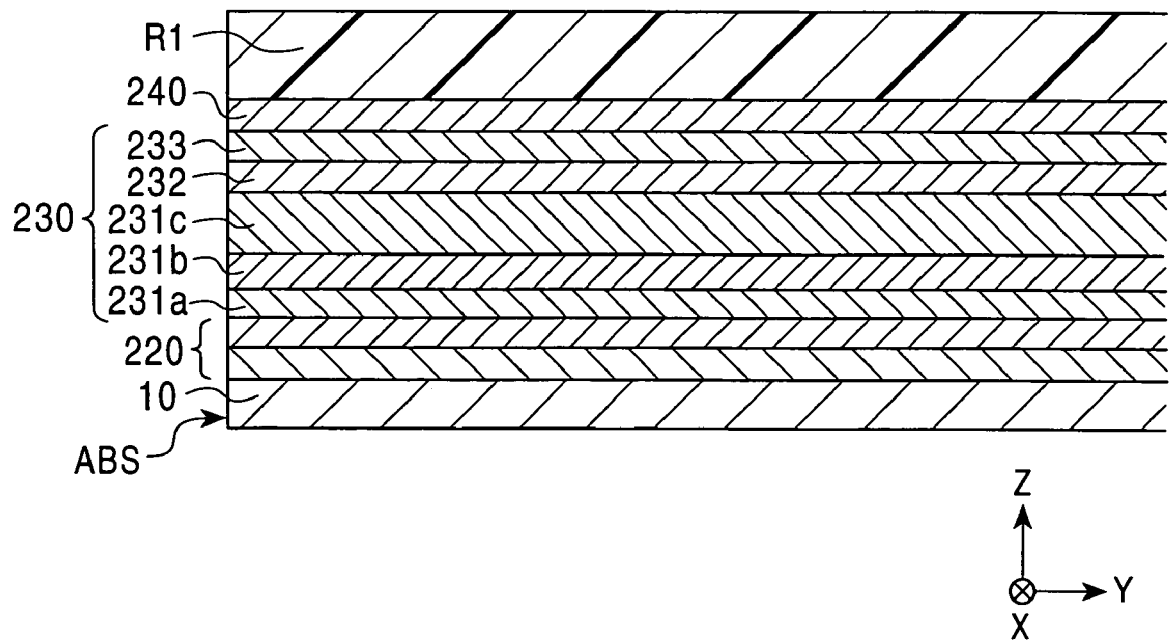

After the resist layer R1 is formed, portions of the layers ranging from the upper nonmagnetic metal film 240 to the first pinned magnetic layer 231a (the upper nonmagnetic metal film 240, the free magnetic layer 233, the nonmagnetic layer 232, the second pinned magnetic layer 231c, the nonmagnetic intermediate layer 231b, and the first pinned magnetic layer 231a) which are not covered with the resist layer R1, are removed by ion milling, for example. The ion milling is stopped when the lower nonmagnetic metal film 220 is exposed. In this step, as shown in FIG. 9, the GMR element 230 comprising the layers ranging from the first pinned magnetic layer 231a to the free magnetic layer 233, and the upper nonmagnetic metal film 240 are left on the lower nonmagnetic metal film 220 at the substantially center thereof in the track width direction. Since the substances removed by ion milling partially re-adhere to both sides of the GMR element 230, the re-adhering substances are preferably removed by milling again.

Figure 10A:
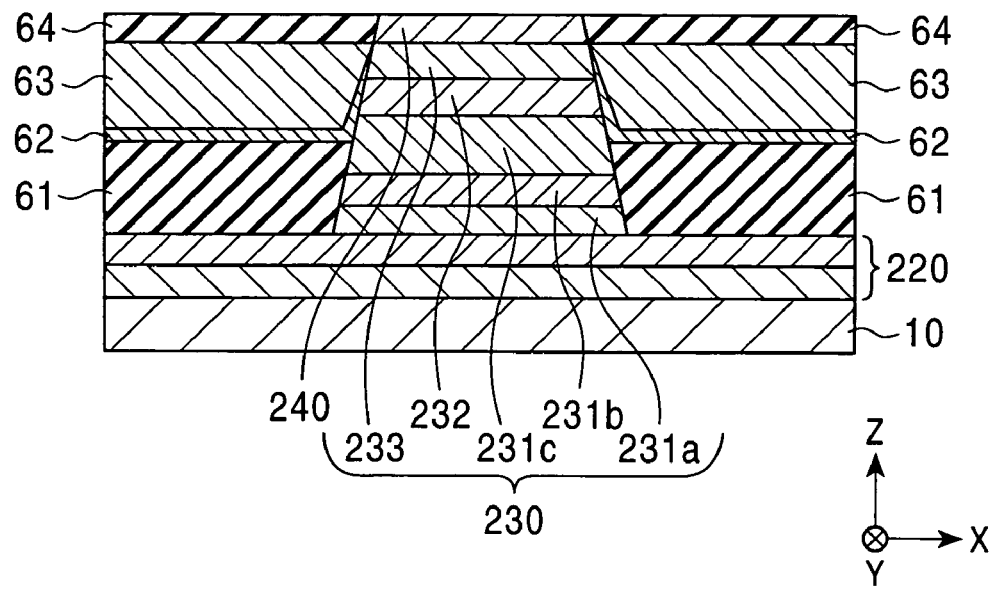
Figure 10B:
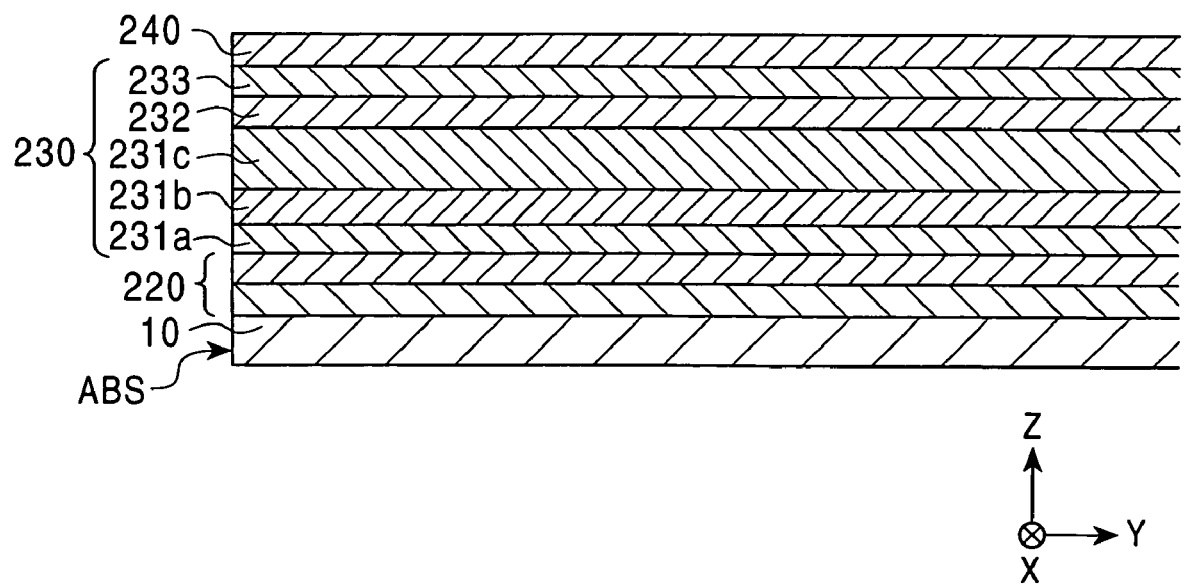

Then, as shown in FIG. 10, the first insulating layers 61, the bias underlying layers 62, the hard bias layers 63 and the second insulating layers 64 are continuously deposited by sputtering on both sides of the GMR element 230. These layers are deposited by sputtering. In sputtering deposition, the angle of sputtered particles is preferably about 90 degrees with the lower nonmagnetic metal film 220. After sputtering deposition, the resist layer R1 is removed.

After the resist layer R1 is removed, a resist layer R2 is formed on the upper nonmagnetic metal film 240, for determining the height dimension h1 of the GMR element 230 to be formed.

Figure 11A:
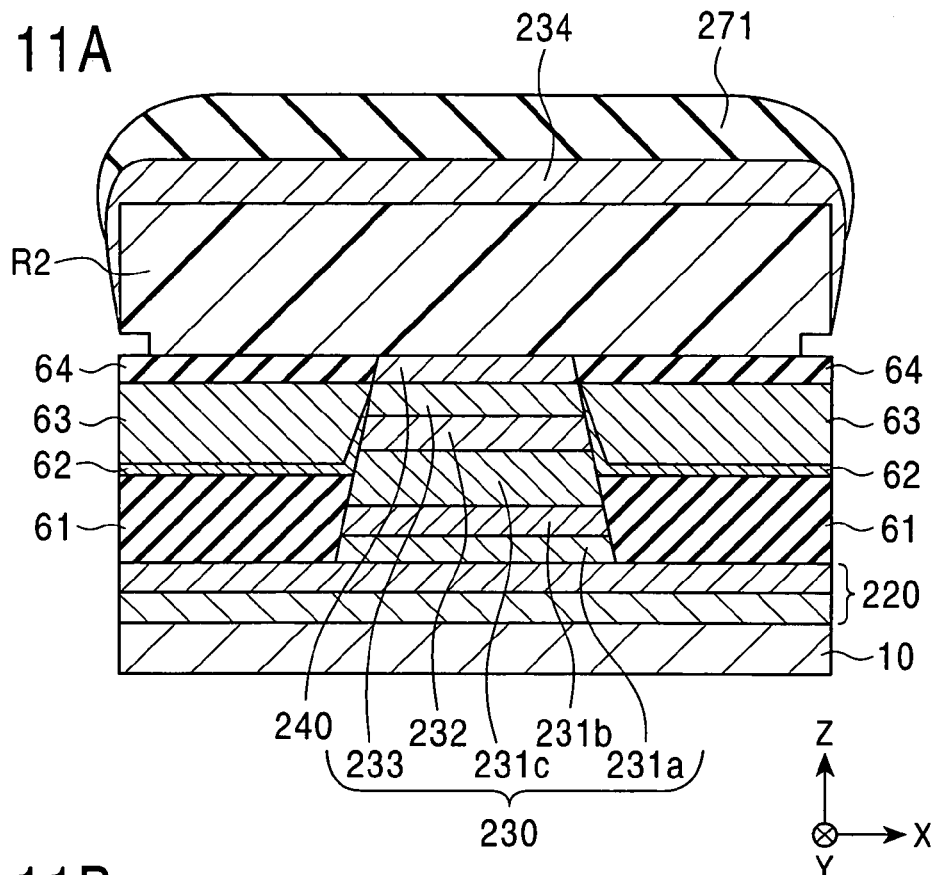
Figure 11B:
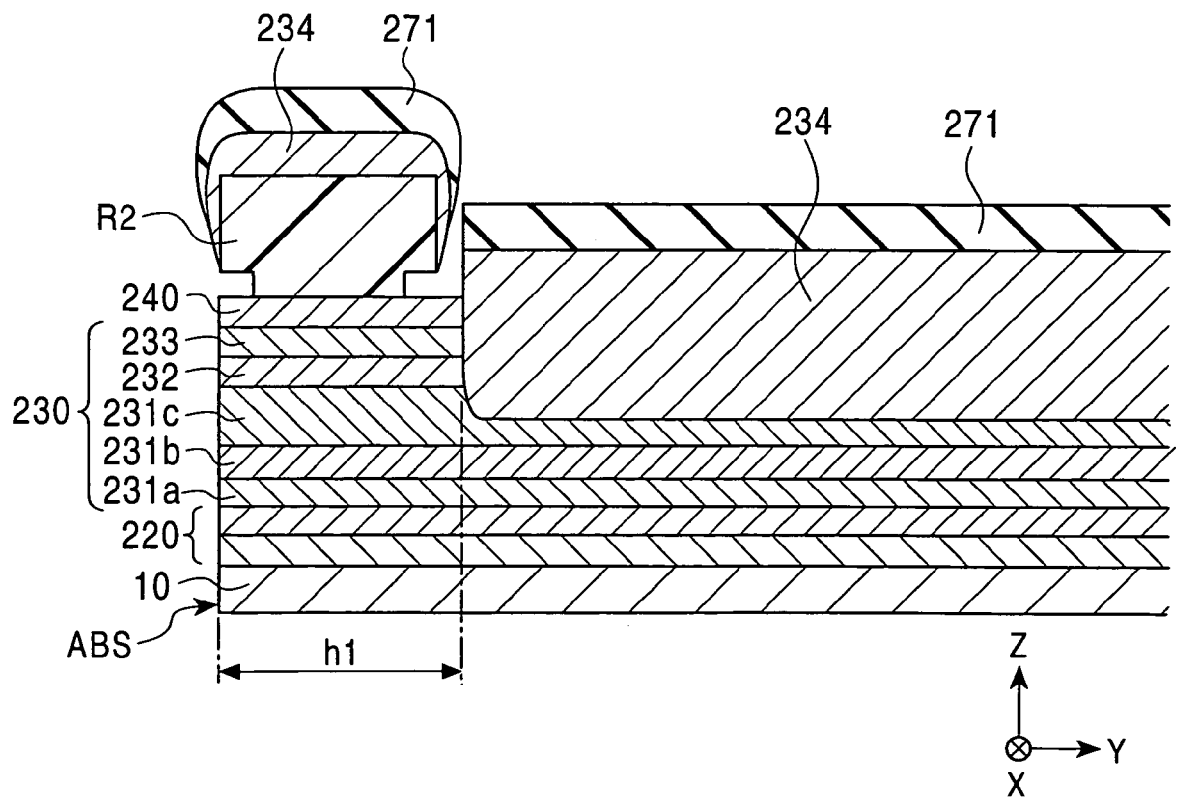

Then, as shown in FIG. 11, portions of the upper nonmagnetic metal film 240, the free magnetic layer 233, the nonmagnetic layer 232 and a portion of the second pinned magnetic layer 231c, which are not covered with the resist layer R2, are removed by, for example, ion milling, and the antiferromagnetic layer 234 and the first backfill gap layer 271 are deposited in the removed portion.

In the ion milting step, the upper nonmagnetic metal film 240, the free magnetic layer 233 and the nonmagnetic layer 232 are left only in the element portion used as the GMR element 230, and a portion of the second pinned magnetic layer 231c, the nonmagnetic intermediate layer 231b and the first pinned magnetic layer 231a are left to extend to the rear of the free magnetic layer 233 and the nonmagnetic layer 232 in the height direction. The upper nonmagnetic metal film 240, a portion of the upper shield layer 50, the free magnetic layer 233, the nonmagnetic layer 232 and a portion of the second pinned magnetic layer 231c have a smoothly continuous rear end surface in the height direction. In the second pinned magnetic layer 231c, a portion (rearwardly extending in the height direction) outside the element has a smaller thickness than that of a portion within the element.

After the first backfill gap layer 271 is deposited, the resist layer R2 is removed by liftoff.

After the resist layer R2 is removed, a resist layer R3 is formed on the nonmagnetic metal film 240 and the first backfill gap layer 271, for determining the height dimension h2 of the second pinned magnetic layer 231c, the nonmagnetic intermediate layer 231b and the first pinned magnetic layer 231a. The height dimension h2 is set to be larger than the track width dimension Tw and the height dimension h1 of the GMR element 230. The resist layer R3 has a dimension larger than that of the resist layer R2 in the height direction.

Figure 12A:
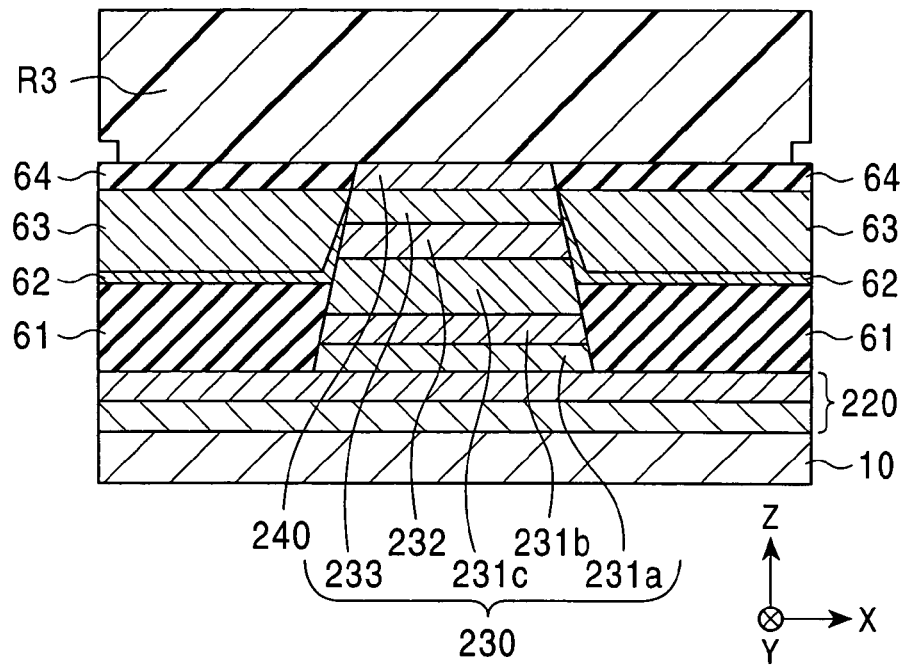
Figure 12B:
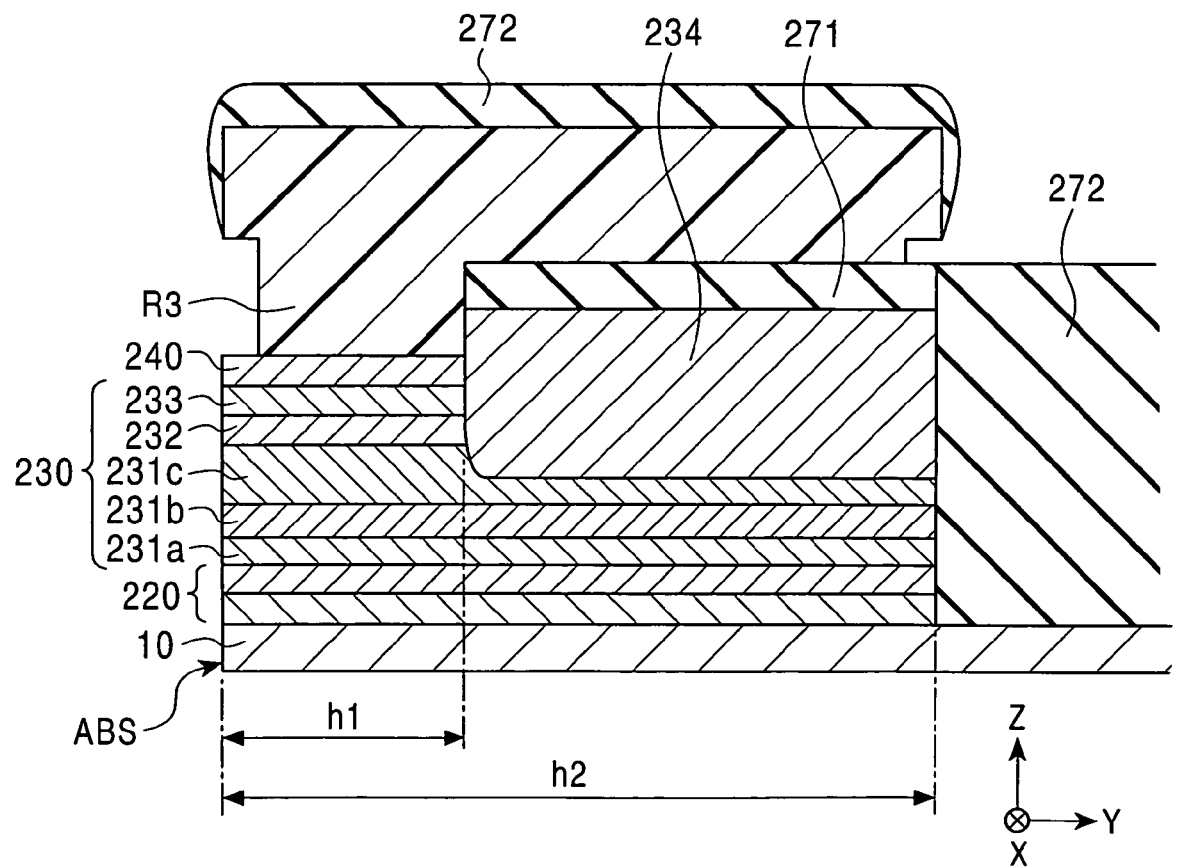

Then, as shown in FIG. 12, portions of the layers ranging from the first backfill gap layer 271 to at least the first pinned magnetic layer 231a, which are not covered with the resist layer R3, are removed by ion milling. In this embodiment, portions of the first backfill gap layer 271, the antiferromagnetic layer 234, a portion of the second pinned magnetic layer 231c, the nonmagnetic intermediate layer 231b, the first pinned magnetic layer 231a, and the lower nonmagnetic metal film 220, which are not covered with the resist layer R3, are removed to expose the lower shield layer 10 in the removed portion. As shown in FIG. 12, the second backfill gap layer 272 is deposited on the exposed portion of the lower shield layer 10. After the second backfill gap layer 272 is deposited, the resist layer R3 is removed by liftoff.

After the resist layer R3 is removed, annealing is performed in a magnetic field in the height direction. The annealing temperature is about 270° C., and the magnitude of the applied magnetic field is about 800 kA/m. In the annealing in the magnetic field, at least a portion of the antiferromagnetic layer 234 is transformed from a disordered lattice to an ordered lattice to exhibit antiferromagnetic characteristics. Namely, an exchange coupling magnetic field occurs between the antiferromagnetic layer 234 and the second pinned magnetic layer 231c. The magnetization direction of the second pinned magnetic layer 231c is pinned by the produced exchange coupling magnetic field in the height direction, and the magnetization direction of the first pinned magnetic layer 231a is pinned in antiparallel to the height direction. In FIG. 6, the magnetization direction of each of the first and second pinned magnetic layers 231a and 231c is shown by an arrow.

In this embodiment, the antiferromagnetic layer 234 is in contact with the upper surface of the rear portion of the second pinned magnetic layer 231c which extends in the height direction, and thus a contact area (an area where an exchange coupling magnetic field occurs) can be sufficiently secured between the antiferromagnetic layer 234 and the second pinned magnetic layer 231c to strongly pin magnetization of the second pinned magnetic layer 231c. Therefore, magnetization of the first pinned magnetic layer 231a is also strongly pinned through the nonmagnetic intermediate layer 231b.

After the annealing, the upper shield layer 50 is deposited over the upper nonmagnetic metal film 240, the second insulating layers 64, the first backfill gap layer 271 and the second backfill gap layer 272. The upper nonmagnetic metal film 240 may be deposited immediately before the deposition of the upper shield layer 50.

The CPP-GMR head 201 shown in FIGS. 6 to 8 is completed by the above-described steps.

As described above, in the second embodiment, the antiferromagnetic layer 234 is provided in contact with the upper surface of the rear portion of the second pinned magnetic layer 231c which extends in the height direction beyond the element portion (the nonmagnetic layer 232 and the free magnetic layer 233), for producing an exchange coupling magnetic field between the upper surface of the second pinned magnetic layer 231c and the antiferromagnetic layer 234. Therefore, a wider contact area (an area where an exchange coupling magnetic field occurs) can be secured between the second pinned magnetic layer 231c and the antiferromagnetic layer 234 to stably and strongly pin magnetization of the pinned magnetic layer, as compared with the case in which the antiferromagnetic layer is provided in contact with the rear end surface of the first or second pinned magnetic layer 231a or 231c in the height direction like in the first embodiment. The contact area between the second pinned magnetic layer 231c and the antiferromagnetic layer 234 is 500 times or more as large as that between the first pinned magnetic layer 33c and the antiferromagnetic layer 34 in the first embodiment. In the second embodiment, the contact area between the antiferromagnetic layer and the pinned magnetic layer is defined by the track width dimension Tw and the height dimension h (=h2−h1), while in the first embodiment, the contact area is defined by the track width dimension Tw and the thickness of the first pinned magnetic layer 33c.

In the second embodiment, the pinned magnetic layer 231 comprises a magnetic material having a positive magnetostriction constant, and the end surface of the pinned magnetic layer 231 is exposed at the surface facing the recording medium. Therefore, magnetization pinning of the first and second pinned magnetic layers 231a and 231c is also strengthened by the inverse magnetostrictive effect. Furthermore, since the length of the pinned magnetic layer 231 in the height direction is larger than that in the track width direction (Tw<h2), magnetization pinning of the first and second pinned magnetic layers 231a and 231c is also strengthened by shape anisotropy. Furthermore, since each of the layers constituting the GMR element 230 is formed above the lower nonmagnetic metal film 220 having the two-layer structure comprising Ta/Cr, magnetization pinning of the first and second pinned magnetic layers 231a and 231c is also strengthened by the seed effect of the lower nonmagnetic metal film 220.

Figure 13:
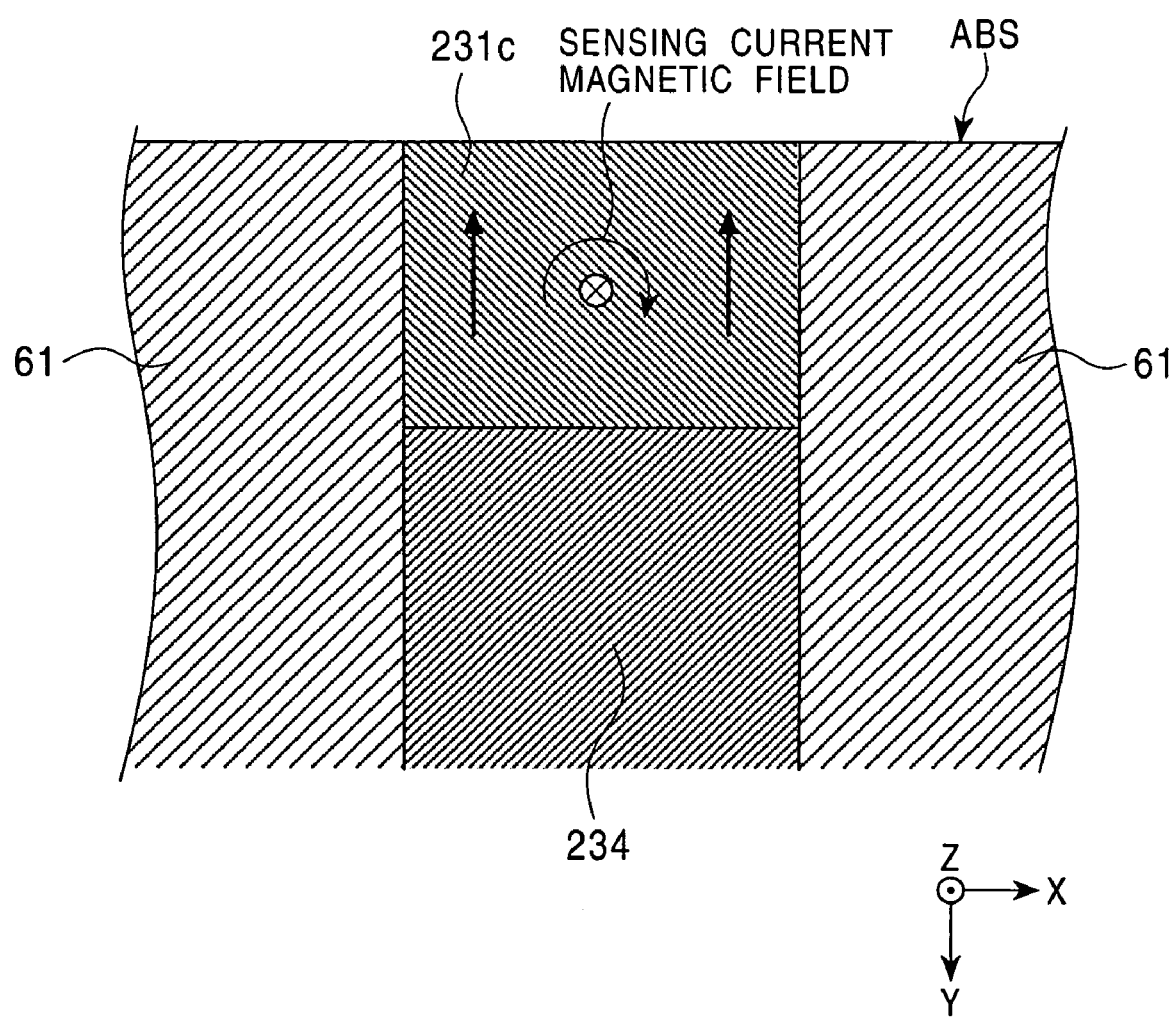
FIG. 13 is a schematic view illustrating the direction of a sensing current magnetic field and the direction of a synthetic magnetic moment of a pinned magnetic layer.

In the second embodiment, when the sensing current flows from the upper shield layer 50 to the lower shield layer 10 perpendicularly (in the thickness direction) to the film plane of the GMR element 230, a sensing current magnetic field occurs in the clockwise direction shown by an arrow in FIG. 13. In order to further strengthen magnetization pinning of the pinned magnetic layer 231, the direction of the sensing current magnetic field is preferably the same as that of a synthetic magnetic moment (shown by bold arrows in FIG. 13) of the first and second pinned magnetic layers 231a and 231c. However, even if the direction of the sensing current magnetic field is not the same as that of the synthetic magnetic moment of the first and second pinned magnetic layers 231a and 231c, magnetization of the pinned magnetic layer 231 is not fluctuated by the generated sensing current magnetic field as far as magnetization of the pinned magnetic layer 231 is sufficiently strongly pinned like in the second embodiment. Therefore, the sensing current density can be increased to increase output.

Like in the first embodiment, in the second embodiment, the antiferromagnetic layer 234 is disposed in the rear of the GMR element 230 in the height direction, and thus the antiferromagnetic layer 234 is separated from the current path in which the sensing current flows. Therefore, even when the sensing current is passed, the antiferromagnetic layer 234 does not generate heat to significantly decrease the heat generation from the GMR element 230 during the operation. As a result, an increase in the element temperature is suppressed to improve reliability. In the second embodiment, the upper surface of the antiferromagnetic layer 234 is positioned above the upper surface of the GMR element 230. However, the upper surface of the antiferromagnetic layer 234 is covered with the first backfill gap layer 271, and thus the sensing current little flows through the antiferromagnetic layer 234, thereby decreasing a shunt loss and improving reproduction output.

When the antiferromagnetic layer 234 is disposed in the rear of the GMR element 230 in the height direction, the shield distance R-GL at the surface facing the recording medium can be decreased in comparison to the conventional head shown in FIG. 55, thereby improving resolution.

In this embodiment, like the upper and lower large-area nonmagnetic metal films 20 and 40 of the first embodiment, each of the nonmagnetic metal films 220 and 240 may be formed to a large thickness in a wide area.

FIGS. 14 to 19 show a CPP giant magnetoresistive head (CPP-GMR heat) according to a third embodiment of the present invention.

The third embodiment is different from the second embodiment in that an antiferromagnetic layer 334 is provided in contact with the lower surface of a first pinned magnetic layer, not the upper surface of a second pinned magnetic layer. The third embodiment is the same as the second embodiment except the arrangement position of the antiferromagnetic layer.

Figure 14:
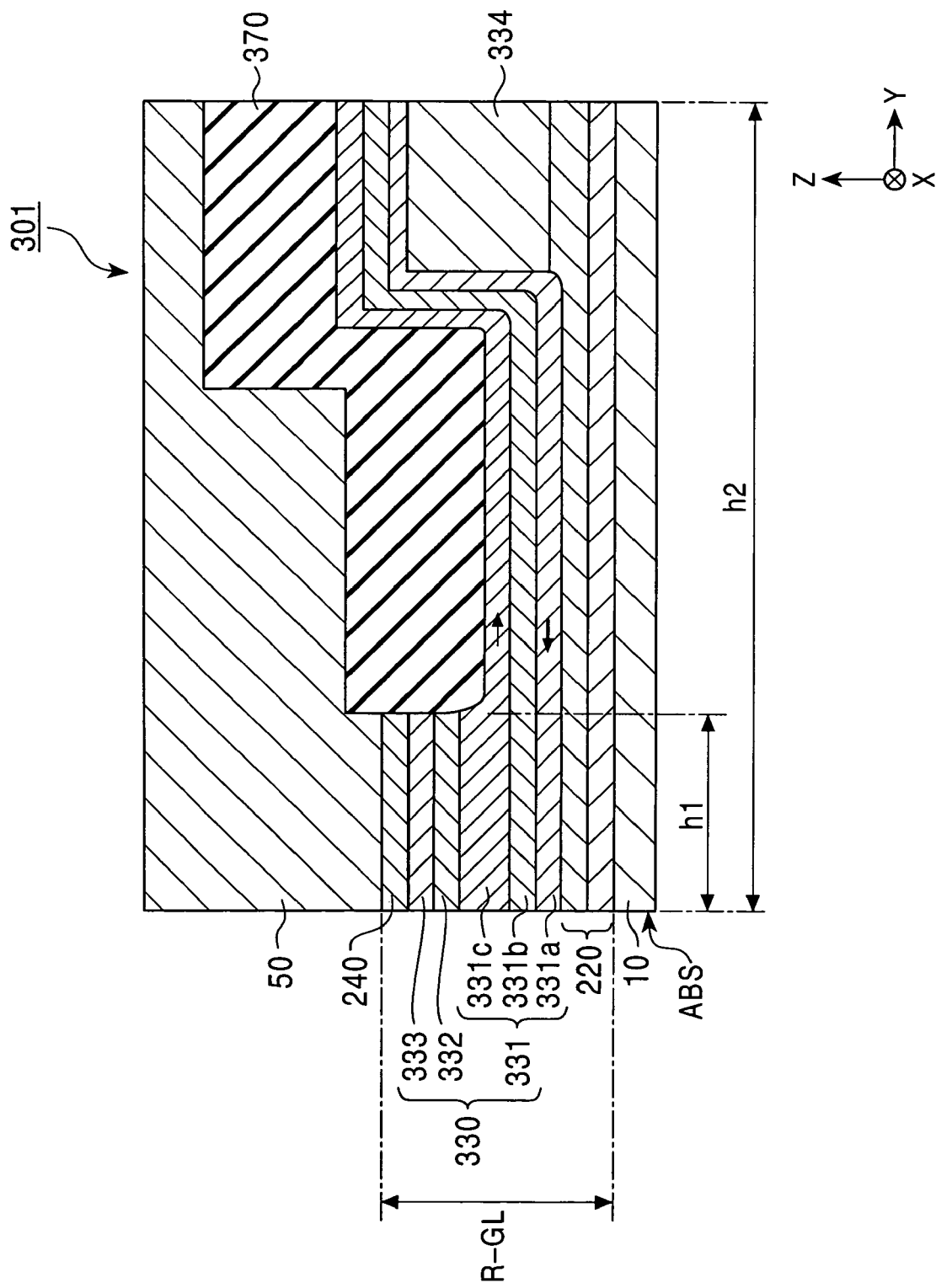
FIG. 14 is a partial sectional view showing the structure of a CPP giant magnetoresistive head according to a third embodiment of the present invention, taken along a central line of an element.
Figure 15:
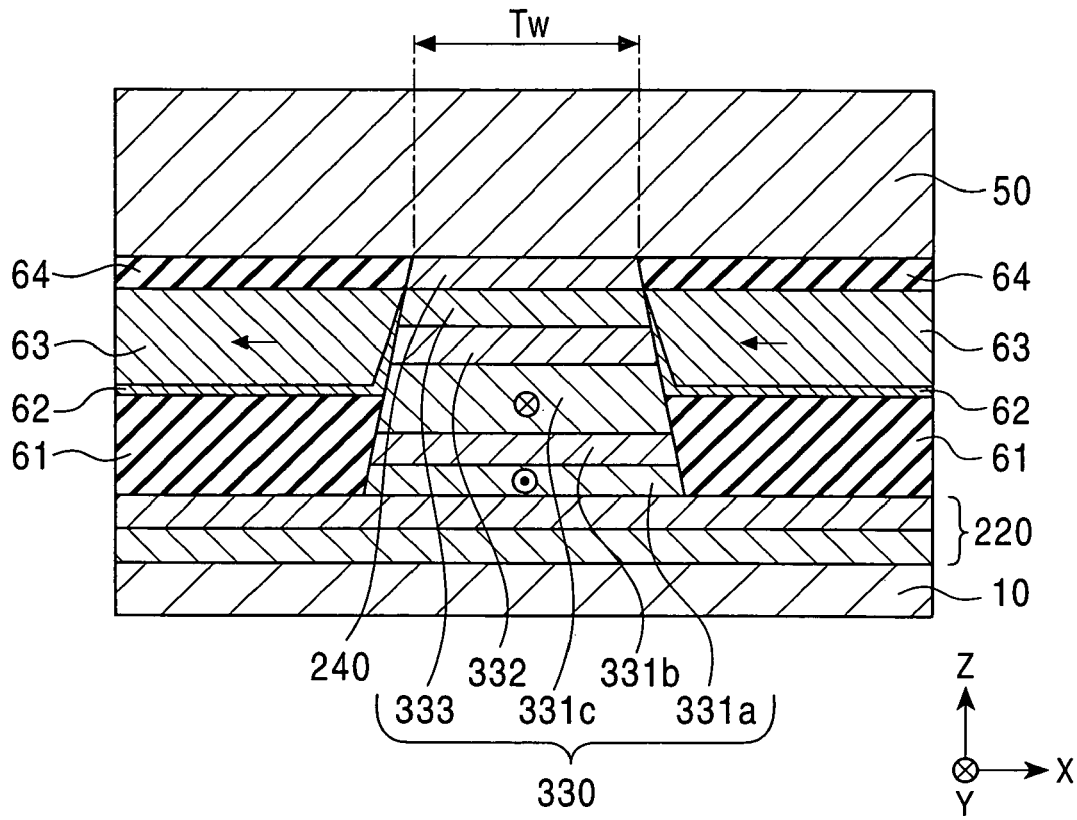
FIG. 15 is a partial sectional view showing the structure of the CPP giant magnetoresistive head shown in FIG. 14, as viewed from a surface facing a recording medium.
Figure 16:
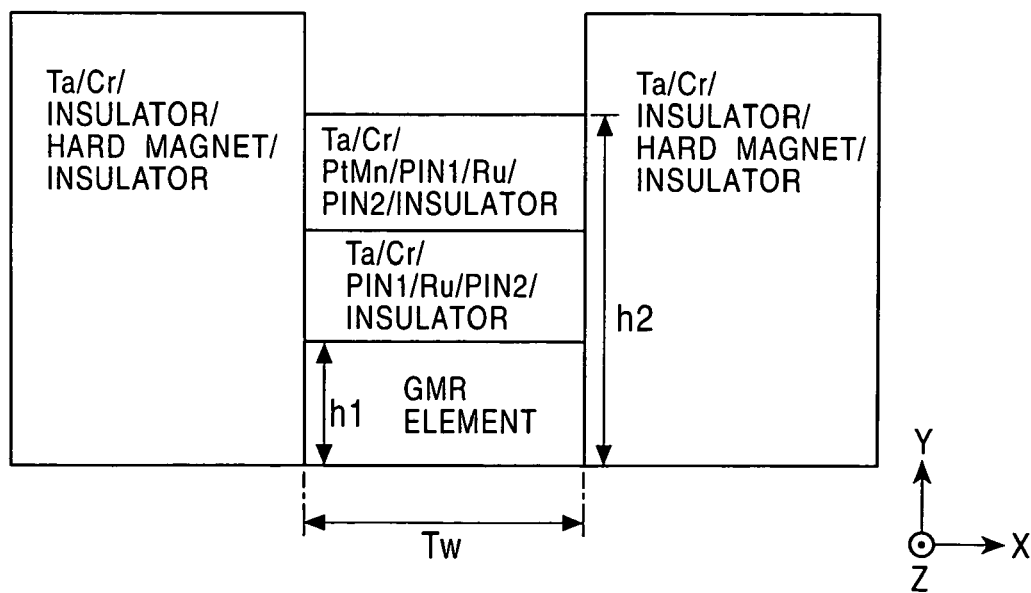
FIG. 16 is a schematic top plan view showing the GMR element shown in FIG. 14.

FIG. 14 is a partial sectional view showing the structure of a CPP-GMR head 301, taken along a central line of an element, FIG. 15 is a partial sectional view showing the structure of the CPP-GMR head 301, as viewed from a surface facing a recording medium, and FIG. 16 is a schematic top plan view of a GMR element 330. In FIGS. 14 to 16, the functions, materials and thicknesses of layers denoted by the same reference numerals as those in the second embodiment shown in FIGS. 6 to 8 are the same as those in the second embodiment, and thus the description thereof is omitted.

The CPP-GMR head 301 comprises the GMR element 330 exhibiting the GMR effect when a sensing current is passed through the upper shield layer 10 and the lower shield layer 50 in the thickness direction. Like in the GMR element 230 of the second embodiment, in the GMR element 330, a pinned magnetic layer 331 (a first pinned magnetic layer 331*a*, a nonmagnetic intermediate layer 331*b*, and a second pinned magnetic layer 331*c*), a nonmagnetic layer 332, and a free magnetic layer 333 are laminated in that order from below. The shapes, thicknesses and materials of the nonmagnetic layer 332 and the free magnetic layer 333 are the same as those of the nonmagnetic layer 232 and the free magnetic layer 233, respectively, of the second embodiment.

Like the pinned magnetic layer 231 of the second embodiment, each of the layers of the pinned magnetic layer 331 comprises a magnetic material having a positive magnetostriction constant, and the end surface of the pinned magnetic layer 331 is exposed at the surface facing the recording medium, as shown in FIG. 14. Therefore, the magnetization direction of the pinned magnetic layer 331 is stabilized by the inverse magnetostrictive effect in a direction parallel to the height direction.

As shown in FIGS. 14 and 16, in the pinned magnetic layer 331, the first pinned magnetic layer 331*a*, the nonmagnetic intermediate layer 331*b* and a portion of the second pinned magnetic layer 331*c* extend to the rear of the nonmagnetic layer 332 and the free magnetic layer 333 in the height direction, and the height dimension h2 is larger than the track width dimension Tw. Therefore, shape anisotropy parallel to the height direction occurs in each of the first and second pinned magnetic layers 331*a* and 331*c*, and magnetization is also stabilized by the shape anisotropy in a direction parallel to the height direction.

The first pinned magnetic layer 331*a* is formed over the lower nonmagnetic metal film 220 and the antiferromagnetic layer 334 to form a step which covers the upper surface and the end surface (left end shown in FIG. 14) of the antiferromagnetic layer 334. The nonmagnetic intermediate layer 331*b* and a portion of the second pinned magnetic layer 331*c* are laminated on the first pinned magnetic layer 331*a* to form the same step as that of the first pinned magnetic layer 331*a*.

The thicknesses of the first pinned magnetic layer 331*a*, the nonmagnetic intermediate layer 331*b*, and the second pinned magnetic layer 331*c* are the same as those of the first pinned magnetic layer 231*a*, the nonmagnetic intermediate layer 231*b*, and the second pinned magnetic layer 231*c*, respectively, in the second embodiment. In this embodiment, the magnetic moment per unit area of the first pinned magnetic layer 331*a* is larger than that of the second pinned magnetic layer 331*c*.

The antiferromagnetic layer 334 is formed on the lower nonmagnetic metal film 220 to make contact with the first pinned magnetic layer 331*a* (at the left end shown in FIG. 14) and disposed in the rear of the element portion (the nonmagnetic layer 332 and the free magnetic layer 333) in the height direction. The antiferromagnetic layer 334 produces an exchange coupling magnetic field at the interface with the first pinned magnetic layer 331*a*, so that the magnetization direction of the first pinned magnetic layer 331*a* is pinned in antiparallel to the height direction by the exchange coupling magnetic field. The first and second pinned magnetic layers 331*a* and 331*c* have antiparallel magnetization directions due to a RKKY interaction through the nonmagnetic intermediate layer 331*b*. Therefore, magnetization of the second pinned magnetic layer 331*c* is pinned in the height direction. In this embodiment, the magnetic moment per unit area of the first pinned magnetic layer 331*a* is larger than that of the second pinned magnetic layer 331*c*, and thus the magnetization direction of the whole pinned magnetic layer 331 is the same as that of the first pinned magnetic layer 331*a*. In FIG. 14, the magnetization direction of the first pinned magnetic layer 331*a* is shown by a bold arrow, and the magnetization direction of the second pinned magnetic layer 331*c* is shown by a thin arrow.

The antiferromagnetic layer 334 can be formed to the same thickness using the same material as the antiferromagnetic layer 234 of the second embodiment. In the lower nonmagnetic metal film 220, a portion on which the first pinned magnetic layer 331*a* is formed has a smaller thickness than that of a portion on which the antiferromagnetic layer 334 is formed.

Furthermore, a backfill gap layer 370 comprising an insulating material such as $Al_2O_3$ or $SiO_2$ is formed between the second pinned magnetic layer 331*c* and the upper shield layer 50, for preventing the sensing current from flowing directly to the second pinned magnetic layer 331*c*. The backfill gap layer 370 is formed in contact with the rear end surfaces of the nonmagnetic layer 332, the free magnetic layer 333 and the upper nonmagnetic metal film 240 in the height direction.

Figure 17:
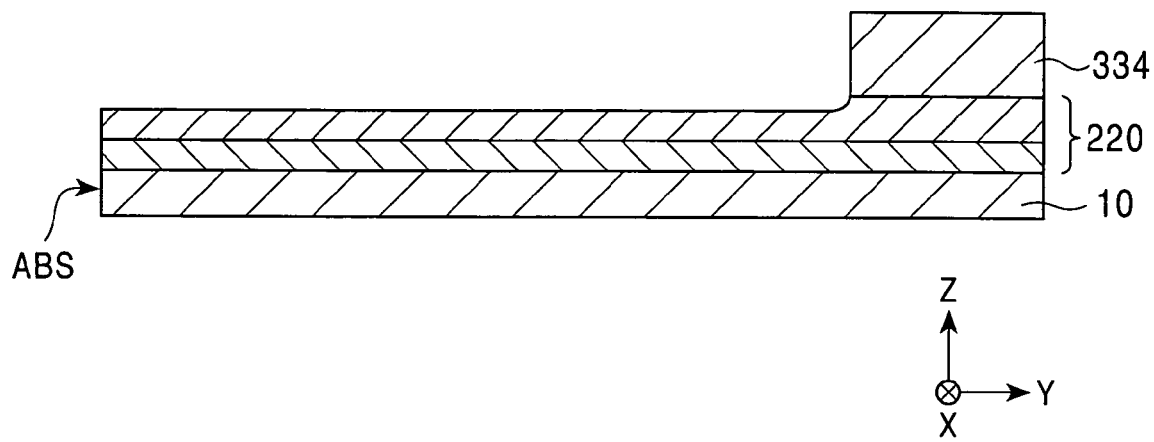
FIG. 17 is a partial sectional view showing a step of a method for manufacturing the CPP giant magnetoresistive head shown in FIGS. 14 to 16, taken along a central line of an element in the height direction.
Figure 18:
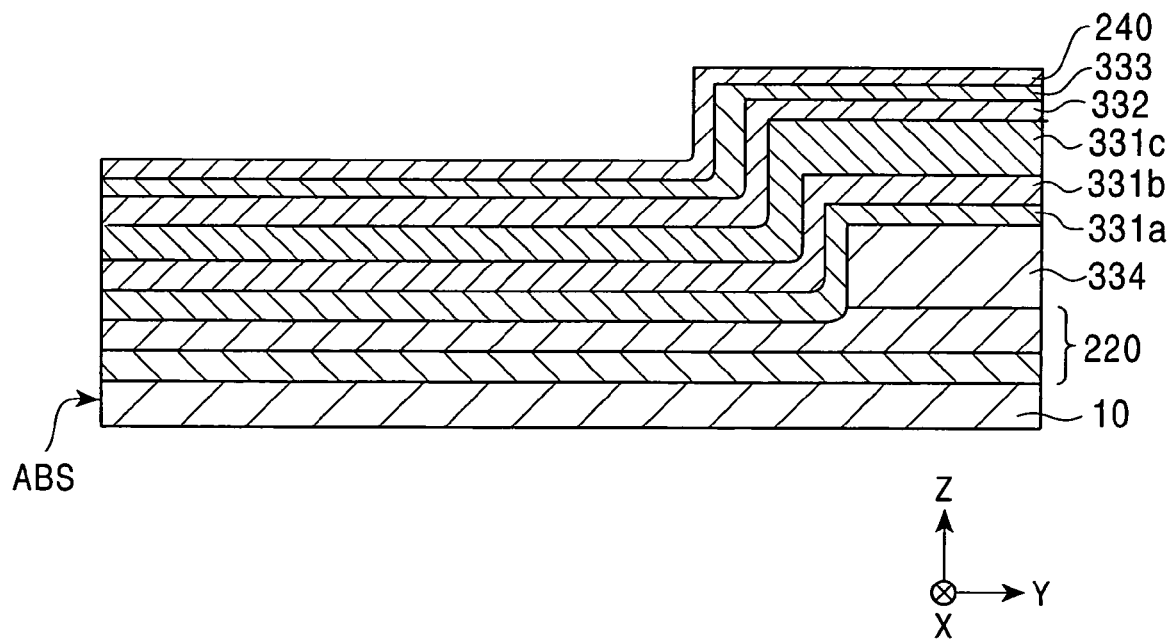
FIG. 18 is a partial sectional view showing a step after the step shown in FIG. 17, taken along a central line of the element in the height direction.
Figure 19:
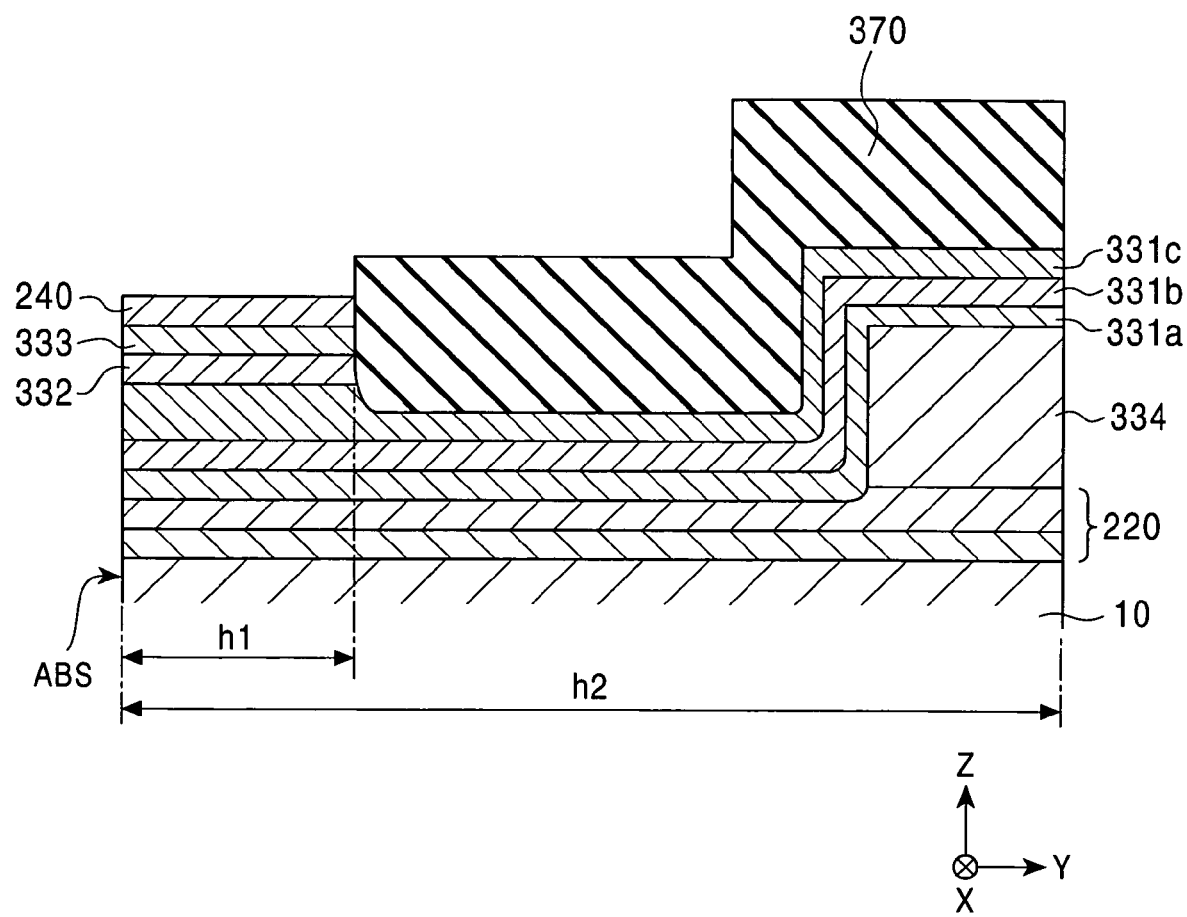
FIG. 19 is a partial sectional view showing a step after the step shown in FIG. 18, taken along a central line of the element in the height direction.

Next, a method for manufacturing the CPP-GMR head 301 shown in FIGS. 14 to 16 according to an embodiment of the present invention will be described below with reference to FIGS. 17 to 19. Each of FIGS. 17 to 19 is a partial sectional view showing a step for manufacturing the CPP-GMR head 301, taken along a central line of the element in parallel with the height direction. The material and thickness of each layer are the same as those of the completed CPP-GMR head 301.

First, the lower nonmagnetic metal film 220 and the antiferromagnetic layer 334 are continuously deposited on the lower shield layer 10 in vacuum in that order from below. These layers are deposited by sputtering. Like in the second embodiment, in this embodiment, the lower nonmagnetic metal film 220 has a two-layer structure comprising Ta/Cr.

Next, a resist layer is formed on the antiferromagnetic layer 334, for determining the planar size of the antiferromagnetic layer 334, and portions of the antiferromagnetic layer 334 and a portion of the Cr film of the lower nonmagnetic metal film 220, which are not covered with the resist layer, are removed by ion milling, for example. Then, the resist layer is removed by liftoff. In this step, as shown in FIG. 17, the antiferromagnetic layer 334 is left only on a rear portion of the lower nonmagnetic metal film 220 in the height direction.

After the resist layer is removed, the surfaces of the lower nonmagnetic metal film 220 and the antiferromagnetic layer 334 are cleaned as a pre-treatment of a subsequent deposition step.

Then, as shown in FIG. 18, the first pinned magnetic layer 331a, the nonmagnetic intermediate layer 331b, the second pinned magnetic layer 331c, the nonmagnetic layer 332, the free magnetic layer 333 and the upper nonmagnetic metal film 240 are continuously deposited in vacuum on the cleaned lower nonmagnetic metal film 220 and antiferromagnetic layer 334. These layers are deposited by sputtering. Since a large step occurs between the top of the lower nonmagnetic metal film 220 and the top of the antiferromagnetic layer 334, a step also occurs in a rear portion in the height direction of each of the layers ranging from the first pinned magnetic layer 331a to the upper nonmagnetic metal film 240. The second pinned magnetic layer 331c is formed to the same thickness as that of the element portion of the completed second pinned magnetic layer 331c.

Then, a resist layer is formed on the upper nonmagnetic metal film 240, for determining the track width dimension Tw of the GMR element 330 to be formed.

After the resist layer is formed, portions of the upper nonmagnetic metal film 240, the free magnetic layer 333, the nonmagnetic layer 332, the second pinned magnetic layer 331c, the nonmagnetic intermediate layer 331b, and the first pinned magnetic layer 331a, which are not covered with the resist layer, are removed by, for example, ion milling, and ion milling is stopped when the lower nonmagnetic metal film 220 is exposed. In the ion milling step, the upper nonmagnetic metal film 240, and the GMR element 330 ranging from the first pinned magnetic layer 331a to the free magnetic layer 333 are left on the lower nonmagnetic metal film 220 at the substantially center in the track width direction. Since the substances removed by ion milling partially re-adhere to both sides of the GMR element 330, the re-adhering substances are preferably removed by milling again.

Then, in the state in which the resist layer remains, the first insulating layers 61, the bias underlying layers 62, the hard bias layers 63, and the second insulating layers 64 are continuously deposited on both sides of the GMR element 330. These layers are deposited by sputtering. In sputtering deposition, the angle of sputtered particles is preferably about 90 degrees with the lower nonmagnetic metal film 220. After sputtering deposition, the resist layer is removed by liftoff.

After the resist layer is removed, a new resist layer is formed on the upper nonmagnetic metal film 240, for determining the height dimension h1 of the GMR element 330 to be formed.

Then, portions of the upper nonmagnetic metal film 240, the free magnetic layer 333, the nonmagnetic layer 332, and a portion of the second pinned magnetic layer 331c, which are not covered with the resist layer, are removed by, for example, ion milling, and the backfill gap layer 370 is deposited in the removed portion. After the backfill gap layer 370 is deposited, the resist layer is removed by liftoff.

As shown in FIG. 19, in the ion milling step, the upper nonmagnetic metal film 240, the free magnetic layer 333 and the nonmagnetic layer 332 are left only in the element portion used as the GMR element 330. On the other hand, a part of the second pinned magnetic layer 331c, the nonmagnetic intermediate layer 331b and the first pinned magnetic layer 331a extend to the rear of the free magnetic layer 333 and the nonmagnetic layer 332 in the height direction, and the steps formed during deposition are also left. In the second pinned magnetic layer 331c, a portion (rearwardly extending in the height direction) outside the element has a smaller thickness than that of the element portion.

After the resist layer is removed, annealing is performed in a magnetic field antiparallel to the height direction to produce an exchange coupling magnetic field between the antiferromagnetic layer 334 and the first pinned magnetic layer 331a. The annealing temperature is about 270° C., and the magnitude of the applied magnetic field is about 800 kA/m. In the annealing in the magnetic field, the magnetization direction of the first pinned magnetic layer 331a is pinned in antiparallel to the height direction, and the magnetization direction of the second pinned magnetic layer 331c is pinned in the height direction. In FIG. 14, the magnetization direction of each of the first and second pinned magnetic layers 331a and 331c is shown by an arrow. In this embodiment, the antiferromagnetic layer 334 is covered with the lower surface of the rear portion of the first pinned magnetic layer 331a which extends in the height direction, and thus a contact area (an area where an exchange coupling magnetic field occurs) can be sufficiently secured between the antiferromagnetic layer 334 and the first pinned magnetic layer 331a to strongly pin magnetization of the first pinned magnetic layer 331a. Therefore, magnetization of the second pinned magnetic layer 331c is also strongly pinned through the nonmagnetic intermediate layer 331b.

After the annealing, the upper surfaces of the upper nonmagnetic metal film 240, the second insulating layers 64 and the backfill gap layer 370 are planarized by, for example, CMP or ion milling as a pre-treatment for forming the upper shield layer 50. Then, the upper shield layer 50 is deposited over the planarized surfaces of the upper nonmagnetic metal film 240, the second insulating layers 64, and the backfill gap layer 370.

The CPP-GMR head 301 shown in FIGS. 14 to 16 is completed by the above-described steps.

As described above, in the third embodiment, the antiferromagnetic layer 334 is provided in contact with the lower surface of the rear portion of the first pinned magnetic layer 331a which extends in the height direction beyond the element portion (the nonmagnetic layer 332 and the free magnetic layer 333), for producing an exchange coupling magnetic field between the lower surface of the first pinned magnetic layer 331a and the antiferromagnetic layer 334.

Therefore, like in the second embodiment, a wider contact area (an area where an exchange coupling magnetic field occurs) can be secured between the first pinned magnetic layer 331a and the antiferromagnetic layer 334 to stably and strongly pin magnetization of the pinned magnetic layer. The contact area between the first pinned magnetic layer 331a and the antiferromagnetic layer 334 is larger that in the case in which the antiferromagnetic layer is in contact with the rear end surface of any one of the first pinned magnetic layer and the second pinned magnetic layer like in the first embodiment. In the second embodiment, the contact area between the first pinned magnetic layer 331a and the antiferromagnetic layer 334 is 500 times or more as large as that between the first pinned magnetic layer 33c and the antiferromagnetic layer 34 in the first embodiment. In the third embodiment, the contact area between the antiferromagnetic layer and the pinned magnetic layer is defined by the dimension in the track width direction, the height dimension, and the thickness of the antiferromagnetic layer 334.

Like in the second embodiment, in the third embodiment, magnetization pinning of the first and second pinned magnetic layers 331a and 331c is also strengthened by uniaxial anisotropy due to the inverse magnetostrictive effect, shape anisotropy, and the seed effect of the lower nonmagnetic metal film 220. In this way, when magnetization of each of the first pinned magnetic layer 331a and the second pinned magnetic layer 331c is strongly pinned, magnetization of the pinned magnetic layer 331 is not fluctuated by the generated sensing current magnetic field even if the direction of the sensing current magnetic field is not the same as that of the synthetic magnetic moment of the first and second pinned magnetic layers 331a and 331c. Therefore, the sensing current density can be increased to increase output.

Like in the first and second embodiments, in the third embodiment, even when the sensing current is passed through the GMR element 330, the antiferromagnetic layer 334 does not generate heat, and an increase in the element temperature is suppressed to improve reliability. Also, the shield distance R-GL at the surface facing the recording medium can be decreased in comparison to the conventional head shown in FIG. 55, thereby improving resolution.

FIGS. 20 to 25 show a CPP giant magnetoresistive head (CPP-GMR heat) according to a fourth embodiment of the present invention.

Figure 20:
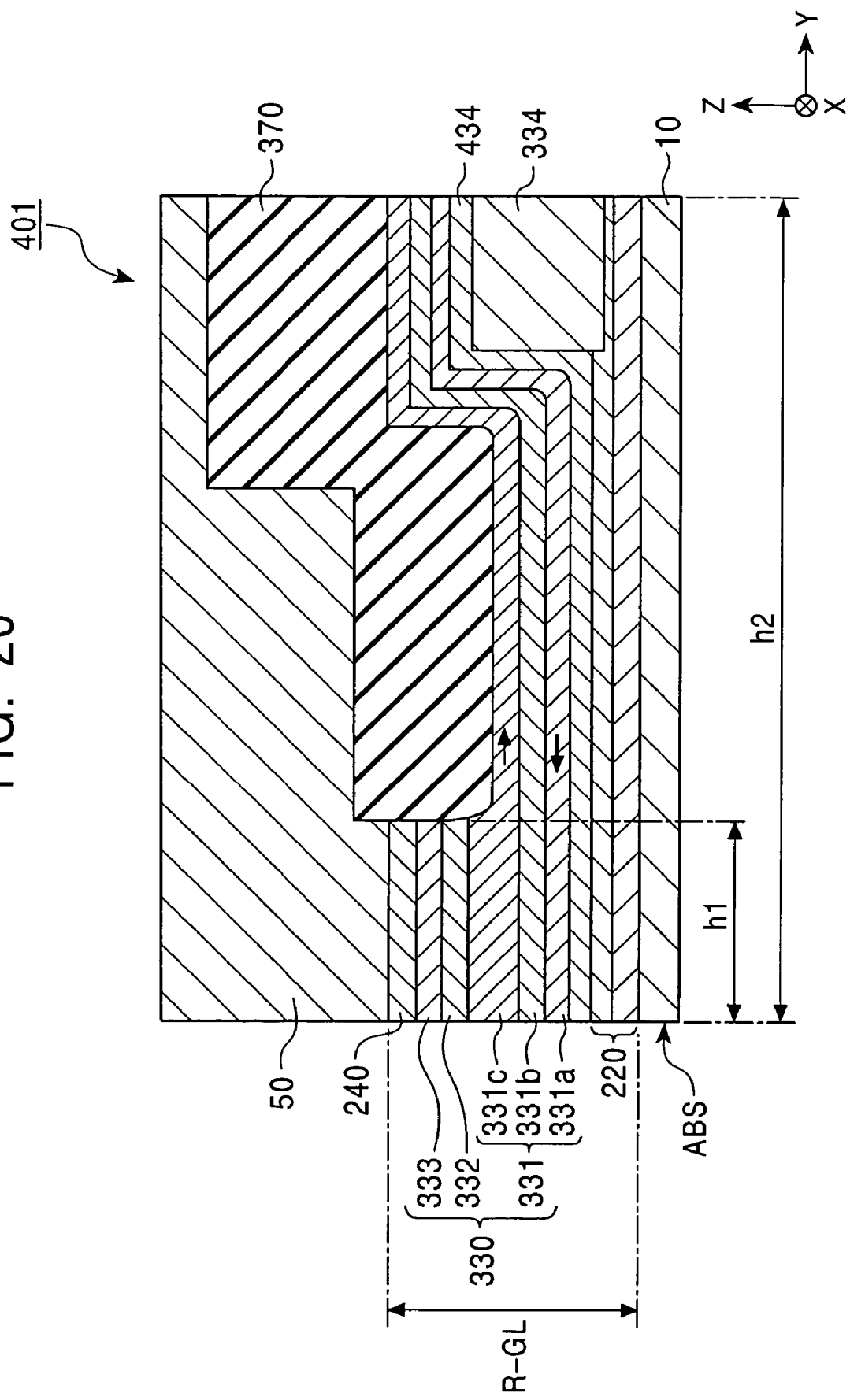
FIG. 20 is a partial sectional view showing the structure of a CPP giant magnetoresistive head according to a fourth embodiment of the present invention, taken along a central line of an element.
Figure 21:
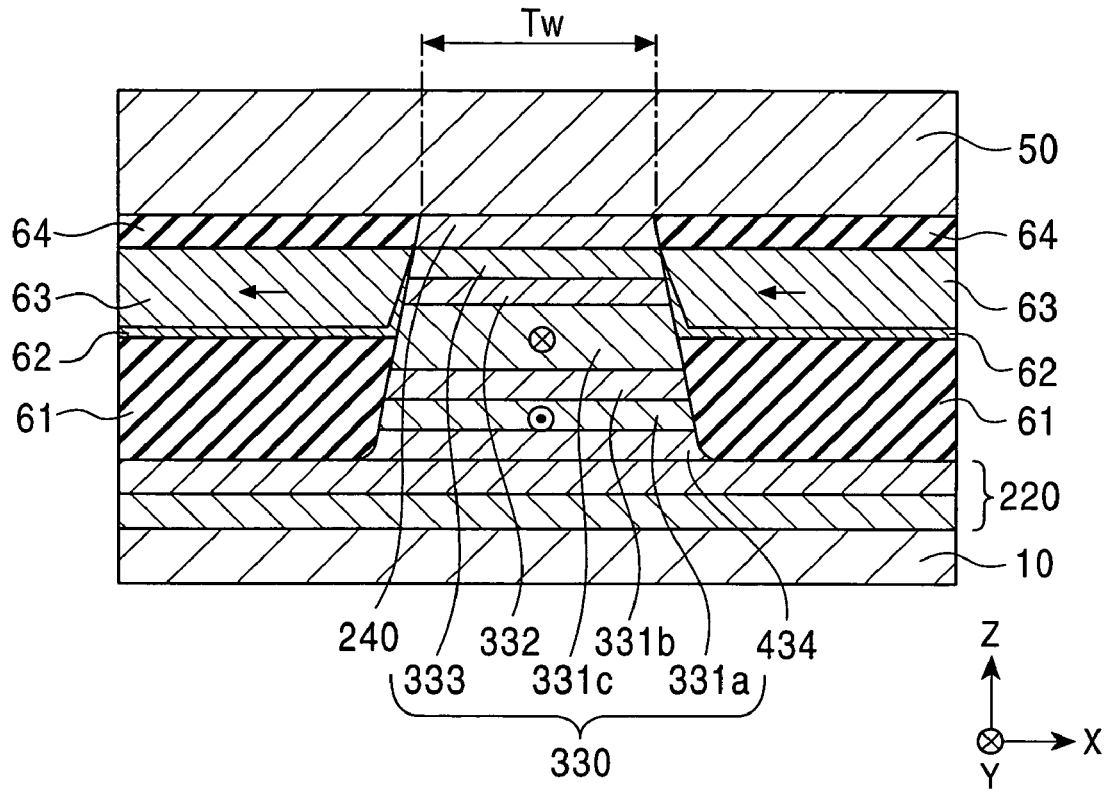
FIG. 21 is a partial sectional view showing the structure of the CPP giant magnetoresistive head shown in FIG. 20, as viewed from a surface facing a recording medium.
Figure 22:
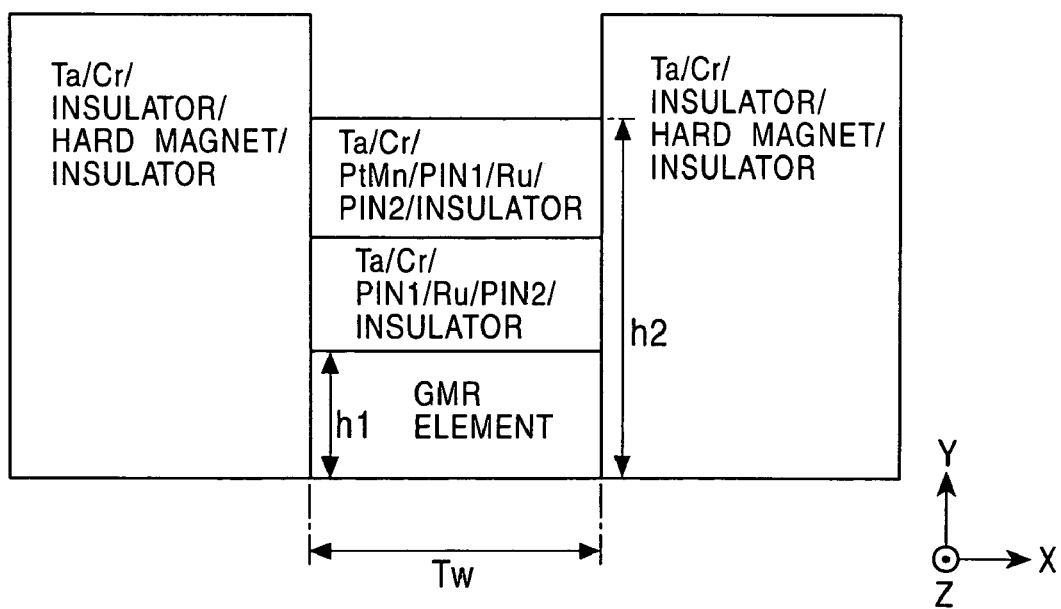
FIG. 22 is a schematic top plan view showing the GMR element shown in FIG. 20.

FIG. 20 is a partial sectional view showing the structure of a CPP-GMR head 401, taken along a central line of an element, FIG. 21 is a partial sectional view showing the structure of the CPP-GMR head 401, as viewed from a surface facing a recording medium, and FIG. 22 is a schematic top plan view of a GMR element 330. In FIGS. 20 to 25, the functions, materials and thicknesses of layers denoted by the same reference numerals as those in the third embodiment shown in FIGS. 14 to 16 are the same as those in the third embodiment.

In the fourth embodiment, in the CPP-GMR head 301 of the third embodiment, a magnetostrictive enhancement layer 434 is interposed between the lower nonmagnetic metal film 220 and the first pinned magnetic layer 331a and between the antiferromagnetic layer 334 and the first pinned magnetic layer 331a. The magnetostrictive enhancement layer 434 has the function to produce crystal mismatching at the interface with the first pinned magnetic layer 331a and increase the magnetostriction constant of the first pinned magnetic layer 331a due to the distortion of the crystal structure. When the magnetostriction constant of the first pinned magnetic layer 331a is increased, magnetization of each of the first pinned magnetic layer 331a and the second pinned magnetic layer 331c can be more strongly pinned to increase output and improve output stability and symmetry.

The magnetoresistive enhancement layer 434 and the antiferromagnetic layer 334 comprise a Z—Mn alloy (wherein Z is at least one element of Pt, Pd, Ir, Rh, Ru, Os, Ni, and Fe). When the magnetoresistive enhancement layer 434 comprises this material, it has a face-centered cubic structure (fcc) at least at the interface with the first pinned magnetic layer 331a, and an equivalent crystal plane represented by {111} plane is preferentially oriented in parallel with the interface.

The magnetoresistive enhancement layer 434 is formed to a thickness of 5 Å to 50 Å. With a thickness in this range, a disordered lattice cannot be transformed to an ordered lattice even by a heat treatment because of its small thickness, and the face-centered cubic structure (fcc) at the time of deposition is maintained. When the magnetoresistive enhancement layer 434 has a face-centered cubic crystal structure (fcc), the magnetoresistive enhancement layer 434 does not exhibit the antiferromagnetic characteristics, and thus no or weak exchange coupling magnetic field occurs at the interface between the magnetoresistive enhancement layer 434 and the first pinned magnetic layer 331a. When the magnetoresistive enhancement layer 434 has a thickness of over 50 Å, the structure is transformed to a CuAuI-type ordered face-centered tetragonal structure (fct) by heating to about 250° C. or more, like the antiferromagnetic layer 334. However, even when the thickness of the magnetoresistive enhancement layer 434 exceeds 50 Å, the magnetoresistive enhancement layer 434 maintains the face-centered cubic crystal structure (fcc) unless heat of 250° C. or more is applied.

The magnetostrictive enhancement layer 434 is epitaxially or heteroepitaxially matched with the first pinned magnetic layer 331a to appropriately distort the crystal structures.

Figure 23:
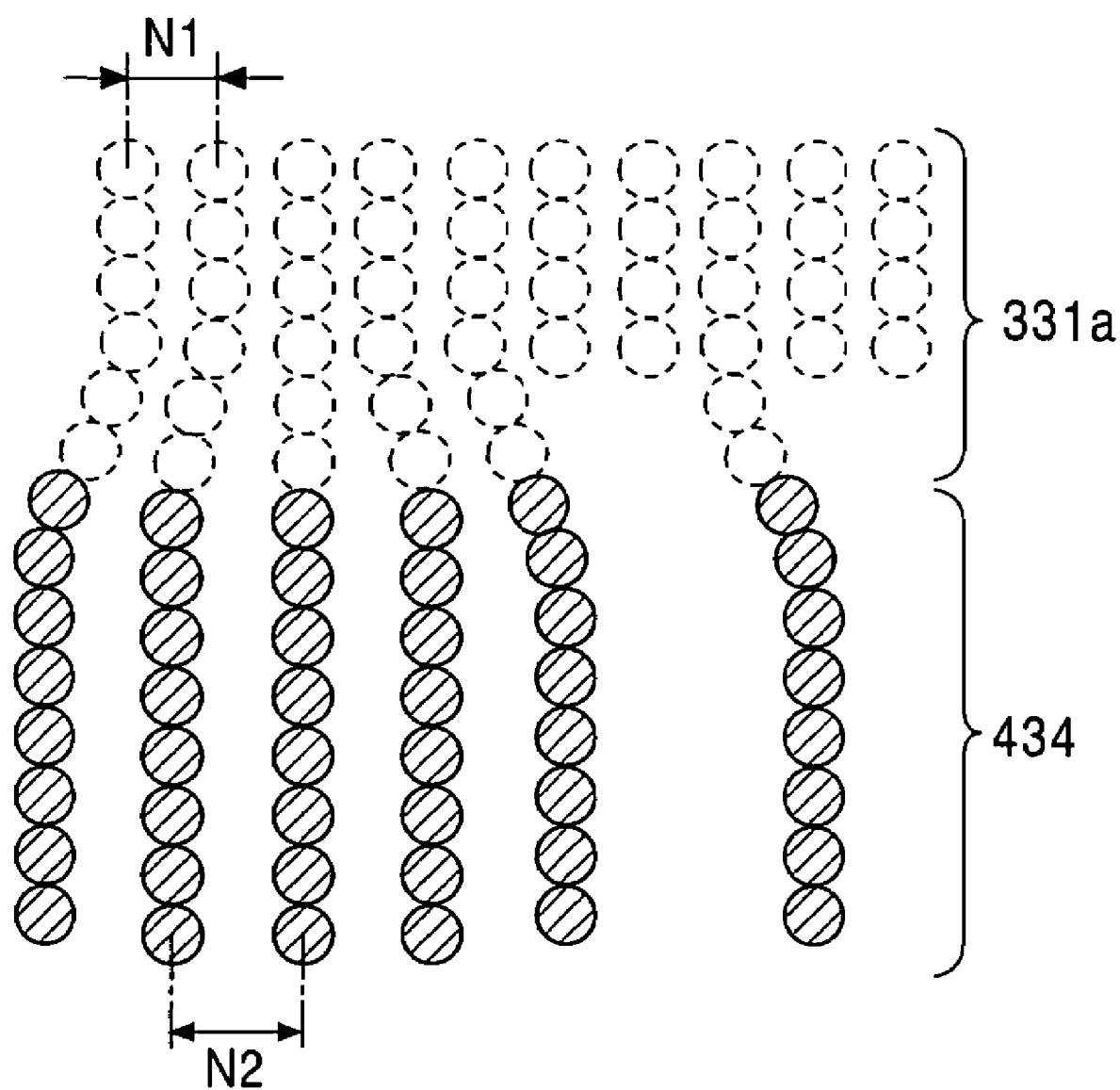
FIG. 23 is a schematic view illustrating a state in which the crystal structures of a first pinned magnetic layer and a magnetostrictive enhancement layer are distorted while matching with each other.

As described above, the magnetostrictive enhancement layer 434 of this embodiment has the face-centered cubic structure (fcc) in which an equivalent crystal plane represented by {111} plane is preferentially oriented in parallel with the interface with the first pinned magnetic layer 331a. On the other hand, the first pinned magnetic layer 331a comprises Co or $Co_mFe_n$ (n≦20 and n+m=100) and has the face-centered cubic structure (fcc) in which an equivalent crystal plane represented by {111} plane is preferentially oriented in parallel with the interface with the magnetostrictive enhancement layer 434. Therefore, the constituent atoms of the magnetostrictive enhancement layer 434 easily overlap the constituent atoms of the first pinned magnetic layer 331a, and the crystals in the magnetostrictive enhancement layer 434 and the first pinned magnetic layer 331a are epitaxially matched with each other. However, in order to distort the crystal structures, a predetermined difference or more must be produced between the nearest neighbor interatomic distance N2 in {111} plane of the magnetostrictive enhancement layer 434 and the nearest neighbor interatomic distance N1 in {111} plane of the first pinned magnetic layer 331a. As schematically shown in FIG. 23, in this embodiment, the constituent atoms of the magnetostrictive enhancement layer 434 overlap the constituent atoms of the first pinned magnetic layer 331a while distorting the crystal structures near the interface therebetween.

In this embodiment, the Z element content of the Z—Mn alloy used for forming the magnetostrictive enhancement layer 434 is controlled to 40 atomic percent to 95 atomic percent. Within this range, the first pinned magnetic layer 331a takes a positive large value of magnetostriction constant and is stabilized.

Figure 24:
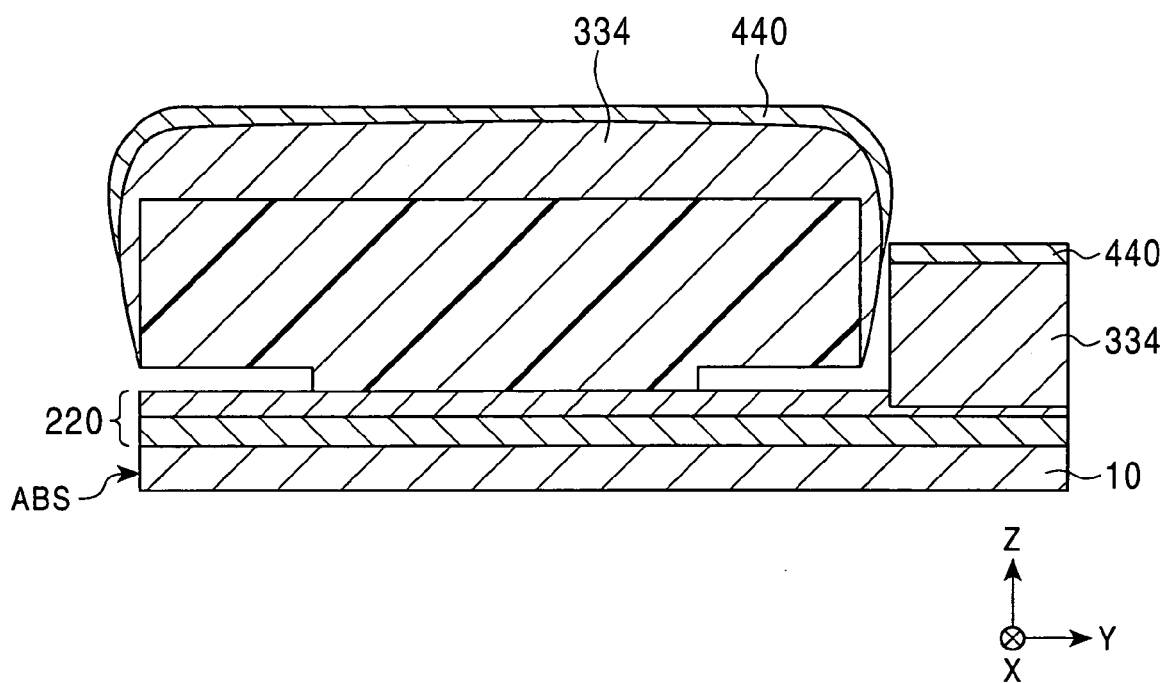
FIG. 24 is a partial sectional view showing a step of a method for manufacturing the CPP giant magnetoresistive head shown in FIGS. 20 to 22, taken along a central line of the element in the height direction.
Figure 25:
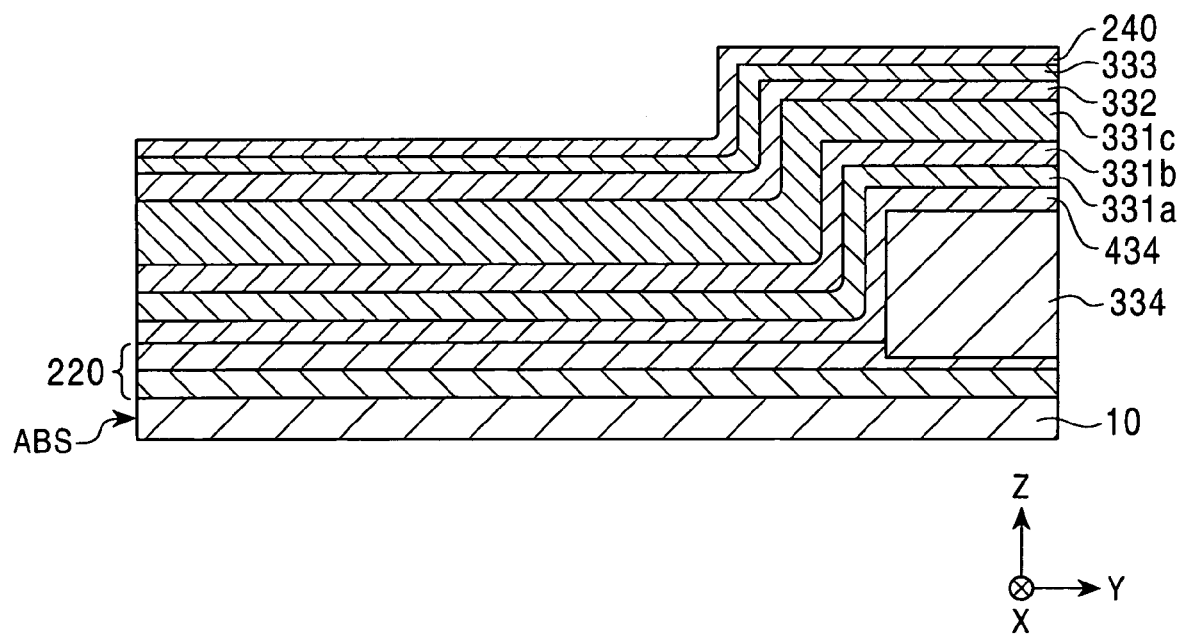
FIG. 25 is a partial sectional view showing a step after the step shown in FIG. 24, taken along a central line of the element in the height direction.

Next, a method for manufacturing the CPP-GMR head 401 shown in FIGS. 20 to 22 according to an embodiment of the present invention will be described below with reference to FIGS. 24 and 25. Each of FIGS. 24 and 25 is a partial sectional view showing a step for manufacturing the CPP-GMR head 401, taken along a central line of an element in parallel with the height direction. Since the material and thickness of each layer are the same as those of the completed CPP-GMR head 401, the description thereof is omitted.

First, the lower nonmagnetic metal film 220 having a Ta/Cr two-layer structure is deposited on the lower shield layer 10. Next, a resist layer having an aperture for forming an antiferromagnetic layer is formed on the lower nonmagnetic metal film 220, and a portion (a portion of the Cr film) of the lower nonmagnetic metal film 220, which is not covered with the resist, is removed by ion milling. Then, as shown in FIG. 24, the antiferromagnetic layer 334 and a Re layer 440 are continuously deposited with the resist left on the lower nonmagnetic metal film 220. These layers are deposited by sputtering. The Ru layer 440 is deposited to a thickness of as small as about 5 Å to 10 Å to functions as an antioxidative layer for the antiferromagnetic layer 334. After the Ru layer 440 is deposited, the resist is removed by liftoff.

Then, the Ru layer 440 deposited on the antiferromagnetic layer 334 is removed by, for example, ion beam etching with low ion energy, and at the same time, the oxide layer produced on the lower nonmagnetic metal film 220 is removed.

Then, as shown in FIG. 25, the magnetostrictive enhancement layer 434, the first pinned magnetic layer 331a, the nonmagnetic intermediate layer 331b, the second pinned magnetic layer 331c, the nonmagnetic layer 332, the free magnetic layer 333 and the upper nonmagnetic metal film 240 are continuously deposited over the lower nonmagnetic metal film 220 and the antiferromagnetic layer 334. In this embodiment, the magnetostrictive enhancement layer 434 and the first pinned magnetic layer 331a are epitaxially matched with each other, and the structure of each of the magnetoresistive enhancement layer 434 and the first pinned magnetic layer 331a is distorted at the interface therebetween.

Since the steps after the upper nonmagnetic metal film 240 is deposited are the same as those of the manufacturing method of the second embodiment, the description thereof is omitted.

As described above, in the fourth embodiment, the magnetostrictive enhancement layer 434 is provided for producing crystal mismatch strain at the interface with the first pinned magnetic layer 331a to increase magnetostriction of the first pinned magnetic layer 331a, thereby more strongly pinning magnetization of the pinned magnetic layer 331. Also, the magnetostrictive enhancement layer 434 is formed to a thickness of as small as 5 Å to 50 Å, and thus it exhibits no antiferromagnetic characteristic even by a heat treatment. Therefore, when the sensing current flows through the GMR element 330, Joule heat is not increased, and a current loss is not increased. Furthermore, it is possible to comply with narrowing of the shield space.

Although, in the fourth embodiment, the magnetostrictive enhancement layer 434 and the first pinned magnetic layer 331a are epitaxially joined with each other, the magnetostrictive enhancement layer 434 and the first pinned magnetic layer 331a may be heteroepitaxially joined with each other. In this case, the crystal structure of each of the magnetostrictive enhancement layer 434 and the first pinned magnetic layer 331a can be appropriately distorted at the interface therebetween (a degree causing no distortion of the atomic arrangements of the fist pinned magnetic layer 331a, the nonmagnetic intermediate layer 331b, and the second pinned magnetic layer 331c).

Specifically, the first pinned magnetic layer 331a comprises $Co_nFe_m$ (m≧20 and n+m=100). In this case, the first pinned magnetic layer 331a has a body-centered cubic structure (bcc), and an equivalent crystal plane represented by {110} plane is preferentially oriented in parallel with the interface with the magnetostrictive enhancement layer 434. Since the atomic arrangement of an equivalent crystal plane represented by {110} plane of a crystal having a body-centered cubic structure is similar to the atomic arrangement of an equivalent crystal structure represented by {111} plane of a crystal having a face-centered cubic structure, the constituent atoms of the magnetostrictive enhancement layer 434 having a face-centered cubic structure can be heteroepitaxially joined to the constituent atoms of the first pinned magnetic layer 331a having a body-centered cubic structure. However, there is a predetermined difference or more between the nearest neighbor interatomic distance in {110} plane of the first pinned magnetic layer 331a and the nearest neighbor interatomic distance in {111} plane of the magnetostrictive enhancement layer 434. Therefore, the crystal structures of the first pinned magnetic layer 331a and the magnetostrictive enhancement layer 434 are appropriately distorted near the interface therebetween while causing overlap between the constituent atoms of both layers. The magnetostriction of the first pinned magnetic layer 331a is increased by the distortion.

As described above, the material used for forming the first pinned magnetic layer 331a may be $Co_nFe_m$ (m≧20 and n+m=100) having a body-centered cubic structure or Co or $Co_nFe_m$ (m≦20 and n+m=100) having a face-centered cubic structure. When $Co_nFe_m$ (m≧20 and n+m=100) having a body-centered cubic structure is used, positive magnetostriction can be more increased than that in the use of Co or $Co_nFe_m$ (m≦20 and n+m=100) having a face-centered cubic structure. When Co or $Co_nFe_m$ (m≦20 and n+m=100) having a face-centered cubic structure is used, coercive force is increased, and magnetization of the first pinned magnetic layer 331a can be strongly pinned.

Furthermore, the pinned magnetic layer 331a can be formed by using both $Co_nFe_m$ (m≧20 and n+m=100) having a body-centered cubic structure and Co or $Co_nFe_m$ (m≦20 and n+m=100) having a face-centered cubic structure. Specifically, the composition near the interface with the magnetoresistive enhancement layer 434 may comprise Co or $Co_nFe_m$ (m≦20 and n+m=100), and the composition near the interface with the nonmagnetic intermediate layer 331b may comprise $Co_nFe_m$ (m≧20 and n+m=100). In this case, the Fe concentration gradually increases from the interface with the magnetoresistive enhancement layer 434 to the nonmagnetic intermediate layer 331b.

The CPP-GMR head of each of the second to fourth embodiments is a type in which the pinned magnetic layer 231 (331) is deposited below the nonmagnetic layer 232 (332).

Next, a type according to fifth to eighth embodiments in which a pinned magnetic layer is disposed above a nonmagnetic layer will be described.

Figure 26:
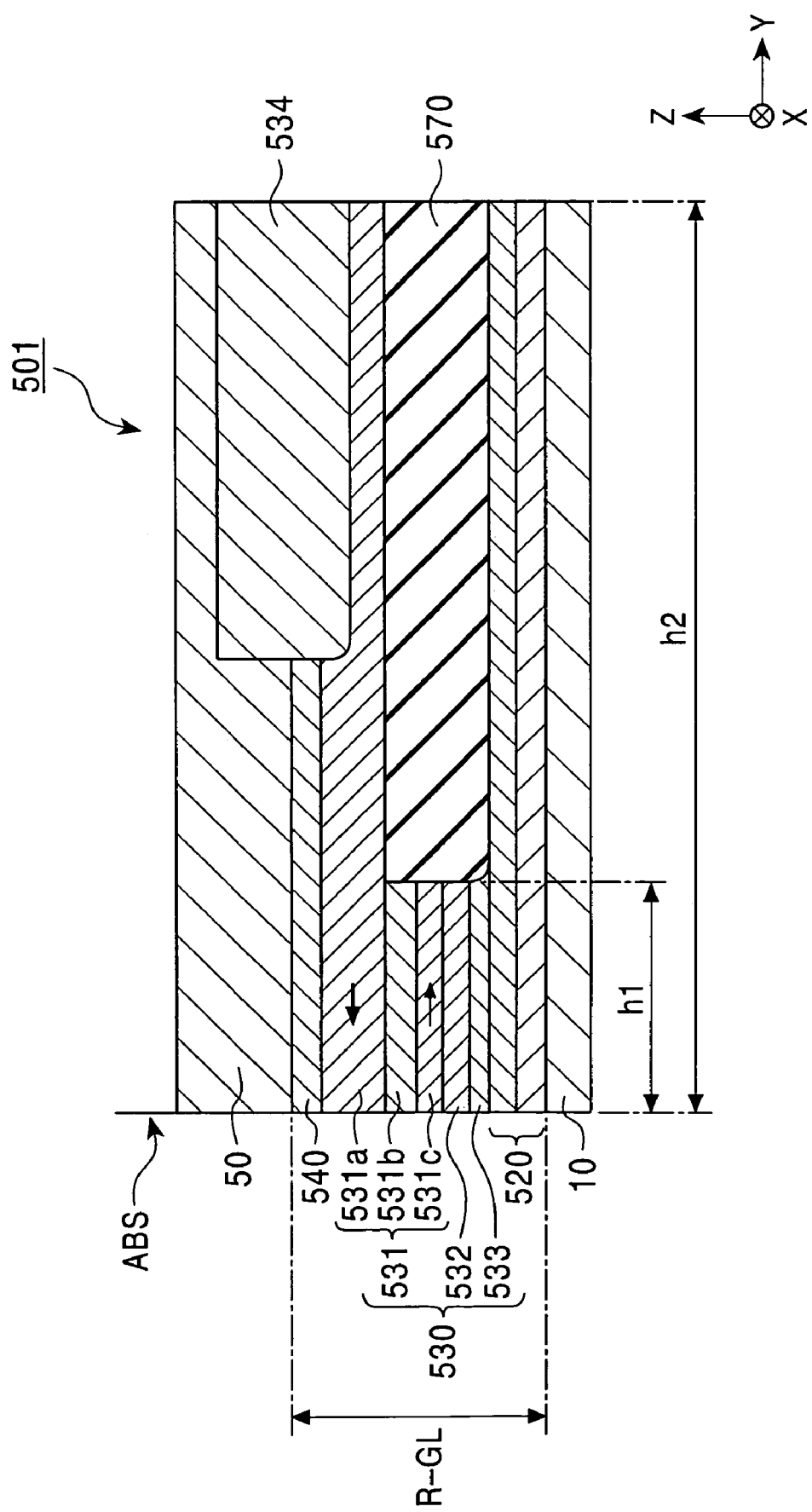
FIG. 26 is a partial sectional view showing the structure of a CPP giant magnetoresistive head according to a fifth embodiment of the present invention, taken along a central line of an element.
Figure 27:
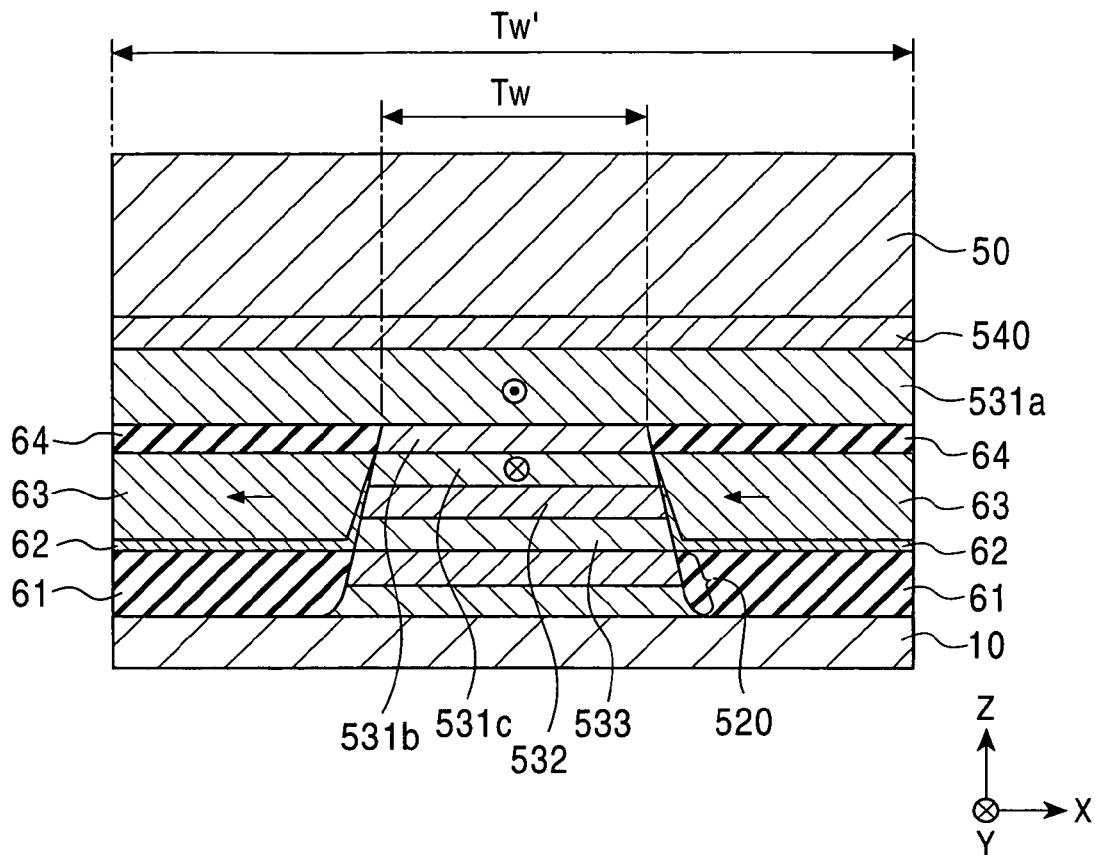
FIG. 27 is a partial sectional view showing the structure of the CPP giant magnetoresistive head shown in FIG. 26, as viewed from a surface facing a recording medium.
Figure 28:
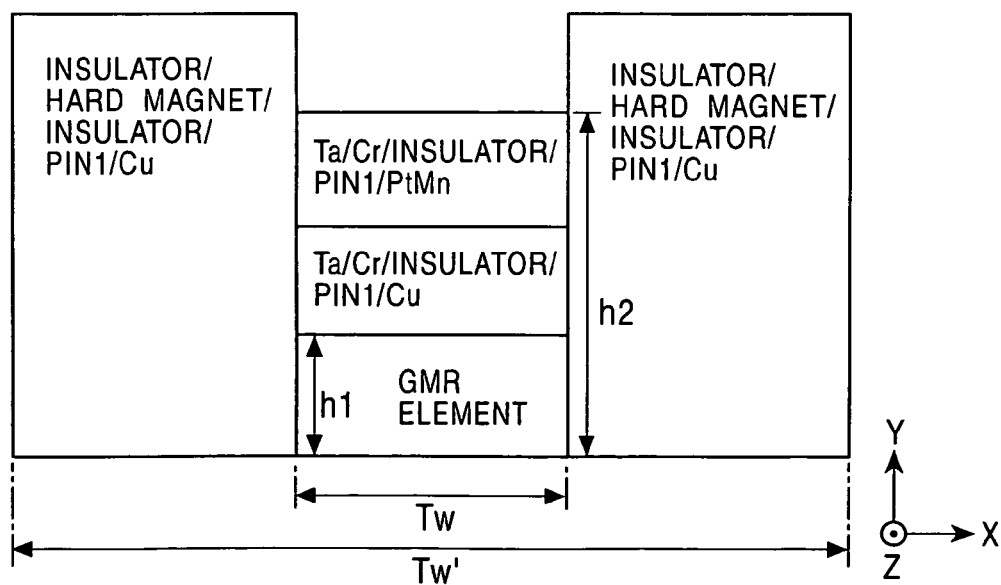
FIG. 28 is a schematic top plan view showing the GMR element shown in FIG. 26.

FIGS. 26 to 28 show a CPP giant magnetoresistive head (CPP-GMR heat) according to the fifth embodiment of the present invention.

The CPP-GMR head of the fifth embodiment is a type in which a pinned magnetic layer is laminated on a nonmagnetic layer, and an antiferromagnetic layer 534 is provided on a first pinned magnetic layer 531a rearwardly extending in the height direction.

FIG. 26 is a partial sectional view showing the structure of a CPP-GMR head 501, taken along a central line of an element, FIG. 27 is a partial sectional view showing the structure of the CPP-GMR head 501, as viewed from a surface facing a recording medium, and FIG. 28 is a schematic top plan view of a GMR element 530. In FIGS. 26 to 28, the functions, materials and thicknesses of layers denoted by the same reference numerals as those in the second embodiment shown in FIGS. 6 to 8 are the same as those in the second embodiment.

The CPP-GMR head 501 comprises the GMR element 530 exhibiting the GMR effect when a sensing current flows through the lower shield layer 10 and the upper shield layer 50 in the thickness direction. In the GMR element 530, the lamination order of the layers is opposite to that in the GMR element of each of the second to fourth embodiments. Namely, in this embodiment, a free magnetic layer 533, a nonmagnetic layer 532, and a pinned magnetic layer 531 (a second pinned magnetic layer 531c, a nonmagnetic intermediate layer 531b, and a first pinned magnetic layer 531a) are laminated in that order from below. The shapes, thicknesses and materials of the free magnetic layer 533 and the nonmagnetic layer 532 are the same as those of the free magnetic layer 233 and the nonmagnetic layer 232, respectively, in the second embodiment.

Like the pinned magnetic layer 231 of the second embodiment, each of the layers of the pinned magnetic layer 531 comprises a magnetic material having a positive magnetostriction constant, and the end surface of the-pinned magnetic layer 531 is exposed at the surface facing the recording medium, as shown in FIG. 26. Therefore, the magnetization direction of the pinned magnetic layer 531 is stabilized in a single direction parallel to the height direction by the inverse magnetostrictive effect.

In the pinned magnetic layer 531, the first pinned magnetic layer 531a extends beyond the GMR element portion (the free magnetic layer 533, the nonmagnetic layer 532, the second pinned magnetic layer 531c and the nonmagnetic intermediate layer 531b) in the track width direction and in the height direction. Namely, the height dimension h2 of the first pinned magnetic layer 531a is larger than the height dimension h1 of the GMR element 530, and the track width-direction dimension Tw' is larger than the track width dimension Tw of the GMR element 530. Also, the height dimension h2 of the first pinned magnetic layer 531a is larger than the track width-direction dimension Tw' to produce shape anisotropy in the first pinned magnetic layer 531a in parallel with the height direction. Therefore, magnetization of the first pinned magnetic layer 531a is stabilized by the shape anisotropy in a direction parallel to the height direction.

Also, an upper nonmagnetic metal film 540 is formed on the first pinned magnetic layer 531a and above the GMR element 530, and the antiferromagnetic layer 534 is formed in the rear of the GMR element 530 and the upper nonmagnetic metal film 540 in the height direction. In the first pinned magnetic layer 531a, a portion on which the antiferromagnetic layer 534 is formed has a smaller thickness than that of a portion on which the upper nonmagnetic metal film 540 is formed.

The material and thickness of the antiferromagnetic layer 534 are the same as those of the antiferromagnetic layer 234 in the second embodiment, and the antiferromagnetic layer 534 is in contact with the upper surface of a rear portion of the first pinned magnetic layer 531a which extends in the height direction beyond the GMR element 530. The antiferromagnetic layer 534 produces an exchange coupling magnetic field at the interface with the first pinned magnetic layer 531a, so that the magnetization direction of the first pinned magnetic layer 531a is pinned in antiparallel to the height direction by the exchange coupling magnetic field. The first and second pinned magnetic layers 531a and 531c have antiparallel magnetization directions due to a RKKY interaction through the nonmagnetic intermediate layer 531b. Therefore, magnetization of the second pinned magnetic layer 531c is pinned in the height direction. In this embodiment, the magnetic moment per unit area of the first pinned magnetic layer 531a is larger than that of the second pinned magnetic layer 531c, and thus the magnetization direction of the whole pinned magnetic layer 531 is the same as that of the first pinned magnetic layer 531a. The thicknesses of the second pinned magnetic layer 531c and the nonmagnetic intermediate layer 531b are the same as those of the second pinned magnetic layer 231c and the nonmagnetic intermediate layer 231b, respectively, in the second embodiment.

The lengths of the upper nonmagnetic metal film 540 in the track width direction and in the height direction are larger than those of the GMR element 530 (the free magnetic layer 533, the nonmagnetic layer 532, the second pinned magnetic layer 531c and the nonmagnetic intermediate layer 531b). The upper nonmagnetic metal film 540 functions as an electrode together with the upper shied layer 50. The upper nonmagnetic metal film 540 can be formed to the same thickness as that of the upper nonmagnetic metal film 240 of the second embodiment by using the same material as in the second embodiment.

Furthermore, a lower nonmagnetic metal film 520 is formed directly below the free magnetic layer 533 to have a larger length than that of the free magnetic layer 533 in the height direction and substantially the same length as the free magnetic layer 533 in the track width direction. The lower nonmagnetic metal film 520 functions as an electrode together with the lower shield layer 10 and functions as a seed layer for regularly forming the layers constituting the GMR element 530. The material and thickness of the lower nonmagnetic metal film 520 can be set to the same as those of the lower nonmagnetic metal film 220 in the second embodiment. In this embodiment, the lower nonmagnetic metal film 520 is formed in a Ta/Cr two-layer structure.

Furthermore, a space between the rear portion of the first pinned magnetic layer 531a and the lower nonmagnetic metal film 520 and in the rear of the layers ranging from the free magnetic layer 533 to the nonmagnetic intermediate layer 531b in the height direction is filled with a backfill gap layer 570. The backfill gap layer 570 comprises an insulating material such as $Al_2O_3$ or $SiO_2$, for suppressing a shut of the sensing current.

Next, a method for manufacturing the CPP-GMR head 501 shown in FIGS. 26 to 28 according to an embodiment of the present invention will be described below. Since the material and thickness of each of the layers are the same as those in the completed CPP-GMR head 501, the description thereof is omitted.

First, the lower nonmagnetic metal film 520, the free magnetic layer 533, the nonmagnetic layer 532, the second pinned magnetic layer 531c, and the nonmagnetic intermediate layer 531b are continuously deposited on the lower shield layer 10 in that order from below. These layers are deposited by sputtering. When the nonmagnetic intermediate layer 531b comprises an oxidizable magnetic material, an antioxidative layer is preferably formed to a thickness of as small as 5 Å to 10 Å on the nonmagnetic intermediate layer 531b, for preventing surface oxidation of the nonmagnetic intermediate layer 531b.

Next, a resist layer is formed on the nonmagnetic intermediate layer 531b, for determining the track width dimension Tw of the GMR element 530 to be formed.

After the resist layer is formed, portions of the layers ranging from the nonmagnetic intermediate layer 531b to the lower nonmagnetic metal film 520, which are not covered with the resist layer, are removed by, for example, ion milling to expose the lower shield layer 10 in the removed portion. In this step, the layers ranging from the nonmagnetic metal film 520 to the nonmagnetic intermediate layer 531b are left on the lower shield layer at substantially the center thereof in the track width direction.

Then, the first insulating layers 61, the bias underlying layers 62, the hard bias layers 63 and the second insulating layers 64 are continuously deposited on both sides of the layers in the track width direction with the resist layer left on the nonmagnetic intermediate layer 531b, the layers ranging from the lower nonmagnetic metal film 520 to the nonmagnetic intermediate layer 531b. These layers are deposited by sputtering. In sputtering deposition, the angle of sputtered particles is preferably about 90 degrees with the lower nonmagnetic metal film 520. After sputtering deposition, the resist layer is removed by liftoff.

After the resist layer is removed, a resist layer is formed on the nonmagnetic intermediate layer 531b, for determining the height dimension h1 of the GMR element 530 to be formed, and portions of the nonmagnetic intermediate layer 531b, the second pinned magnetic layer 531c, the nonmagnetic layer 532 and the free magnetic layer 533, which are not covered with the resist layer, are removed by, for example, ion milling. In this step, the nonmagnetic intermediate layer 531b, the second pinned magnetic layer 531c, the nonmagnetic layer 532 and the free magnetic layer 533 have a height dimension equal to the height dimension h1 of the GMR element 530.

The step of determining the track width dimension Tw of the GMR element 530 and the step of determining the height dimension h1 may be reversed.

Then, with the resist layer left on the nonmagnetic intermediate layer 531b, the backfill gap layer 570 is deposited in the rear of the nonmagnetic intermediate layer 531b, the second pinned magnetic layer 531c, the nonmagnetic layer 532, and the free magnetic layer 533 in the height direction. After the backfill gap layer 570 is deposited, the resist layer is removed by liftoff.

After the resist layer is removed, a new resist layer having an aperture for forming the first pinned magnetic layer 531a is formed on the nonmagnetic intermediate layer 531b. Then, the surface of the nonmagnetic intermediate layer 531b exposed from the resist layer is cleaned by low-energy ion beam etching or plasma irradiation, and then the first pinned magnetic layer 531a and the upper nonmagnetic metal film 540 are continuously deposited. After deposition, the resist layer is removed by liftoff.

The term "low-energy ion beam etching" means ion milling using an ion beam with a beam voltage (acceleration voltage) of less than 1000 V. For example, a beam voltage of 100 V to 500 V is used. In this embodiment, an argon (Ar) ion beam with a low beam voltage of 200 V is used. This definition of "low-energy ion beam etching" applies to the description below.

Then, a new resist layer having an aperture for forming the antiferromagnetic layer 534 is formed on the upper nonmagnetic metal film 540. Then, portions of the upper nonmagnetic metal film 540 and a portion of the first pinned magnetic layer 531a, which are not covered with the resist layer, are removed by, for example, and the antiferromagnetic layer 534 is deposited in the removed portion. After the deposition of the antiferromagnetic layer 534, the resist layer is removed by liftoff.

Like in the second embodiment, annealing is then performed in a magnetic field in the height direction, and the upper shield layer 50 is formed over the upper nonmagnetic metal film 540 and the antiferromagnetic layer 534. The CPP-GMR head 501 shown in FIGS. 26 to 28 is completed by the above-described steps.

As described above, in the fifth embodiment, the antiferromagnetic layer 534 is provided in contact with the upper surface of the rear portion of the first pinned magnetic layer 531a which extends in the height direction beyond the GMR element portion (ranging from the free magnetic layer 533 to the nonmagnetic intermediate layer 531b), for producing an exchange coupling magnetic field at the interface with the first pinned magnetic layer 531a. Therefore, like in the second to fourth embodiments, a wide contact area (an area where an exchange coupling magnetic field occurs) can be secured between the first pinned magnetic layer 531a and the antiferromagnetic layer 534 to stably and strongly pin magnetization of the pinned magnetic layer 531. The contact area between the first pinned magnetic layer 531a and the antiferromagnetic layer 534 is larger that in the case in which the antiferromagnetic layer is in contact with the rear end surface of any one of the first pinned magnetic layer and the second pinned magnetic layer like in the first embodiment. In this embodiment, the contact area between the first pinned magnetic layer 531a and the antiferromagnetic layer 534 is 500 times or more as large as that between the first pinned magnetic layer 33c and the antiferromagnetic layer 34 in the first embodiment.

Like in the second to fourth embodiments, in the fifth embodiment, magnetization pinning of the first and second pinned magnetic layers 531a and 531c is also strengthened by uniaxial anisotropy due to the inverse magnetostrictive effect, shape anisotropy, and the seed effect of the lower nonmagnetic metal film 520. In this way, when magnetization of each of the first pinned magnetic layer 531a and the second pinned magnetic layer 531c is strongly pinned, magnetization of the pinned magnetic layer 531 is not fluctuated by the generated sensing current magnetic field even if the direction of the sensing current magnetic field is not the same as that of the synthetic magnetic moment of the first and second pinned magnetic layers 531a and 531c. Therefore, the sensing current density can be increased to increase output.

Like in the second to fourth embodiments, in the fifth embodiment, even when the sensing current is passed through the GMR element 530, the antiferromagnetic layer 534 does not generate heat to suppress an increase in the element temperature, thereby improving reliability. Also, the shield distance R-GL at the surface facing the recording medium can be decreased in comparison to the conventional head shown in FIG. 55, thereby improving resolution.

FIGS. 29 to 35 show a CPP giant magnetoresistive head (CPP-GMR heat) according to the sixth embodiment of the present invention.

Like in the fifth embodiment, in the sixth embodiment, an antiferromagnetic layer 534 is provided on a first pinned magnetic layer 531a rearwardly extending in the height direction. However, the sixth embodiment is different from the fifth embodiment in the production method.

Figure 29:
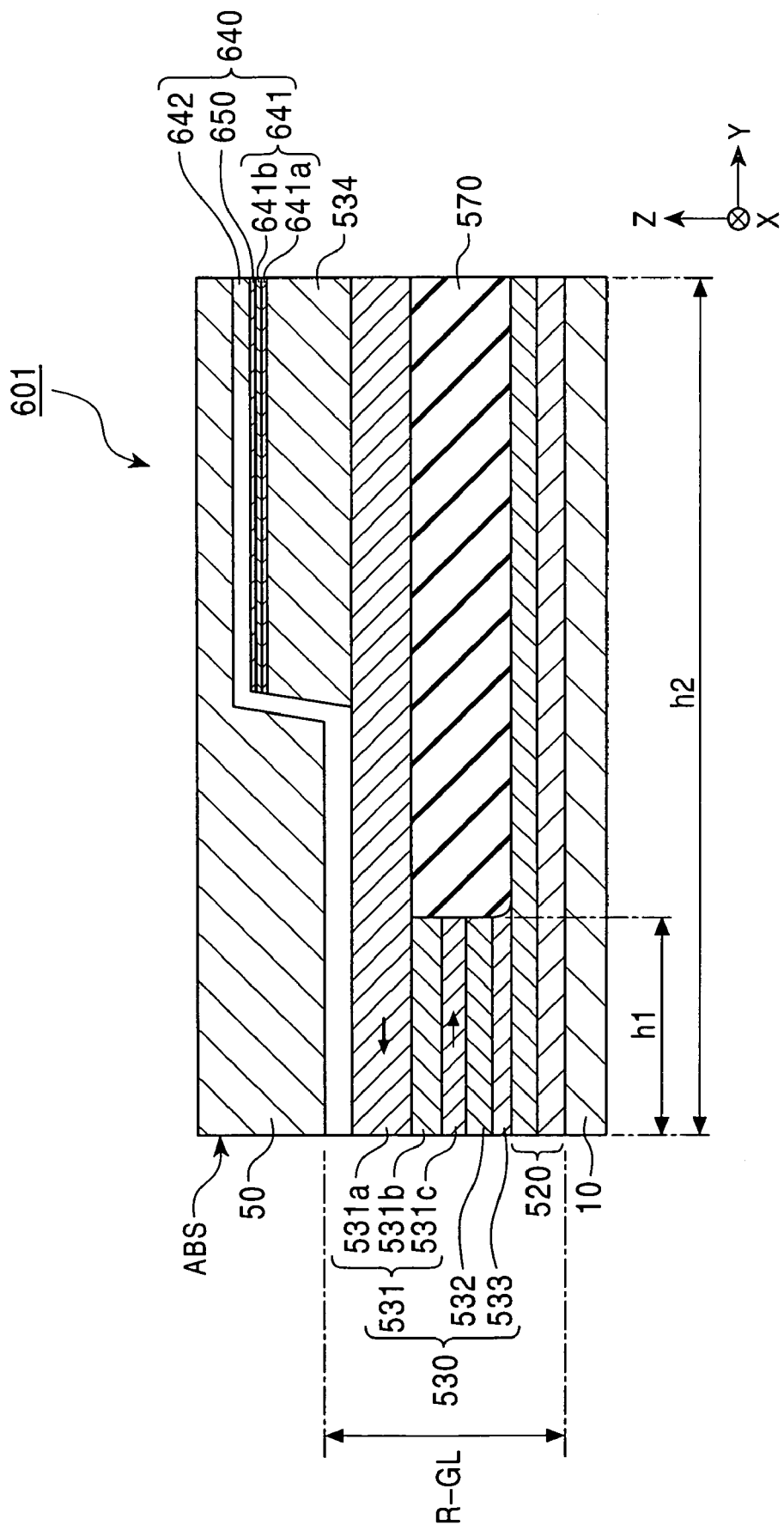
FIG. 29 is a partial sectional view showing the structure of a CPP giant magnetoresistive head according to a sixth embodiment of the present invention, taken along a central line of an element.
Figure 30:
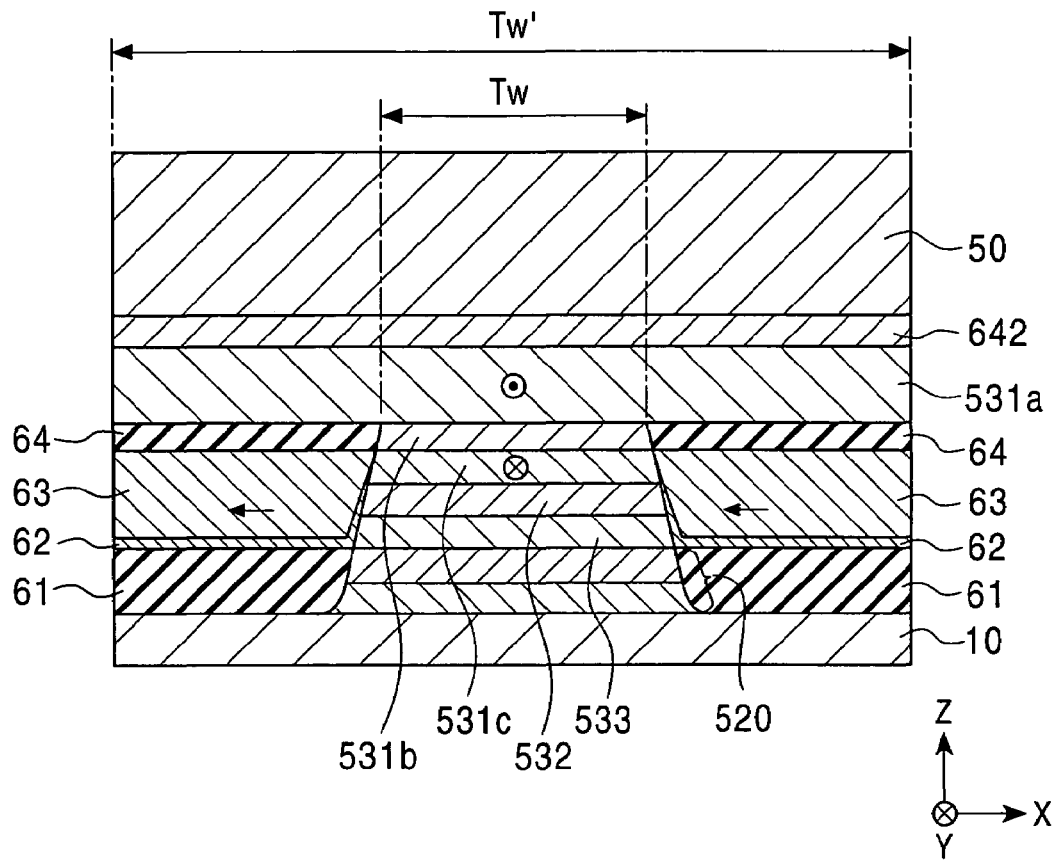
FIG. 30 is a partial sectional view showing the structure of the CPP giant magnetoresistive head shown in FIG. 29, as viewed from a surface facing a recording medium.
Figure 31:
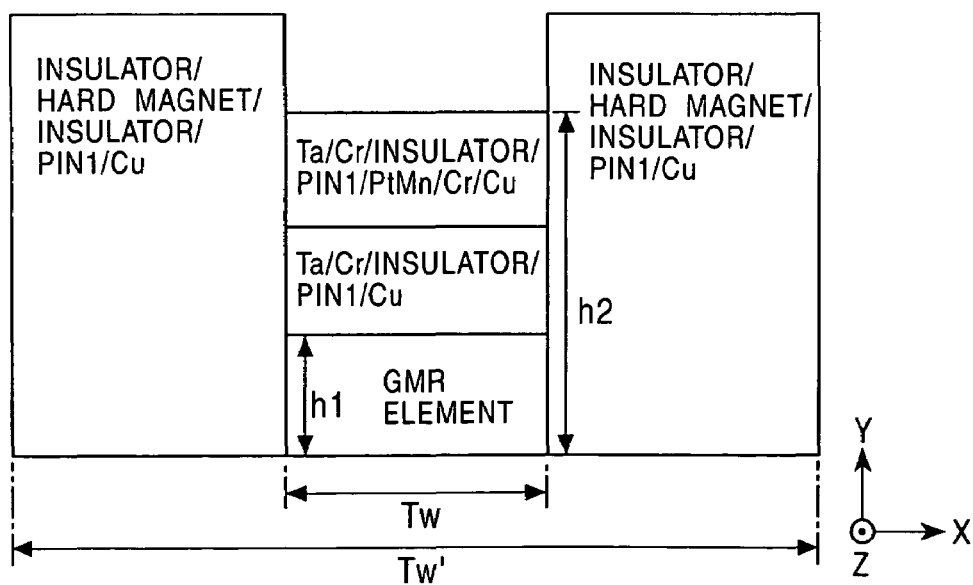
FIG. 31 is a schematic top plan view showing the GMR element shown in FIG. 29.

FIG. 29 is a partial sectional view showing the structure of a CPP-GMR head 601, taken along a central line of an element, FIG. 30 is a partial sectional view showing the structure of the CPP-GMR head 601, as viewed from a surface facing a recording medium, and FIG. 31 is a schematic top plan view of a GMR element 530. In FIGS. 29 to 31, the functions, materials and thicknesses of layers denoted by the same reference numerals as those in the fifth embodiment shown in FIGS. 26 to 28 are the same as those in the fifth embodiment.

In the CPP-GMR head 601, an upper nonmagnetic metal film 640 comprises a first nonmagnetic metal film 641 formed to cover the upper surface of the antiferromagnetic layer 534, and a second nonmagnetic metal film 642 formed over the first nonmagnetic metal film 641 and the first pinned magnetic layer 531a. The first nonmagnetic metal film 641 functions as a stopper in RIE (reactive ion etching) performed in the manufacturing process, and comprises Cr. A metal mask layer 650 may be interposed between the first nonmagnetic metal film 641 and the second nonmagnetic metal film 642. In this embodiment, differences in shape and structure of the upper nonmagnetic metal film 640 from the upper nonmagnetic metal film 540 of the fifth embodiment are caused by a difference between the production methods, and the effect of the upper nonmagnetic metal film is the same as in the fifth embodiment.

A method for manufacturing the CPP-GMR head 601 shown in FIGS. 29 to 31 according to an embodiment of the present invention will be described below with reference to FIGS. 32 to 35. Since the material and thickness of each of the layers are the same as those in the completed CPP-GMR head 601, the description thereof is omitted.

First, the lower nonmagnetic metal film 520, the free magnetic layer 533, the nonmagnetic layer 532, the second pinned magnetic layer 531*c*, and the nonmagnetic intermediate layer 531*b* are continuously deposited on the lower shield layer 10 in that order from below by the same method as in the fifth embodiment.

Next, a resist layer is formed on the nonmagnetic intermediate layer 531*b*, for determining the height dimension h1 of the GMR element 530 to be formed.

After the resist layer is formed, portions of the layers ranging from the nonmagnetic intermediate layer 531*b* to the lower nonmagnetic metal film 520, which are not covered with the resist layer, are removed by, for example, ion milling, and a backfill gap layer 570 is formed in the removed portion. Then, the resist layer is removed by liftoff.

Figure 32:
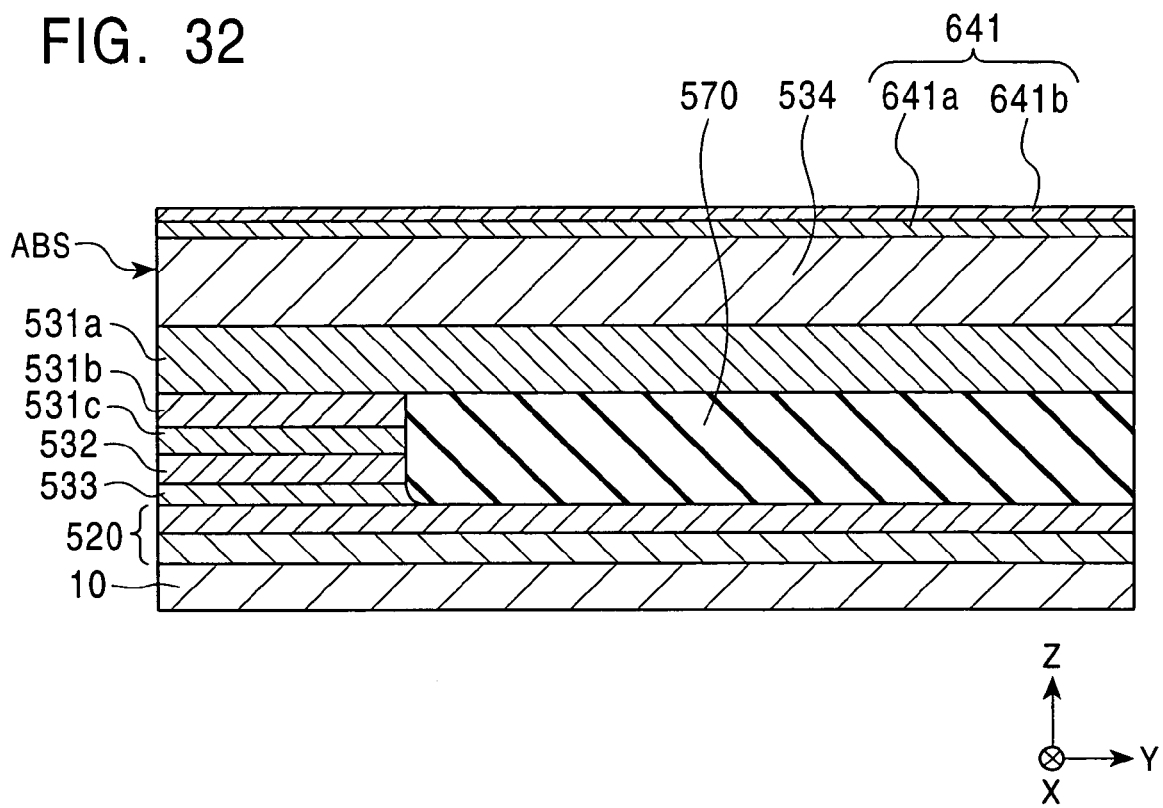
FIG. 32 is a partial sectional view showing a step of a method for manufacturing the CPP giant magnetoresistive head shown in FIGS. 29 to 31, taken along a central line of the element in parallel with the height direction.

Then, the surfaces of the nonmagnetic intermediate layer 531*b* and the backfill gap layer 570 are cleaned by low-energy ion milling or plasma irradiation. After cleaning, as shown in FIG. 32, the first pinned magnetic layer 531*a*, the antiferromagnetic layer 534 and the first nonmagnetic metal film 641 are continuously deposited over the nonmagnetic intermediate layer 531*b* and the backfill gap layer 570. The first nonmagnetic metal film 641 functions as a stopper in a subsequent RIE step. The first nonmagnetic metal film 641 is formed in a two-layer structure comprising a Cr film 641*a* and a Ta film 641*b*.

Figure 33:
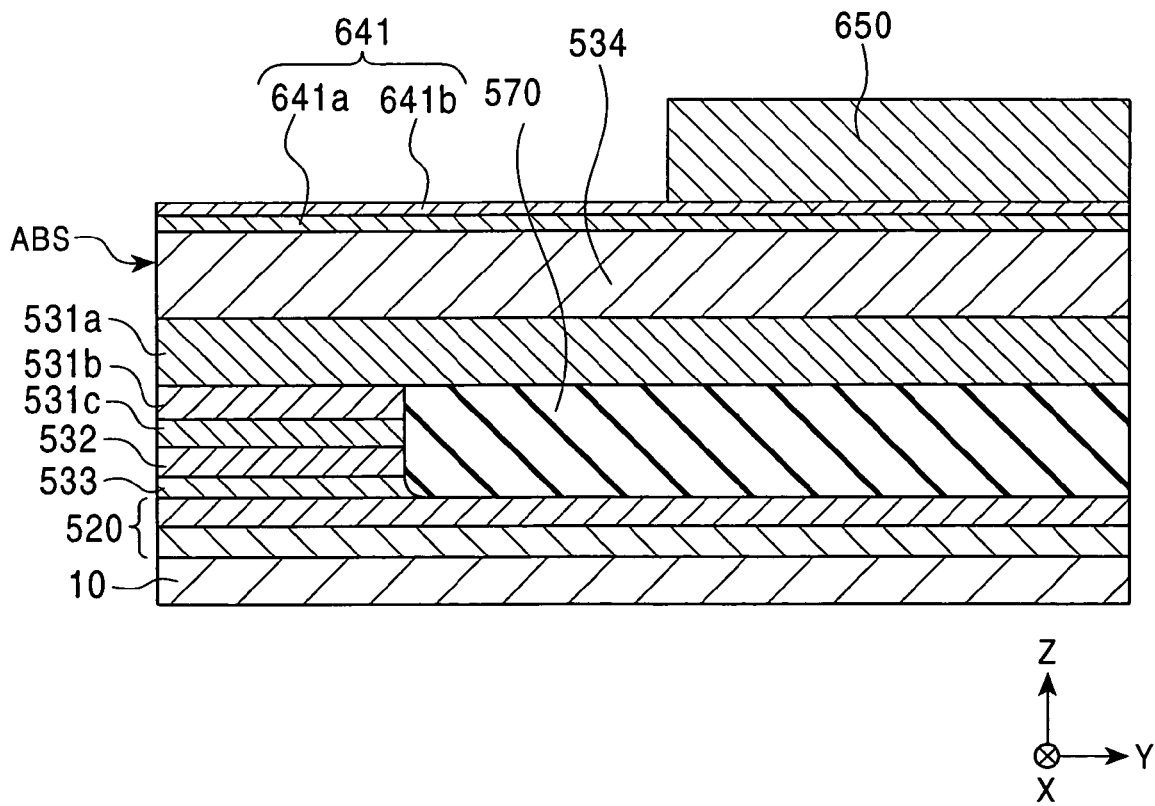
FIG. 33 is a partial sectional view showing a step after the step shown in FIG. 32, taken along a central line of the element in parallel with the height direction.

Then, a resist layer having an aperture for forming the antiferromagnetic layer 534 is formed on the first nonmagnetic metal film 641, and the metal mask layer 650 is formed. Then, unnecessary portions of the metal mask layer 650 and the resist layer are removed by liftoff. As a result, as shown in FIG. 33, the metal mask 650 is formed in a region where the antiferromagnetic layer 534 is formed. The metal mask layer 650 can be formed by using, for example, Cr.

Figure 34:
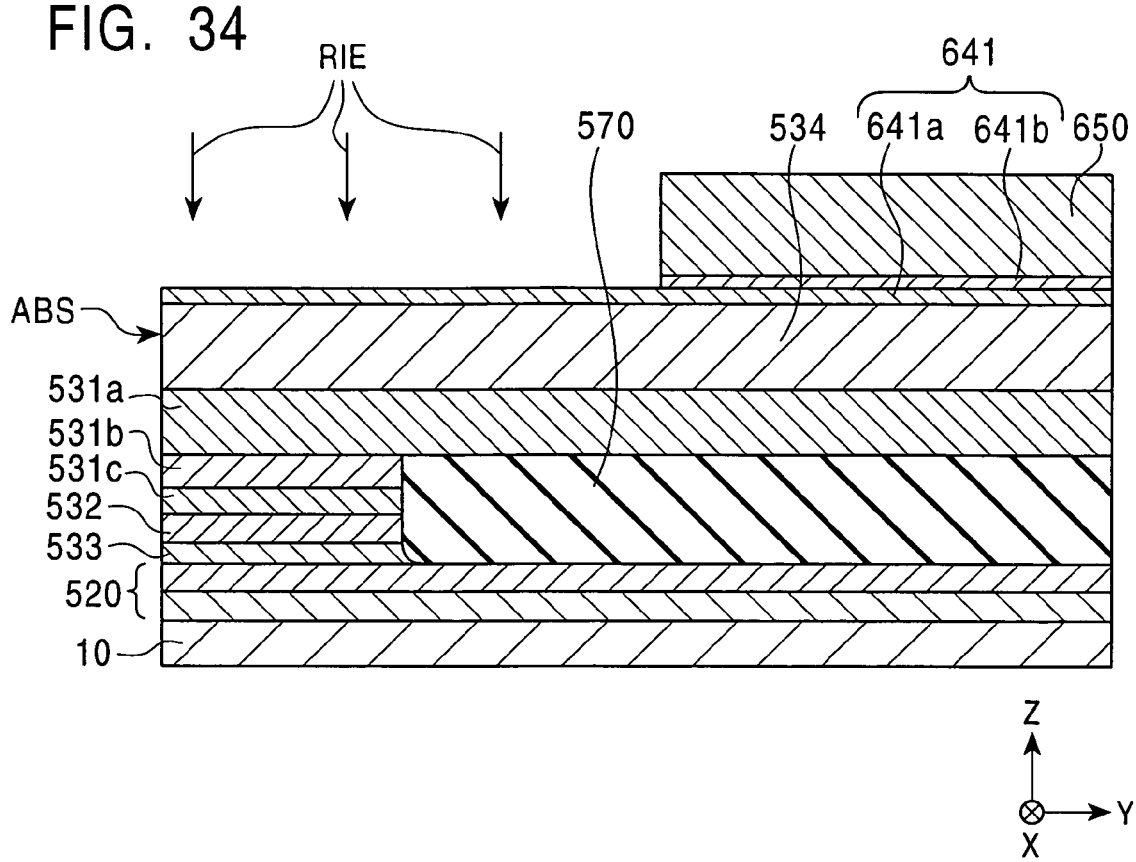
FIG. 34 is a partial sectional view showing a step after the step shown in FIG. 33, taken along a central line of the element in parallel with the height direction.

After the metal mask layer 650 is formed, the exposed portion of the Ta film 641*b* is removed by RIE, as shown in FIG. 34. As an etching gas, $CF_4$, $C_3F_8$, a mixed gas of Ar and $CF_4$, or a mixed gas of Ar and $C_3F_8$ is used. RIE is stopped when the Cr film 641*a* of the first nonmagnetic metal film 641 is exposed. In the RIE steps, the Ta film 641*b* of the first nonmagnetic metal film 641 is left only below the metal mask layer 650.

Figure 35:
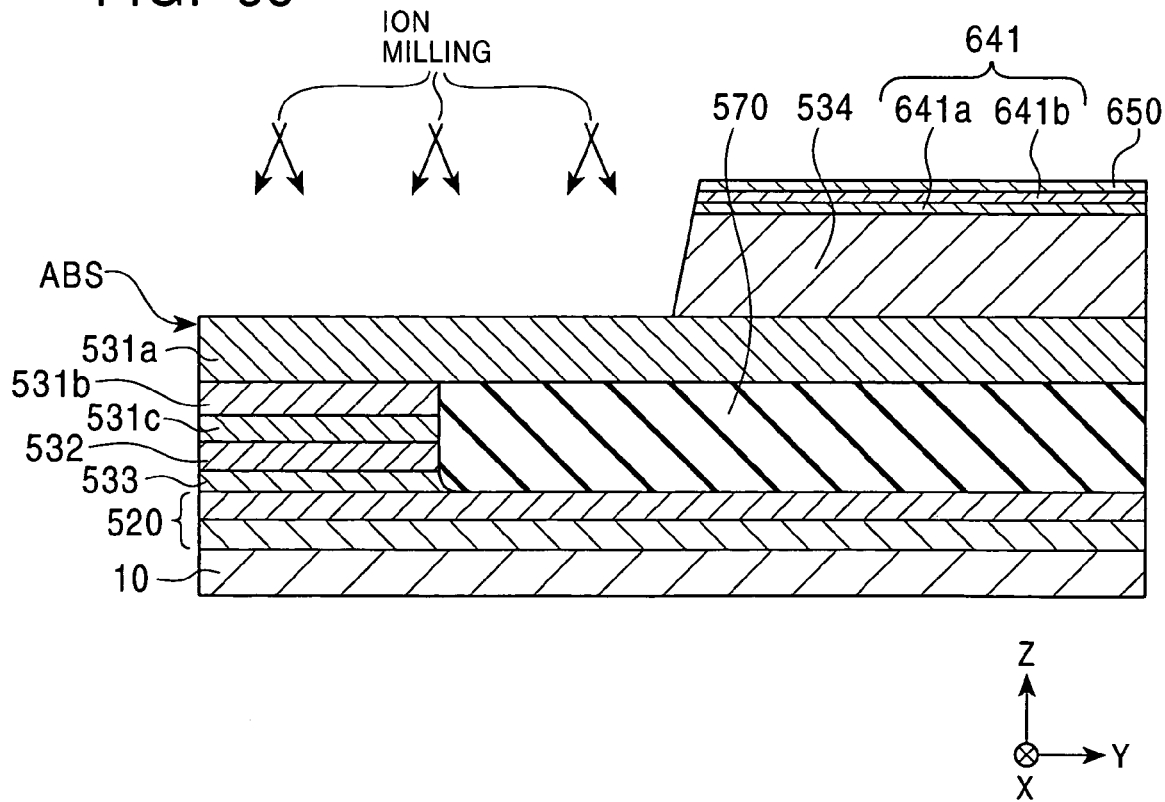
FIG. 35 is a partial sectional view showing a step after the step shown in FIG. 34, taken along a central line of the element in parallel with the height direction.

Then, as shown in FIG. 35, unnecessary portions of the antiferromagnetic layer 534 are removed by ion milling using, as a mask, the metal mask layer 650 present in the region where the antiferromagnetic layer 534 is formed, and the Ta film 641*b* of the first nonmagnetic metal film 641. The ion milling step is stopped when the upper surface of the first pinned magnetic layer 531*a* is exposed or when a part of the first pinned magnetic layer 531*a* is removed. In this step, the metal mask layer 650 used as the mask is also removed, and thus the Ta film 641*b* and the Cr film 641*a* of the first nonmagnetic metal film 641, and a part of the metal mask layer 650 are left on the upper surface of the antiferromagnetic layer 534. The metal mask layer 650 and the Ta film 641*b* may be completely removed to leave only the Cr film 641*a* on the antiferromagnetic layer 534. In this embodiment, the first pinned magnetic layer 641, and a part of the metal mask layer 650 are left on the upper surface of the antiferromagnetic layer 534.

After ion milling, the second nonmagnetic metal film 642 is deposited on the exposed portion of the first pinned magnetic layer and the metal mask layer 650 or on the first nonmagnetic metal film 641 to cover the antiferromagnetic layer 534. The second nonmagnetic metal film 642 comprises the same magnetic material as that for forming the upper nonmagnetic metal film 540 of the fifth embodiment.

Then, annealing is then performed in a magnetic field in antiparallel to the height direction to produce an exchange coupling magnetic field between the antiferromagnetic layer 534 and the first pinned magnetic layer 531*a*. For example, the annealing temperature is about 270° C., and the magnitude of the applied magnetic field is about 800 kA/m. In the annealing in the magnetic field, the magnetization direction of the first pinned magnetic layer 531*a* is pinned in antiparallel to the height direction, and the magnetization direction of the second pinned magnetic layer 531*c* is pinned in the height direction. In FIG. 29, the magnetization direction of each of the first and second pinned magnetic layers 531*a* and 531*c* is shown by an arrow.

The magnetic field annealing may be performed after the track width dimension of the GMR element 530 to be formed is determined.

After annealing, a resist layer is formed on the second upper nonmagnetic metal film 642, for determining the track width dimension Tw of the GMR element 530 to be formed, and portions of the second upper nonmagnetic metal film 642, the first pinned magnetic layer 531*a*, the nonmagnetic intermediate layer 531*b*, the second pinned magnetic layer 531*c*, the nonmagnetic layer 532, the free magnetic layer 533 and the lower nonmagnetic metal film 520, which are not covered with the resist layer, are removed by ion milling. In this step, the lower nonmagnetic metal film 520, the GMR element 530 ranging from the first pinned magnetic layer 331*a* to the free magnetic layer 333, and the second upper nonmagnetic metal film 642 are left on the lower shield layer 101 at the substantially center thereof in the track width direction. Since the substances removed by ion milling partially re-adhere to both sides of the GMR element 530, the re-adhering substances are preferably removed by milling again.

Then, in the state in which the resist layer remains, the first insulating layers 61, the bias underlying layers 62, the hard bias layers 63, and the second insulating layers 64 are continuously deposited on both sides of the GMR element 530. These layers are deposited by sputtering. In sputtering deposition, the angle of sputtered particles is preferably about 90 degrees with the lower shield layer 10. After sputtering deposition, the resist layer is removed by liftoff.

After the resist layer is removed, as a pre-treatment for forming the upper shield layer, the upper surfaces of the second upper nonmagnetic metal film 642 and the second insulating layers 64 are planarized by, for example, CMP or ion milling, and the upper shield layer 50 is deposited on the planarized surfaces of the second upper nonmagnetic metal film 642 and the second insulating layers 64. The CPP-GMR head 601 shown in FIGS. 29 to 31 is completed by the above-described steps.

In the sixth embodiment, the same effect as in the fifth embodiment can be obtained.

Figure 36:
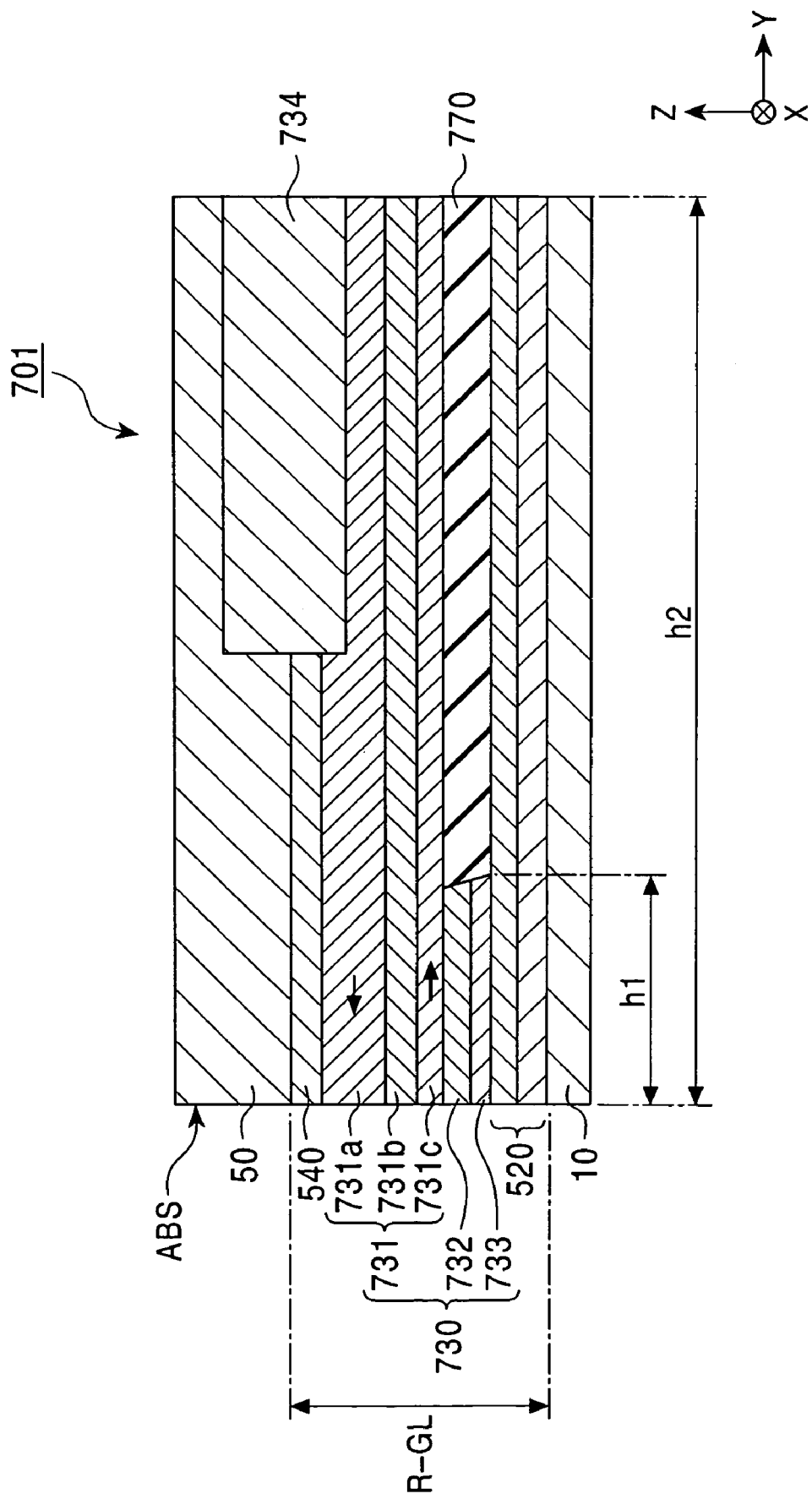
FIG. 36 is a partial sectional view showing the structure of a CPP giant magnetoresistive head according to a seventh embodiment of the present invention, taken along a central line of an element.
Figure 37:
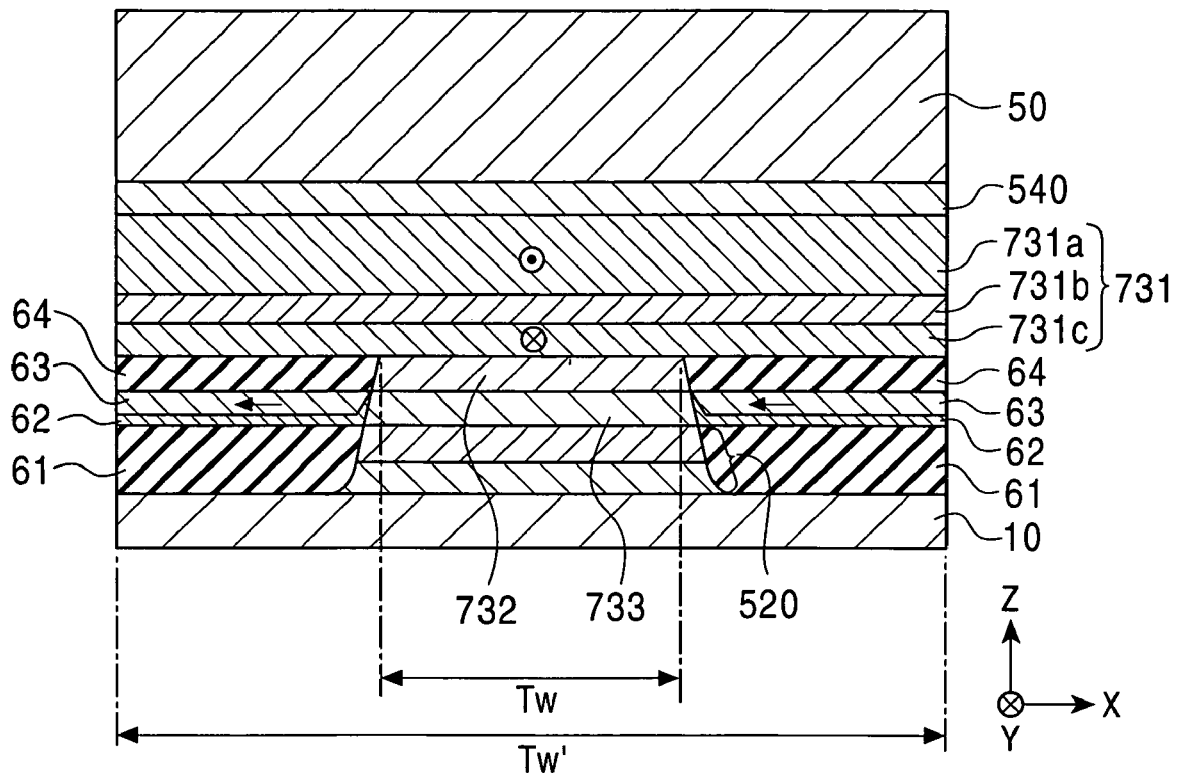
FIG. 37 is a partial sectional view showing the structure of the CPP giant magnetoresistive head shown in FIG. 36, as viewed from a surface facing a recording medium.
Figure 38:
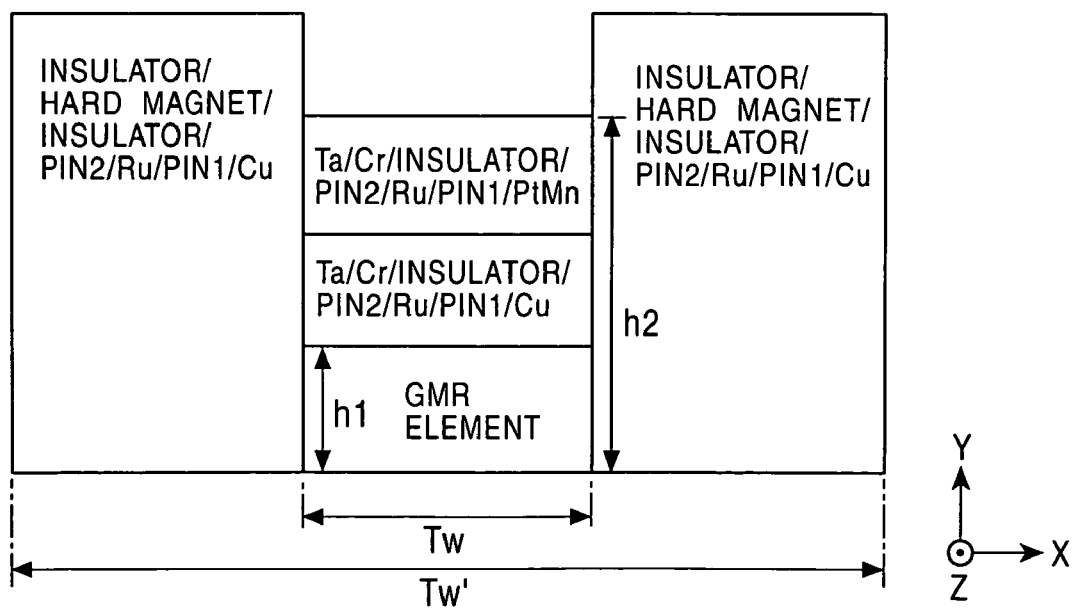
FIG. 38 is a schematic top plan view showing the GMR element shown in FIG. 36.

FIGS. 36 to 38 show a CPP giant magnetoresistive head (CPP-GMR heat) according to the seventh embodiment of the present invention.

The seventh embodiment is different from the fifth and sixth embodiments in that not only a first pinned magnetic layer but also the whole of a pinned magnetic layer (the first pinned magnetic layer, a nonmagnetic intermediate layer, and a second pinned magnetic layer) extends beyond the GMR element portion (a free magnetic layer and a nonmagnetic layer) in the track width direction and in the height direction. The seventh embodiment is the same as the fifth and sixth embodiments in the point that an antiferromagnetic layer is provided in contact with the upper surface of a rear portion of the first pinned magnetic layer extending in the height direction.

FIG. 36 is a partial sectional view showing the structure of a CPP-GMR head 701, taken along a central line of the element, FIG. 37 is a partial sectional view showing the structure of the CPP-GMR head 701, as viewed from a surface facing a recording medium, and FIG. 38 is a schematic top plan view of the GMR element. In FIGS. 36 to 38, the functions, materials and thicknesses of layers denoted by the same reference numerals as those in the fifth embodiment shown in FIGS. 26 to 28 are the same as those in the fifth embodiment.

In the GMR head 730, a free magnetic layer 733, a nonmagnetic layer 732, a second pinned magnetic layer 731c, a nonmagnetic intermediate layer 731b and a first pinned magnetic layer 731a are laminated in that order from below. The free magnetic layer 733, the nonmagnetic layer 732, the second pinned magnetic layer 731c, the nonmagnetic intermediate layer 731b and the first pinned magnetic layer 731a correspond to the free magnetic layer 533, the nonmagnetic layer 532, the second pinned magnetic layer 531c, the nonmagnetic intermediate layer 531b and the first pinned magnetic layer 531a, respectively, in the fifth embodiment. The materials and thicknesses of these layers are the same as those in the fifth embodiment.

As described above, the second pinned magnetic layer 731c, the nonmagnetic intermediate layer 731b and the first pinned magnetic layer 731a extend beyond the GMR element portion (the free magnetic layer 733 and the nonmagnetic layer 732) in the track width direction and in the height direction. Therefore, a coupling magnetic field is produced between the first pinned magnetic layer 731a and the second pinned magnetic layer 731c due to a RKKY interaction through the nonmagnetic intermediate layer 731b even in a region outside the GMR element portion. Thus, magnetization of the second pinned magnetic layer 731c can be strongly pinned to more strongly pin the pinned magnetic layer 731, as compared with the fifth embodiment in which only the first pinned magnetic layer 531a extends.

Like in the fifth embodiment, an antiferromagnetic layer 734 produces an exchange coupling magnetic field at the interface with the first pinned magnetic layer 731a, and magnetization of the first pinned magnetic layer 731a is pinned in antiparallel to the height direction by the exchange coupling magnetic field. Magnetization of the second pinned magnetic layer 731c is pinned in the height direction because the magnetization is antiparallel to magnetization of the first pinned magnetic layer 731a due to the RKKY interaction through the nonmagnetic intermediate layer 731b.

The second pinned magnetic layer 731c, the nonmagnetic intermediate layer 731b and the first pinned magnetic layer 731a have a height dimension h2 larger than the track width dimension Tw', and thus magnetization is also stabilized by shape anisotropy in a direction parallel to the height direction.

The CPP-GMR head 701 can be manufactured by the same manufacturing method as that of the fifth embodiment. Specifically, in the first step of depositing some of the layers of the GMR element on the lower shield layer 10, the layers up to the nonmagnetic layer 732 are deposited. Next, the steps from the step of determining the track width dimension of the GMR element 730 to be formed to the step of determining the height dimension h1 of the GMR element 730 to be formed are successively performed in the same method as in the fifth embodiment. In the step of depositing the other layers of the GMR element 730, the second pinned magnetic layer 731c, the nonmagnetic intermediate layer 731b and the first pinned magnetic layer 731a are continuously deposited on the nonmagnetic layer 732, a backfill gap layer 770, and the second insulating layers 640. The steps after the first pinned magnetic layer 731a is deposited are the same as in the fifth embodiment.

As described above, in the seventh embodiment, not only the first pinned magnetic layer 731a but also all of the first pinned magnetic layer 731a, the nonmagnetic intermediate layer 731b and the second pinned magnetic layer 731c extend beyond the GMR element portion (the free magnetic layer 733 and the nonmagnetic layer 732) in the track width direction and in the height direction. Therefore, magnetization coupling between the first pinned magnetic layer 731a and the second pinned magnetic layer 731c due to the RKKY interaction is strengthened to more strongly pin magnetization of the pinned magnetic layer 731, as compared with the fifth and sixth embodiments.

Also, in the seventh embodiment, the second pinned magnetic layer 731c, the nonmagnetic intermediate layer 731b and the first pinned magnetic layer 731a are continuously deposited to prevent contamination of the laminate interfaces with impurities and air. Therefore, deterioration of a coupling magnetic field produced between the first pinned magnetic layer 731a and the second pinned magnetic layer 731c due to the RKKY interaction can be prevented to more strongly pin magnetization of the pinned magnetic layer 731.

Figure 39:
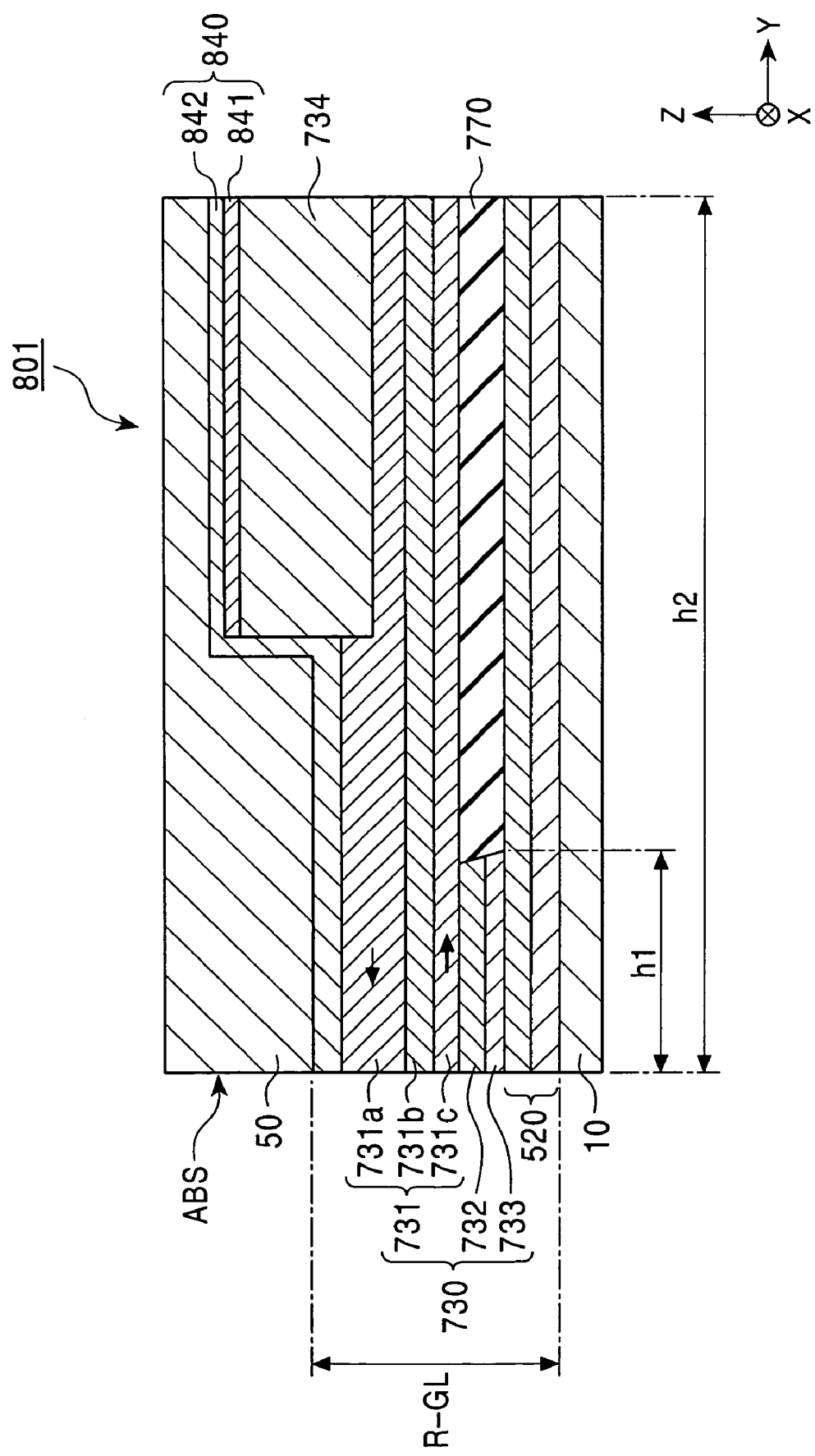
FIG. 39 is a partial sectional view showing the structure of a CPP giant magnetoresistive head according to an eighth embodiment of the present invention, taken along a central line of an element.
Figure 40:
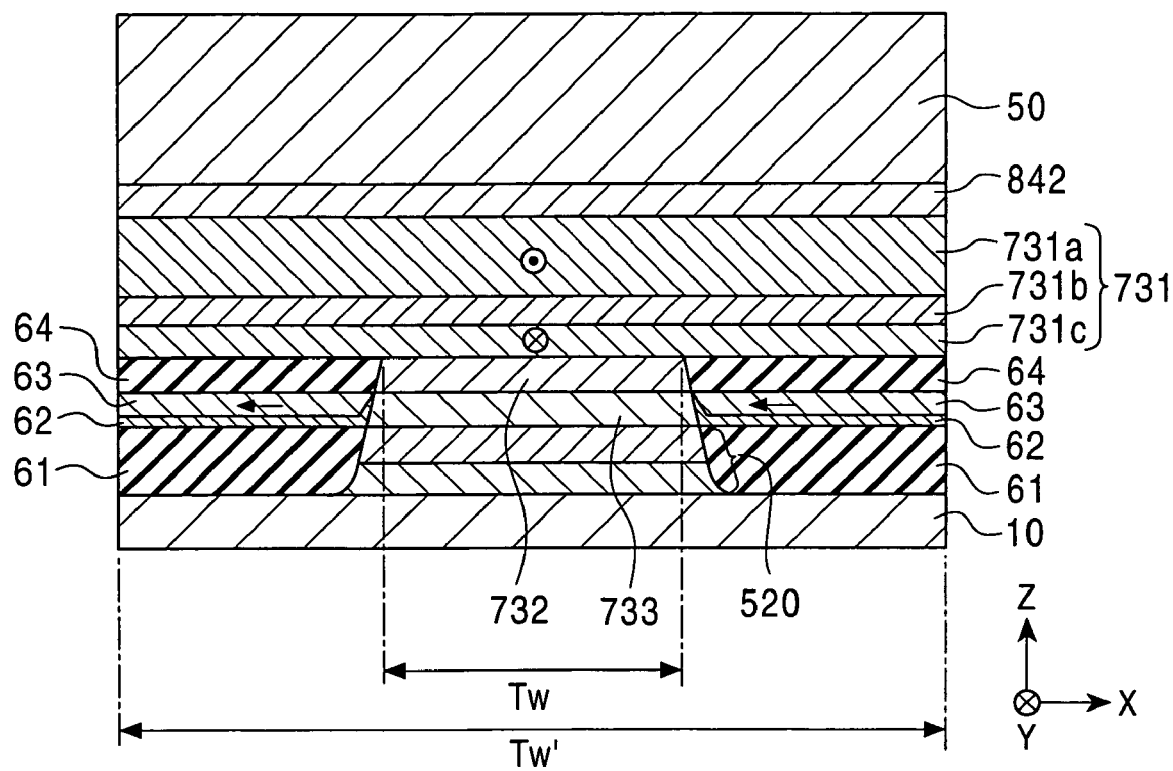
FIG. 40 is a partial sectional view showing the structure of the CPP giant magnetoresistive head shown in FIG. 39, as viewed from a surface facing a recording medium.
Figure 41:
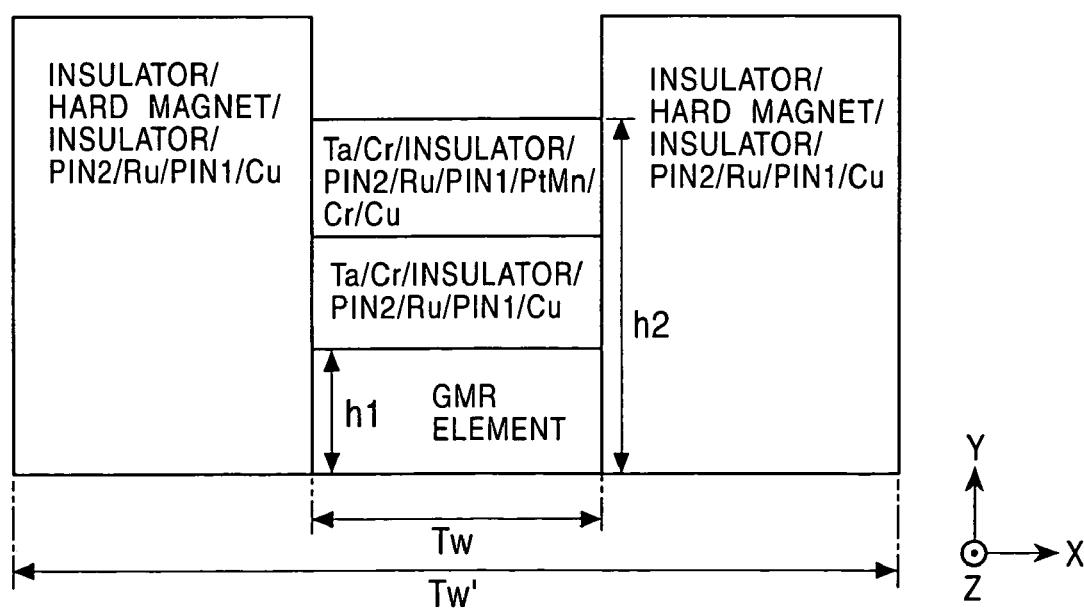
FIG. 41 is a schematic top plan view showing the GMR element shown in FIG. 39.

FIGS. 39 to 41 show a CPP giant magnetoresistive head (CPP-GMR heat) according to the eighth embodiment of the present invention.

Like in the seventh embodiment, in the eighth embodiment, the whole of a pinned magnetic layer extends beyond a GMR element portion in the track width direction and in the height direction, and an antiferromagnetic layer is provided in contact with the upper surface of a rear portion of the first pinned magnetic layer extending in the height direction. However, the production method of the eighth embodiment is different from the seventh embodiment.

FIG. 39 is a partial sectional view showing the structure of a CPP-GMR head 801, taken along a central line of the element, FIG. 40 is a partial sectional view showing the structure of the CPP-GMR head 801, as viewed from a surface facing a recording medium, and FIG. 41 is a schematic top plan view of the GMR element. In FIGS. 39 to 41, the functions, materials and thicknesses of layers denoted by the same reference numerals as those in the seventh embodiment shown in FIGS. 36 to 38 are the same as those in the fifth embodiment.

In the CPP-GMR head 801, an upper nonmagnetic metal film 840 comprises a first nonmagnetic metal film 841 formed to cover the upper surface of the antiferromagnetic layer 734, and a second nonmagnetic metal film 842 formed over the first nonmagnetic metal film 841 and the first pinned magnetic layer 731a. The first nonmagnetic metal film 841 functions as a stopper in RIE (reactive ion etching) performed in the manufacturing process, and comprises Cr. Like in the sixth embodiment, a metal mask layer may be interposed between the first nonmagnetic metal film 841 and the second nonmagnetic metal film 842. The first nonmagnetic metal film 841 and the second nonmagnetic metal film 842 correspond to the first nonmagnetic metal film 641 and the second nonmagnetic metal film 642, respectively, in the sixth embodiment. The materials and thicknesses of the first nonmagnetic metal film 841 and the second nonmagnetic metal film 842 are the same as those in the sixth embodiment. In this embodiment, differences in shape and structure of the upper nonmagnetic metal film 840 from the upper nonmagnetic metal film 740 of the seventh embodiment are caused by a difference between the production methods, and the effect of the upper nonmagnetic metal film is the same as in the seventh embodiment.

The CPP-GMR head 801 can be manufactured by the same manufacturing method as that of the sixth embodiment. Specifically, in the first step of depositing some of the layers of the GMR element on the lower shield layer 10, the layers up to the nonmagnetic layer 732 are continuously deposited. Next, the steps from the step of determining the height dimension h1 of the GMR element 730 to be formed to the step of cleaning the surfaces by low-energy ion beam etching are successively performed by the same method as in the sixth embodiment. In the step of depositing the other layers of the GMR element, the second pinned magnetic layer 731c, the nonmagnetic intermediate layer 731b and the first pinned magnetic layer 731a are continuously deposited on the nonmagnetic layer 732 and a backfill gap layer 770. The steps after the deposition of the first pinned magnetic layer 731a are the same as in the sixth embodiment.

In the eighth embodiment, the same effect as in the seventh embodiment can be obtained.

Figure 42:
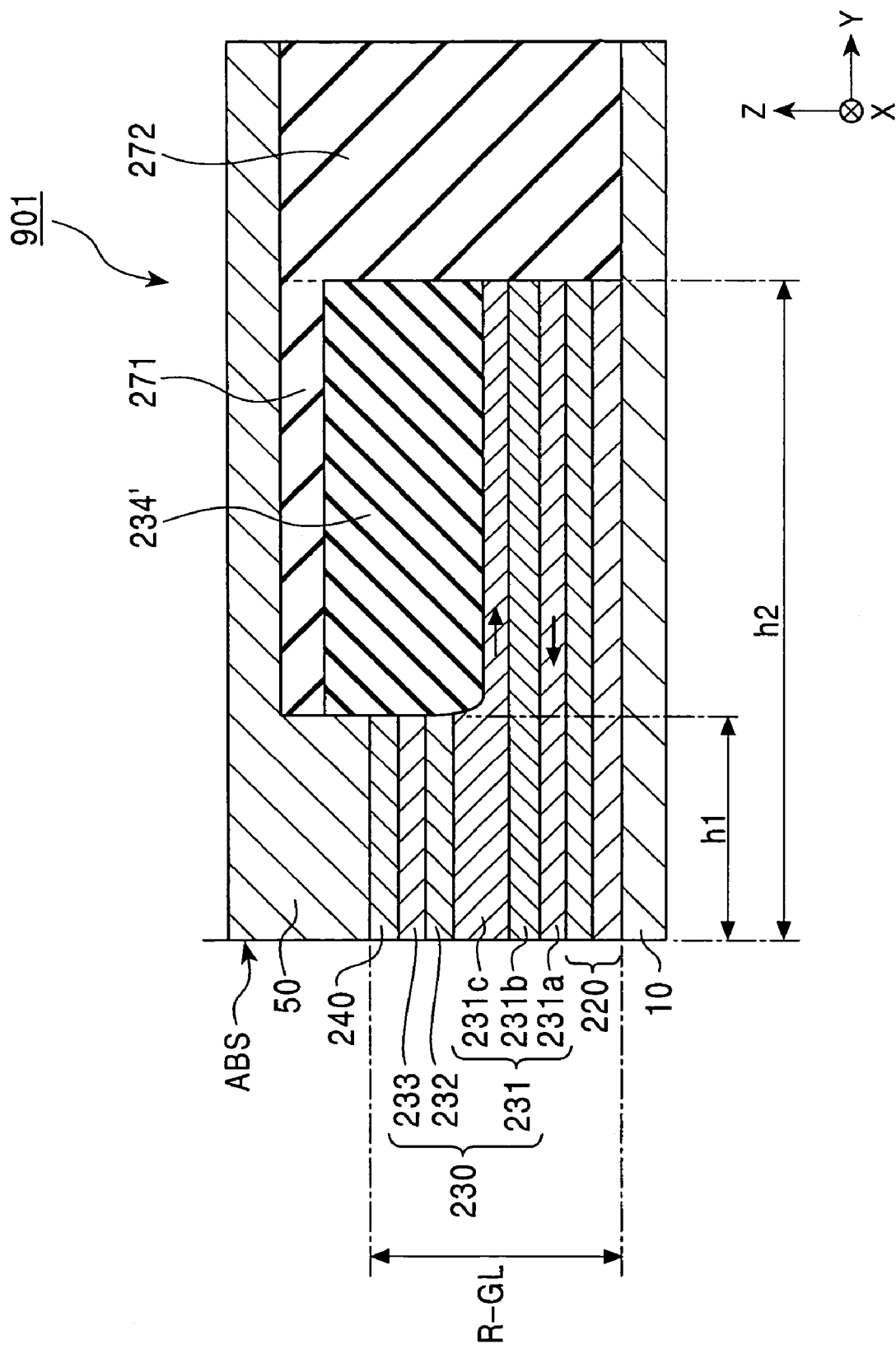
FIG. 42 is a partial sectional view showing the structure of a CPP giant magnetoresistive head according to a ninth embodiment of the present invention, taken along a central line of an element.

FIG. 42 shows a CPP giant magnetoresistive head (CPP-GMR head) according to a ninth embodiment of the present invention. In a CPP-GMR head 901 of this embodiment, the antiferromagnetic layer 234 and the first backfill gap layer 271 of the CPP-GMR head 201 of the second embodiment are replaced by an insulating antiferromagnetic layer 234'. The insulating antiferromagnetic layer 234' comprises, for example, Ni—O or $\alpha$-Fe$_2$O$_3$. Since no sensing current flows through the insulating antiferromagnetic layer 234', a loss of the sensing current can be suppressed to improve output. The ninth embodiment is the same as the second embodiment except that the insulating antiferromagnetic layer 234' is provided, and the same components as in the second embodiment shown in FIG. 6 are denoted by the same reference numerals as in the second embodiment.

The CPP-GMR head 901 can be manufactured by the same manufacturing method as that of the second embodiment except that in forming the antiferromagnetic layer 234 and the first backfill gap layer 271, the insulating antiferromagnetic layer 234' comprising Ni—O or $\alpha$-Fe$_2$O$_3$ is formed in place of the antiferromagnetic layer 234 and the first backfill gap layer 271.

Figure 43:
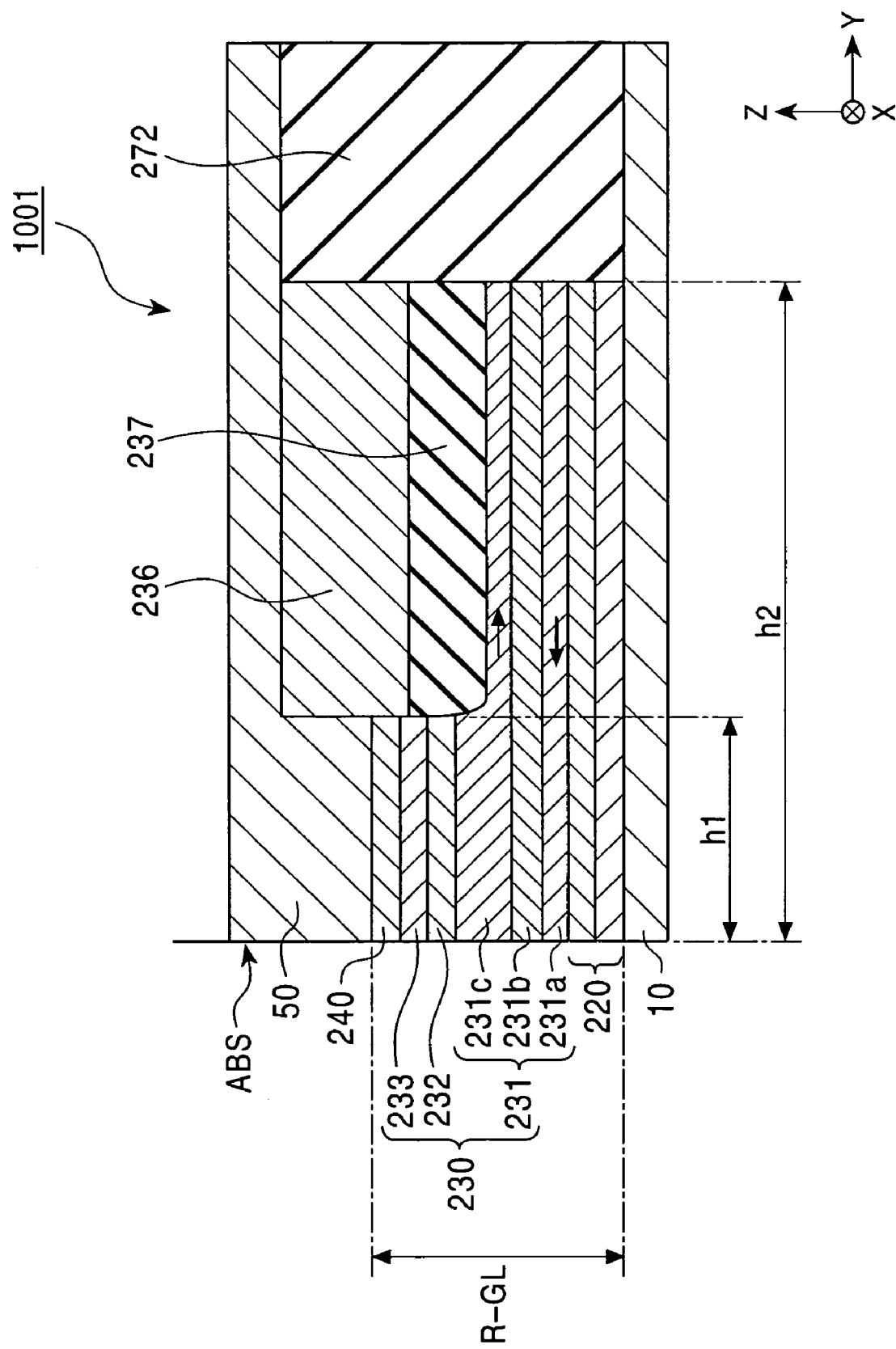
FIG. 43 is a partial sectional view showing the structure of a CPP giant magnetoresistive head according to a tenth embodiment of the present invention, taken along a central line of an element.

FIG. 43 shows a CPP giant magnetoresistive head (CPP-GMR head) according to a tenth embodiment of the present invention. In a CPP-GMR head 1001 of this embodiment, the antiferromagnetic layer 234 and the first backfill gap layer 271 of the CPP-GMR head 201 of the second embodiment are replaced by an antiferromagnetic metal layer 236 in contact with the upper surface of the second pinned magnetic layer 231c and an insulating antiferromagnetic layer 237 laminated on the antiferromagnetic metal layer 236. In this way, when the antiferromagnetic metal layer 236 and the insulating antiferromagnetic layer 237 are laminated, adhesion between the second pinned magnetic layer 231c and the insulating antiferromagnetic layer 237 is improved through the antiferromagnetic metal layer 236 to obtain a great exchange coupling magnetic field. Also, a loss of the sensing current can be suppressed by the insulating antiferromagnetic layer 237 to improve output. The insulating antiferromagnetic layer 237 comprises Ni—O or $\alpha$-Fe$_2$O$_3$, and the antiferromagnetic metal layer 236 comprises the same antiferromagnetic material as the antiferromagnetic layer 34, for example, Pt—Mn, Ir—Mn, or the like.

The CPP-GMR head 1001 can be manufactured by the same manufacturing method as that of the second embodiment except that in forming the antiferromagnetic layer 234 and the first backfill gap layer 271, the antiferromagnetic metal layer 236 and the insulating antiferromagnetic layer 237 are laminated in place of the antiferromagnetic layer 234 and the first backfill gap layer 271.

FIGS. 44 to 48 show a CPP giant magnetoresistive head (CPP-GMR head) according to an eleventh embodiment of the present invention.

In the eleventh embodiment, in the CPP-GMR head 701 of the seventh embodiment, the antiferromagnetic layer 734 is not provided, and an insulating antiferromagnetic layer 1134 is provided in contact with the lower surface of a second pinned magnetic layer in place of the backfill gap layer 770.

Figure 44:
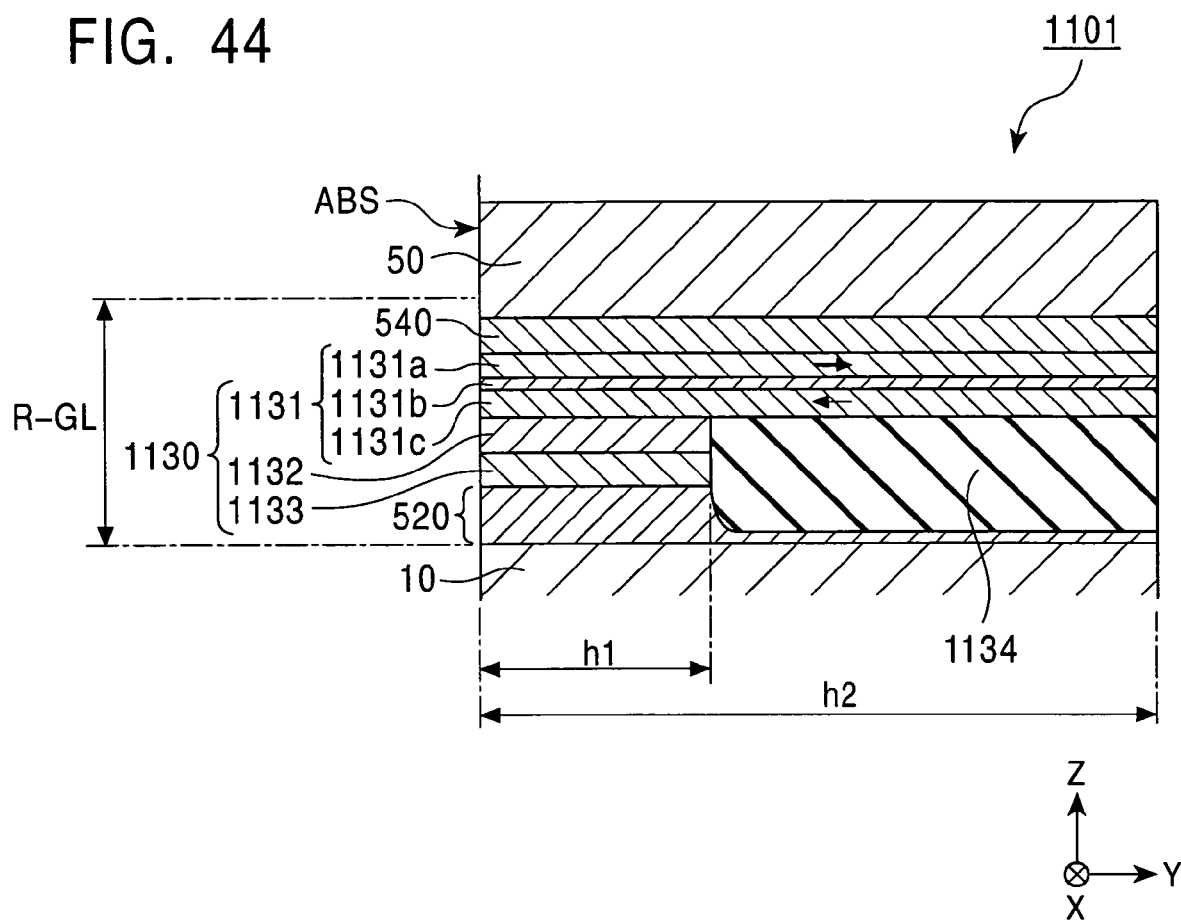
FIG. 44 is a partial sectional view showing the structure of a CPP giant magnetoresistive head according to an eleventh embodiment of the present invention, taken along a central line of an element.
Figure 45:
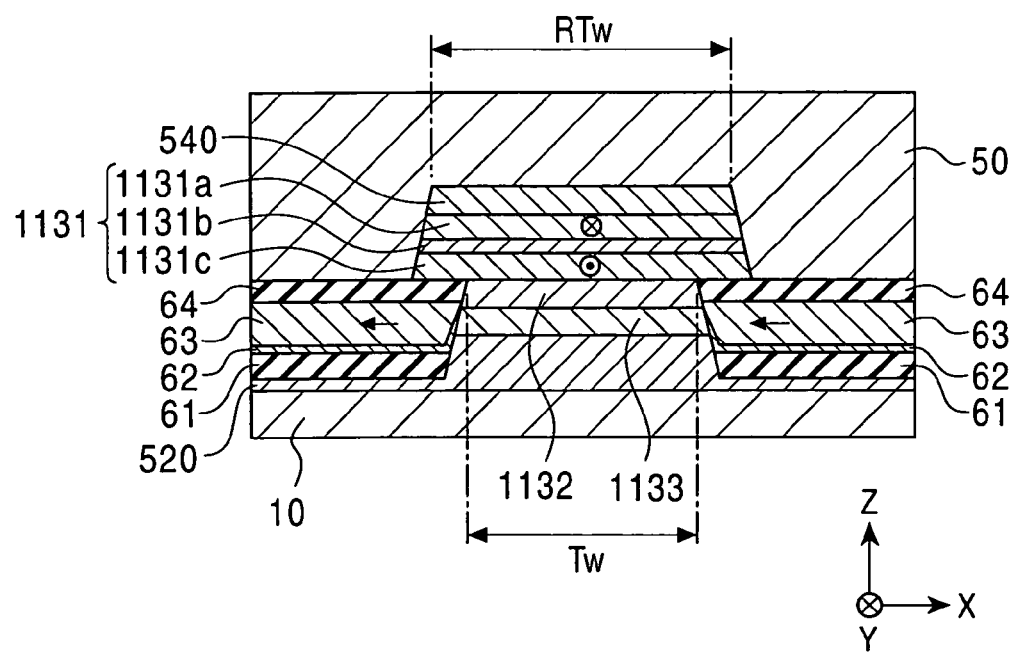
FIG. 45 is a partial sectional view showing the structure of the CPP giant magnetoresistive head shown in FIG. 44, as viewed from a surface facing a recording medium.
Figure 46:
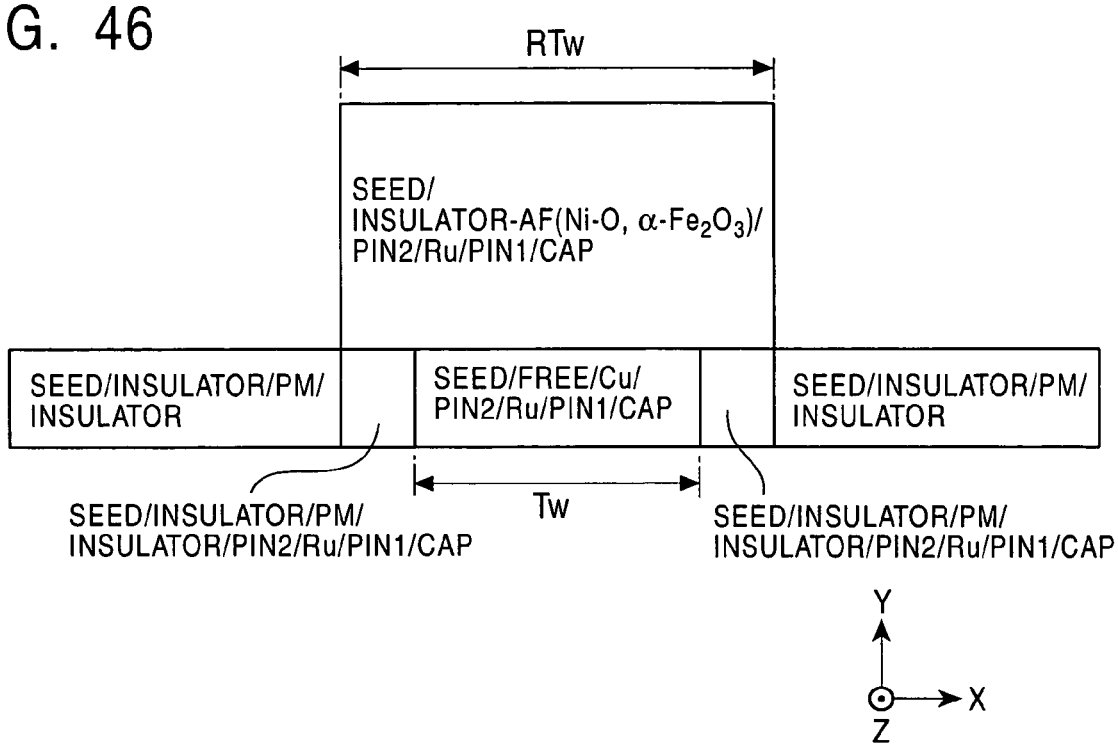
FIG. 46 is a schematic top plan view showing the GMR element shown in FIG. 44.

FIG. 44 is a partial sectional view showing the structure of the CPP-GMR head 1101, taken along a central line of an element, FIG. 45 is a partial sectional view showing the structure of the CPP-GMR head 1101, as viewed from a surface facing a recording medium, and FIG. 46 is a schematic top plan view of a GMR element. In FIGS. 44 to 46, the functions, materials and thicknesses of layers denoted by the same reference numerals as those in the seventh embodiment shown in FIGS. 36 to 38 are the same as those in the seventh embodiment.

The CPP-GMR head 1101 comprises a GMR element 1130 exhibiting the GMR effect when a sensing current is passed through an upper shield layer 50 and a lower shield layer 10 in the thickness direction. In the GMR element 1130, a lower nonmagnetic metal film 520, a free magnetic layer 1133, a nonmagnetic layer 1132, a pinned magnetic layer 1131 (a second pinned magnetic layer 1131c, a nonmagnetic intermediate layer 1131b and a first pinned magnetic layer 1131a), an upper nonmagnetic metal film 540 are laminated in that order from below. The shapes, thicknesses and materials of the nonmagnetic layer 1132 and the free magnetic layer 1133 are the same as those of the nonmagnetic layer 732 and the free magnetic layer 733, respectively, in the seventh embodiment. In the lower nonmagnetic metal film 520, a portion in the GMR element 1130 has a larger thickness, and a portion outside the element has a smaller thickness. The upper nonmagnetic metal film 540 is formed in substantially the same area as the pinned magnetic layer 1131 to cover the upper surface of the pinned magnetic layer 1131.

The pinned magnetic layer 1131 extends to the rear of the nonmagnetic layer 1132 and the free magnetic layer 1133 in the height direction, and is in contact with the rear portion of the insulating antiferromagnetic layer 1134 in the height direction. In this embodiment, in consideration of alignment between the nonmagnetic layer 1132 and the free magnetic layer 1133, the pinned magnetic layer 1131 also extends in the track width direction beyond the nonmagnetic layer 1132 and the free magnetic layer 1133. Namely, the track width dimension RTw and the height dimension h2 of the pinned magnetic layer 1131 are larger than the track width dimension Tw and the height dimension h1 of the GMR element 1131. Also, the length of the pinned magnetic layer 1131 in the height direction is larger than that in the track width direction, and thus the magnetization direction of the pinned magnetic layer 1131 is stabilized by shape anisotropy in a direction parallel to the height direction. The magnetization direction of the second pinned magnetic layer 1131c of the pinned magnetic layer 1131 is pinned in antiparallel to the height direction by an exchange coupling magnetic field produced at the interface with the insulating antiferromagnetic layer 1134. The second pinned magnetic layer 1131c and the first pinned magnetic layer 1131a have antiparallel magnetizations due to the RKKY interaction through the nonmagnetic intermediate layer 1131b. Therefore, magnetization of the first pinned magnetic layer 1131a is pinned in the height direction. In this embodiment, the magnetic moment per unit area (saturation magnetization×Ms thickness t) of the first pinned magnetic layer 1131a is larger than that of the second pinned magnetic layer 1131c, and thus the magnetization direction of the whole pinned magnetic layer 1131 is the same as that of the first pinned magnetic layer 1131a. In FIG. 44, the magnetization direction of the first pinned magnetic layer 1131a is shown by a bold arrow, and the magnetization direction of the second pinned magnetic layer 1131c is shown by a thin arrow.

The insulating antiferromagnetic layer 1134 comprises, for example, Ni—O or α-$Fe_2O_3$. Since no sensing current flows through the insulating antiferromagnetic layer 1134, the sensing current flowing through the GMR element 1130 does not flow into the insulating antiferromagnetic layer 1134 even when the insulating antiferromagnetic layer 1134 is provided in the rear of the nonmagnetic layer 1132 and the free magnetic layer 1133 and in contact with the lower surface of the second pinned magnetic layer 1131c. Also, a loss of the sensing current is not increased, and the heat generation from the insulating antiferromagnetic layer 1134 can be avoided to suppress the generation of Joule heat.

Figure 47:
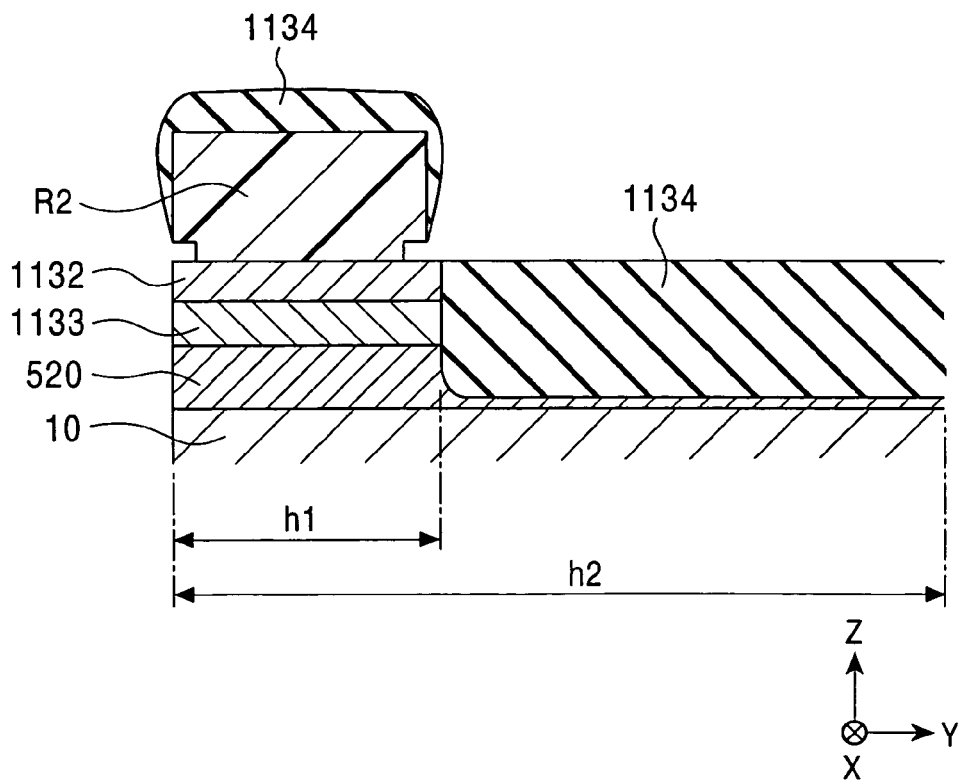
FIG. 47 is a partial sectional view showing a step of a method for manufacturing the CPP giant magnetoresistive head shown in FIGS. 44 to 46, taken along a central line of the element in parallel with the height direction.
Figure 48A:
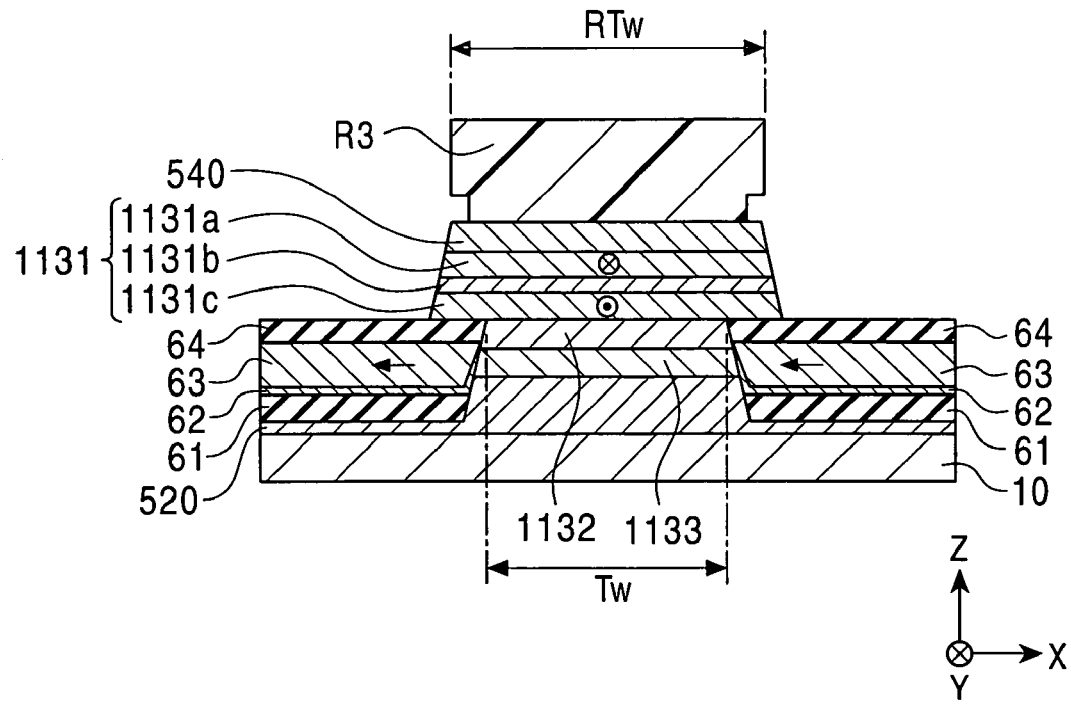
Figure 48B:
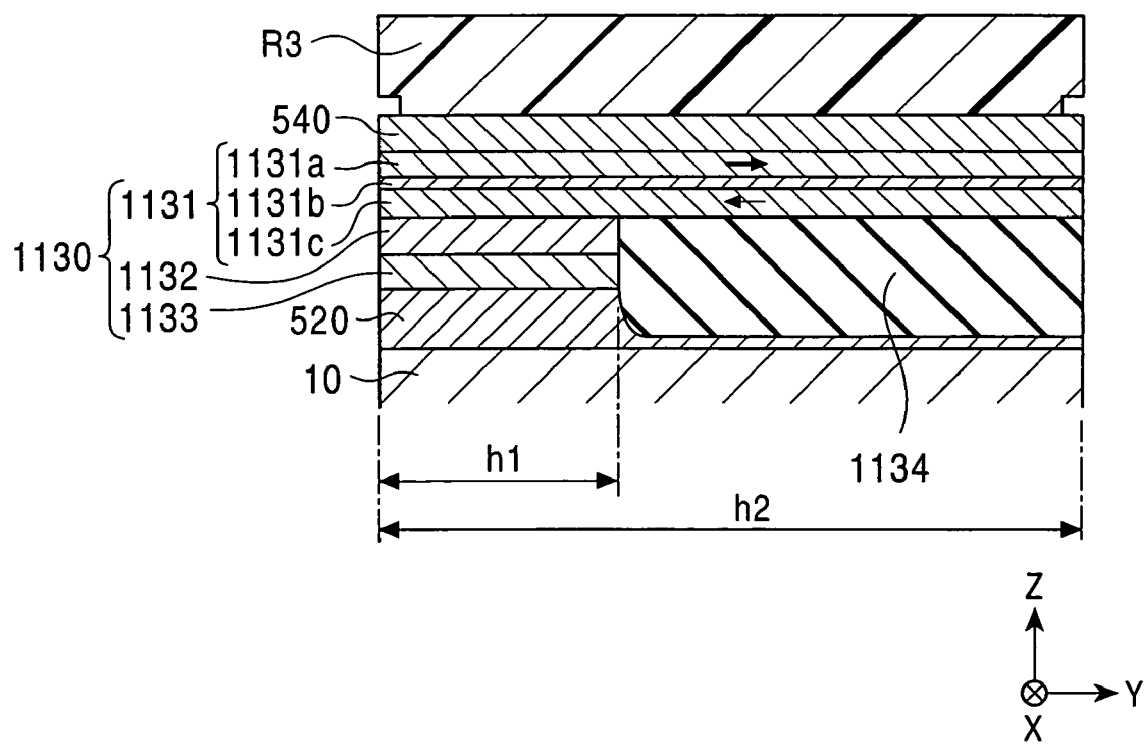

Next, a method for manufacturing the CPP-GMR head 1101 shown in FIGS. 44 to 46 according to an embodiment of the present invention will be described below with reference to FIGS. 47 and 48. FIGS. 47 and 48B are partial sectional views showing a step for manufacturing the CPP-GMR head 1101, taken along a central line of the element in parallel with the height direction, and FIG. 48A is a partial sectional view showing the same step, as viewed from a surface facing a recording medium. The material and thickness of each layer are the same as those of the completed CPP-GMR head 1101.

First, the lower shield layer 10, the lower nonmagnetic metal film 520, the free magnetic layer 1133, and the nonmagnetic layer 1132 are continuously deposited in a solid form in that order from below in vacuum. Next, a liftoff resist layer is formed on the nonmagnetic layer 1132, for determining the track width dimension Tw of the GMR element 1130 to be formed. After the resist layer is formed, potions of the nonmagnetic layer 1132, the free magnetic layer 1133 and a portion of the lower nonmagnetic metal film 520, which are not covered with the resist layer, are removed by ion milling. In this step, the lower nonmagnetic metal film 520 has a central portion having a larger thickness than that of both sides in the track width direction, and the free magnetic layer 1133 and the nonmagnetic layer 1132 are left in a substantially trapezoidal shape on the central portion. The dimensions of the free magnetic layer 1133 and the nonmagnetic layer 1132 in the track width direction are equal to the track width dimension Tw of the GMR element 1130 since the substances removed by ion milling partially re-adhere to both sides of the lower nonmagnetic metal film 520, the free magnetic layer 1133 and the nonmagnetic layer 1132, the re-adhering substances are preferably removed by milling again.

Then, in the state in which the resist layer remains, the first insulating layers 61, the bias underlying layers 62, the hard bias layers 63, and the second insulating layers 64 are continuously deposited by sputtering on both sides of the lower nonmagnetic metal film 520. In sputtering deposition, the angle of sputtered particles is preferably about 90 degrees with the lower nonmagnetic metal film 520. After sputtering deposition, the resist layer is removed by liftoff.

Then, as shown in FIG. 47, a resist layer R2 is formed on the nonmagnetic layer 1132, for determining the height dimension h1 of the GMR element 1130 to be formed. Then, portions of the nonmagnetic layer 1132, the free magnetic layer 1133, and a portion of the lower nonmagnetic metal film 520, which are not covered with the resist layer R2, are removed by ion milling, for example, and the insulating antiferromagnetic layer 1134 is formed in the removed portion. In this ion milling step, the nonmagnetic layer 1132 and the free magnetic layer 1133 are left only in the element portion used as the GMR element 1130. The rear end surfaces of the nonmagnetic layer 1132 and the free magnetic layer 1133 in the height direction are smoothly continued. After the formation of the insulating antiferromagnetic layer 1134, the resist layer R2 is removed.

Then, the second pinned magnetic layer 1131c, the nonmagnetic intermediate layer 1131b, the first pinned magnetic layer 1131a, and the upper nonmagnetic metal film 540 are continuously deposited in turn on the insulating antiferromagnetic layer 1134, the nonmagnetic layer 1132 and the second insulating layer 62. As shown in FIG. 48, a resist layer R3 is then formed on the upper nonmagnetic metal film 540, for determining the track width dimension RTw of the pinned magnetic layer 1131, and portions of the cap layer 1136, the first pinned magnetic layer 1131a, the nonmagnetic intermediate layer 1131b and the second pinned magnetic layer 1131c, which are not covered with the resist layer R3, are removed by, for example, ion milling. Then, the resist layer R3 is removed. In this step, the pinned magnetic layer 1131 (the second pinned magnetic layer 1131c, the nonmagnetic intermediate layer 1131b, and the first pinned magnetic layer 1131a) and the upper nonmagnetic metal film 540, which have larger dimensions than those of the nonmagnetic layer 1132 in the track width direction and in the height direction, are left on the nonmagnetic layer 1132 to form the GMR element 1130. The second insulating layers 64 are exposed on both sides of the pinned magnetic layer 1131 and the upper nonmagnetic metal film 540 in the track width direction. In this embodiment, in order to achieve alignment between the free magnetic layer 1133, the nonmagnetic layer 1132 and the pinned magnetic layer 1131, the dimension RTw of the pinned magnetic layer 1131 in the track width direction is set to be longer than the track width dimension Tw of the GMR element 1130.

Then, annealing is performed in a magnetic field in the height direction to produce an exchange coupling magnetic field at the interface between the insulating antiferromagnetic layer 1134 and the second pinned magnetic layer 1131c. For example, the annealing temperature is about 270° C., and the magnitude of the applied magnetic field is about 800 kA/m. In the annealing in the magnetic field, the magnetization direction of the second pinned magnetic layer 1131c is pinned in antiparallel to the height direction, and the magnetization direction of the first pinned magnetic layer 1131a is pinned in the height direction.

After annealing, the upper shield layer 50 is deposited by sputtering over the exposed second insulating layers 64 and upper nonmagnetic metal film 540 to cover the exposed surfaces of the pinned magnetic layer 1131 and the upper nonmagnetic metal film 540.

The CPP-GMR head 1101 shown in FIGS. 44 to 46 is completed by the above-described steps.

In each of the ninth to eleventh embodiments, magnetization of the pinned magnetic layer 231, 731 or 1131 can be strongly pinned, and the sensing current density can be increased to increase output. Even when the sensing current flows, the antiferromagnetic layer 234 or 734 or the insulating antiferromagnetic layer 1131 does not generate heat to suppress an increase in the element temperature, thereby improving reliability. Furthermore, the shield distance R-GL at the surface facing the recording medium can be narrowed to increase resolution, as compared with the conventional head shown in FIG. 55.

Like in the ninth to eleventh embodiments, in the third to eighth embodiments, the insulating antiferromagnetic layer can be used in place of the antiferromagnetic layer. Like in the fifth to eighth embodiments, when the insulating antiferromagnetic layer is provided on the top of the pinned magnetic layer, a greater exchange coupling magnetic field can be obtained by providing the antiferromagnetic metal layer between the pinned magnetic layer and the insulating antiferromagnetic layer. Although the insulating antiferromagnetic layer is liable to have a higher blocking temperature than that of the antiferromagnetic metal film, the use of the insulating antiferromagnetic causes no problem because the insulating antiferromagnetic layer is disposed outside the GMR element to avoid an excessive increase in temperature.

Figure 49:
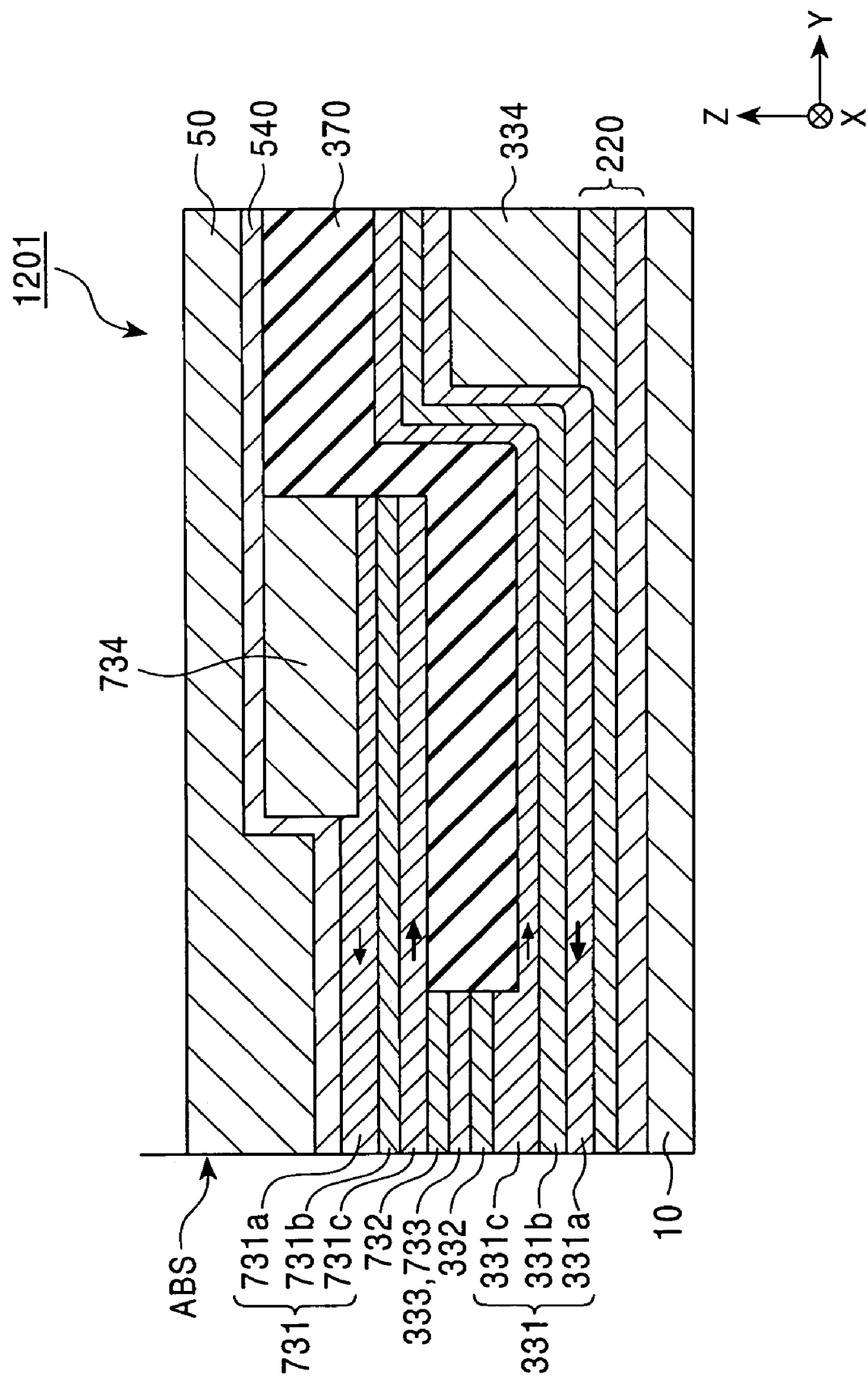
FIG. 49 is a partial sectional view showing the structure of a CPP giant magnetoresistive head according to a twelfth embodiment of the present invention, taken along a central line of an element.
Figures 50, 51:
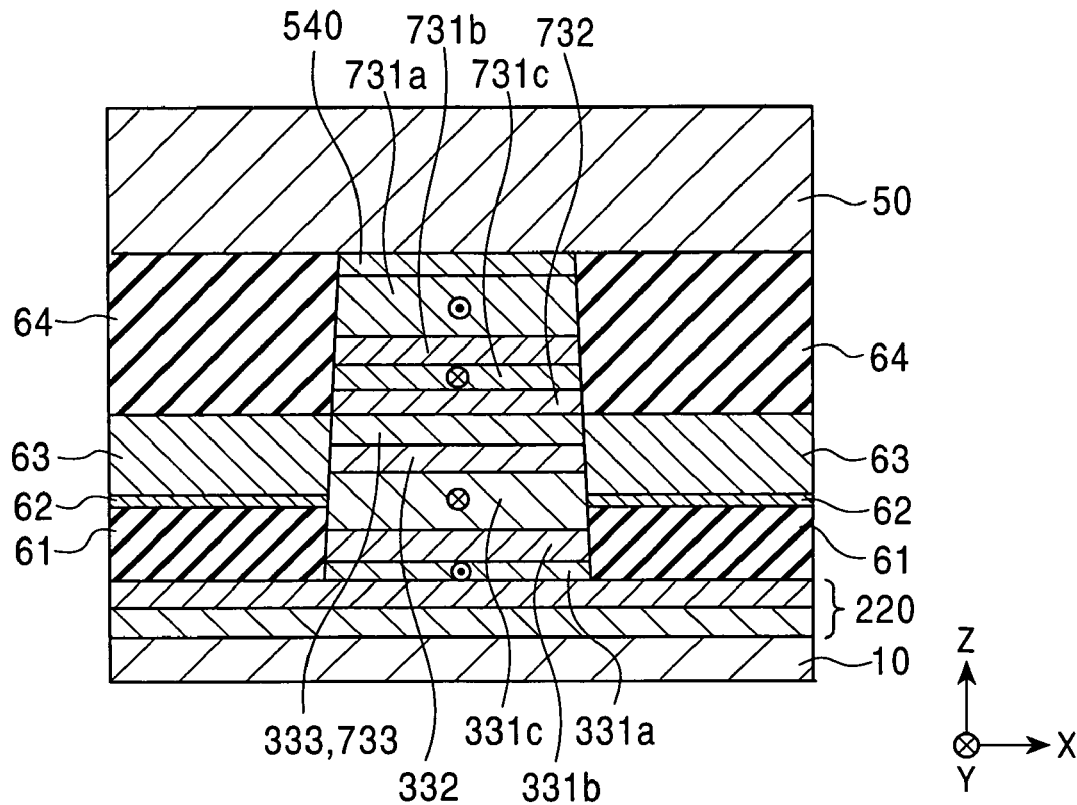
FIG. 50 is a partial sectional view showing the structure of the CPP giant magnetoresistive head shown in FIG. 49, as viewed from a surface facing a recording medium.
FIG. 51 is a schematic top plan view showing the GMR element shown in FIG. 49.

FIGS. 49 to 51 show a CPP giant magnetoresistive head (CPP-GMR head) according to a twelfth embodiment of the present invention.

Unlike in the first to eleventh embodiments, in the twelfth embodiment, the present invention is applied to a dual spin-valve CPP-GMR head, not a single spin-valve type.

FIG. 49 is a partial sectional view showing the structure of a CPP-GMR head 1201, taken along a central line of an element, FIG. 50 is a partial sectional view showing the structure of the CPP-GMR head 1201, as viewed from a surface facing a recording medium, and FIG. 51 is a schematic top plan view of a GMR element.

The CPP-GMR head 1201 is a dual spin-valve type having a laminated structure in which the structure of the third embodiment shown in FIGS. 14 to 16 and the structure of the seventh embodiment shown in FIGS. 36 to 38 are laminated. In FIGS. 49 to 51, the functions, shapes, materials and thicknesses of layers denoted by the same reference numerals as those in the third embodiment shown in FIGS. 14 to 16 and the seventh embodiment shown in FIGS. 36 to 38 are the same as those in the third embodiment and the seventh embodiment. Since each of the layers of the CPP-GMR head 1201 is described above in the third embodiment shown in FIGS. 14 to 16 and the seventh embodiment shown in FIGS. 36 to 38, the description thereof is omitted. Although, in this embodiment, the upper nonmagnetic metal film 540 extends to the antiferromagnetic layer 734 and the backfill gap layer 770, the upper nonmagnetic metal film 540 has the same effect.

The CPP-GMR head 1201 can be manufactured by forming the layers ranging from the lower nonmagnetic metal film 220 to the backfill gap layer 770 on the lower shield layer 10 by the same production method as that of the third embodiment, and then forming the layers ranging from the second pinned magnetic layer 731c to the upper shield layer 50 by the same production method as that of the seventh embodiment.

In the CPP-GMR head 1201, in order to prevent a sensing current loss, the antiferromagnetic layer 334 in contact with the upper surface of the upper first pinned magnetic layer 731a preferably comprises an insulating antiferromagnetic layer. When the antiferromagnetic layer 334 comprises an insulating antiferromagnetic layer, the antiferromagnetic layer 734 in contact with the lower surface of the lower first pinned magnetic layer 331a can be formed by using an antiferromagnetic metal layer.

Figure 52:
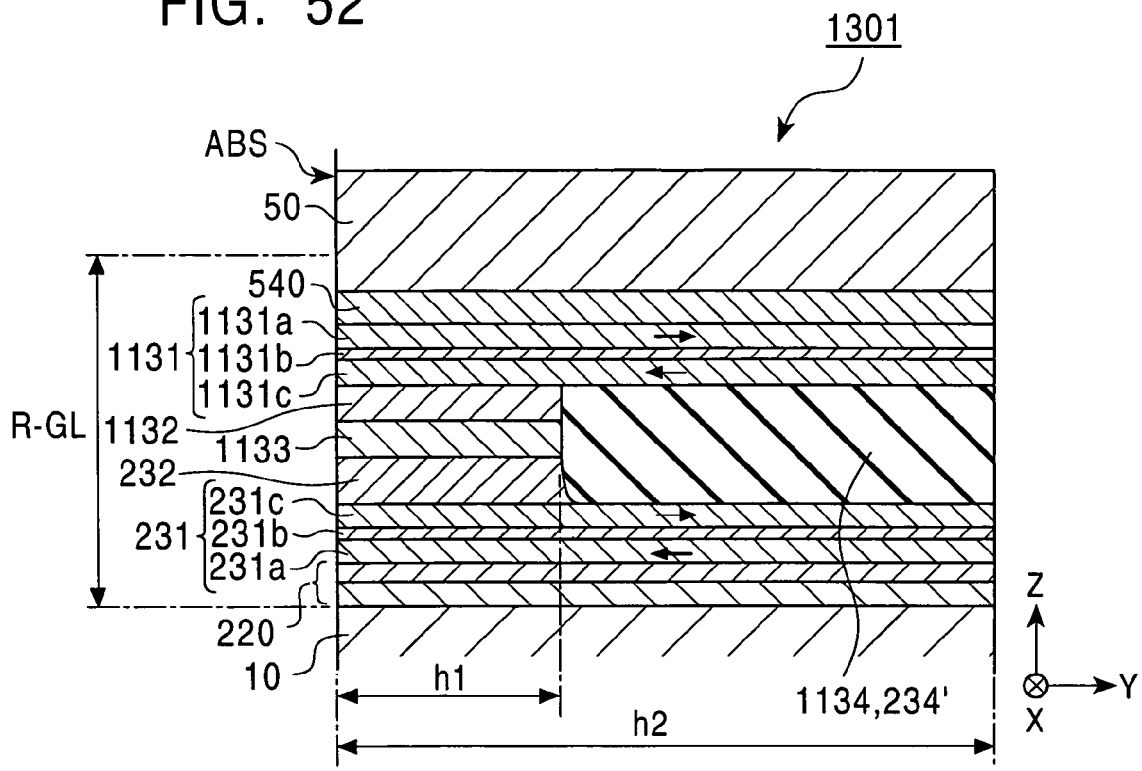
FIG. 52 is a partial sectional view showing the structure of a CPP giant magnetoresistive head according to a thirteenth embodiment of the present invention, taken along a central line of an element.
Figure 53:
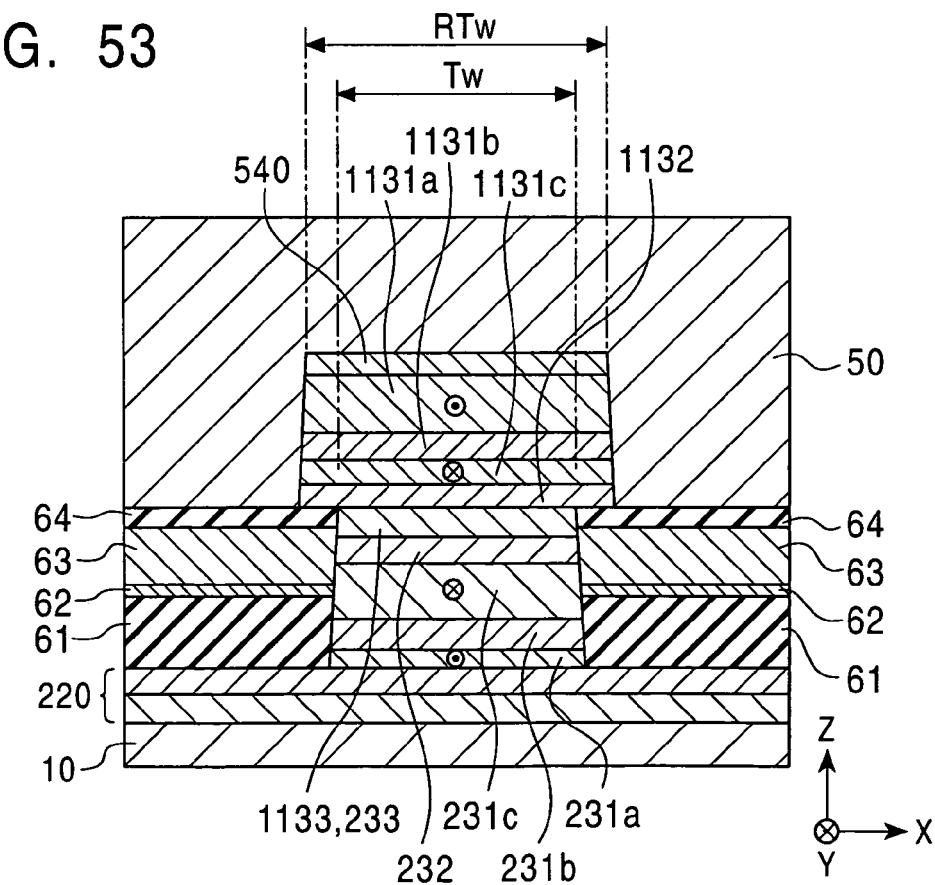
FIG. 53 is a partial sectional view showing the structure of the CPP giant magnetoresistive head shown in FIG. 52, as viewed from a surface facing a recording medium.
Figure 54:
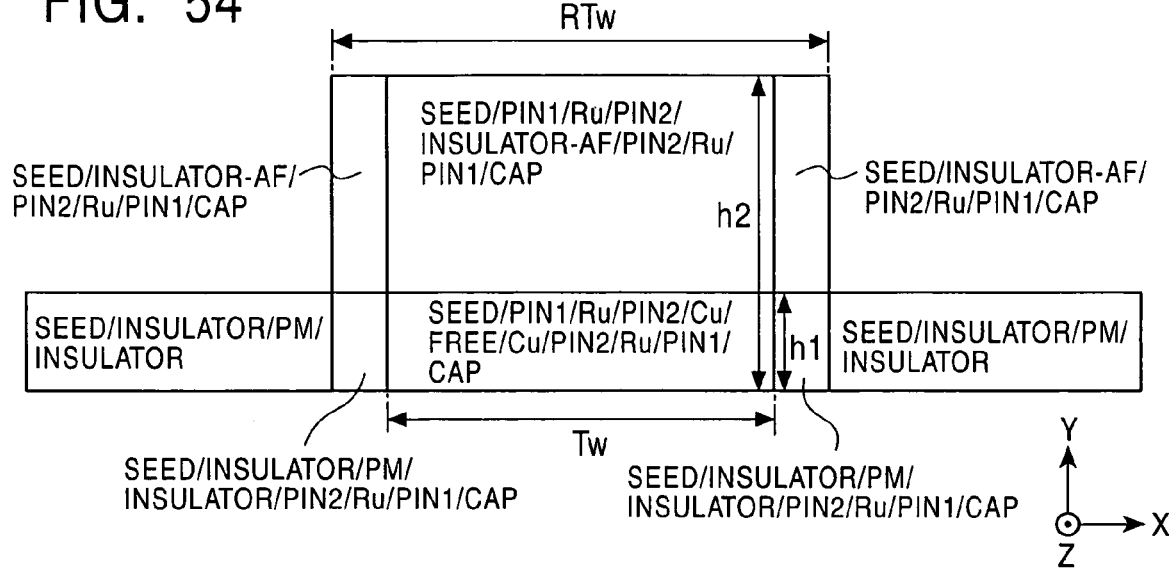
FIG. 54 is a schematic top plan view showing the GMR element shown in FIG. 52.

FIGS. 52 to 54 show a CPP giant magnetoresistive head (CPP-GMR head) according to a thirteenth embodiment of the present invention.

FIG. 52 is a partial sectional view showing the structure of a CPP-GMR head 1301, taken along a central line of an element, FIG. 53 is a partial sectional view showing the structure of the CPP-GMR head 1301, as viewed from a surface facing a recording medium, and FIG. 54 is a schematic top plan view of a GMR element.

The CPP-GMR head 1301 is a dual spin-valve type having a laminated structure in which the structure of the ninth embodiment shown in FIG. 42 and the structure of the eleventh embodiment shown in FIGS. 44 to 46 are laminated. In FIGS. 52 to 54, the functions, shapes, materials and thicknesses of layers denoted by the same reference numerals as those in FIGS. 42 and 44 to 46 are the same as those in the ninth embodiment and the eleventh embodiment. Since each of the layers of the CPP-GMR head 1301 is described above in the ninth embodiment and the eleventh embodiment, the description thereof is omitted.

The CPP-GMR head 1301 can be manufactured by forming the layers ranging from the lower nonmagnetic metal film 220 to the free magnetic layer 233 on the lower shield layer 10 by the same production method as that of the ninth embodiment, and then forming the layers ranging from the upper nonmagnetic layer 732 to the upper shield layer 50 by the same production method as that of the eleventh embodiment.

In the CPP-GMR head 1301, an antiferromagnetic metal layer in contact with the lower pinned magnetic layer 231 and an insulating antiferromagnetic layer in contact with the upper pinned magnetic layer 731 can be provided in place of the antiferromagnetic 234' in contact with the rear portions of the lower pinned magnetic layer 231 and the upper pinned magnetic layer 731 in the rear of the free magnetic layer 233 and the nonmagnetic layers 232 and 732 in the height direction. In this embodiment, coupling between the insulating antiferromagnetic layer and the lower pinned magnetic layer can be improved while suppressing a sensing current loss.

In each of the twelfth and thirteenth embodiments, magnetization of the pinned magnetic layers 231 and 731 can be strongly pinned, and the sensing current density can be increased to increase output. Even when the sensing current flows, the antiferromagnetic layers 234 and 734 do not generate heat to suppress an increase in the element temperature, thereby improving reliability. Furthermore, the shield distance R-GL at the surface facing the recording medium can be narrowed to increase resolution, as compared with the conventional heat shown in FIG. 55.

The CPP-GMR head of each of the above embodiments can be applied not only to a reproducing thin film magnetic head but also to a recording thin film magnetic head comprising a recording inductive head laminated on the reproducing thin film magnetic head.

What is claimed is:

1. A CPP giant magnetoresistive head comprising: lower and upper shield layers with a predetermined shield distance therebetween; and
   a giant magnetoresistive element comprising a pinned magnetic layer, a free magnetic layer, and a nonmagnetic layer interposed between the pinned magnetic layer and the free magnetic layer, which are disposed between the upper and lower shield layers, a current flowing perpendicularly to the film plane of the giant magnetoresistive element;
   wherein a height direction is defined as the direction of leakage magnetic field from a recording medium and is perpendicular to the track width direction and the lamination direction of the layers comprising the giant magnetoresistive element;
   wherein the pinned magnetic layer possesses a portion exposed at the surface facing the recording medium and a rear portion extending in the height direction beyond at least one other layer comprising the giant magnetoresistive element;
   wherein an antiferromagnetic layer is provided in the rear of the giant magnetoresistive element in a height direction, for pinning the magnetization direction of the pinned magnetic layer in the height direction;
   wherein the antiferromagnetic layer is in contact with the upper surface or the lower surface of the rear portion of the pinned magnetic layer extending in the height direction to produce an exchange coupling magnetic field at the interface with the upper or lower surface, so that the magnetization direction of the pinned magnetic layer is pinned by the exchange coupling magnetic field; and
   wherein the antiferromagnetic layer is not exposed at the surface facing the recording medium.

2. The CPP giant magnetoresistive head according to claim 1, wherein the length of the pinned magnetic layer in the height direction is larger than that in the track width direction.

3. The CPP giant magnetoresistive head according to claim 1, wherein the pinned magnetic layer comprises a magnetic material having a positive magnetostriction constant and is exposed at a surface facing a recording medium.

4. The CPP giant magnetoresistive head according to claim 1;
   wherein the pinned magnetic layer is formed in a laminated ferrimagnetic structure comprising first and second pinned magnetic layers which are laminated with a nonmagnetic intermediate layer provided therebetween;
   the nonmagnetic layer and the free magnetic layer are formed on the second pinned magnetic layer;
   each of the first pinned magnetic layer, the nonmagnetic intermediate layer and the second pinned magnetic layer extends to the rear of the nonmagnetic layer and the free magnetic layer in the height direction; and
   the antiferromagnetic layer is formed in contact with the upper surface of the rear portion of the second pinned magnetic layer which extends in the height direction.

5. The CPP giant magnetoresistive head according to claim 4, further comprising nonmagnetic metal films interposed between the lower shield layer and the first pinned magnetic layer and between the free magnetic layer and the upper shield layer.

6. The CPP giant magnetoresistive head according to claim 5, wherein each of the nonmagnetic metal films comprises a nonmagnetic metallic material containing at least one element selected from Au, Ag, Cu, Ru, Rh, Ir, Pd, Ni—Cr, (Ni—Fe)—Cr, and Cr, and when the nonmagnetic metallic material contains Cr, the Cr content exceeds 20 atomic percent.

7. The CPP giant magnetoresistive head according to claim 5, wherein the nonmagnetic metal film interposed between the lower shield layer and the first pinned magnetic layer comprises any one of Ta/Cu, Ta/Ru/Cu, Ta/Cr, Ta/Ni—Cr, Ta/(Ni—Fe)—Cr, and Cr, and when the nonmagnetic metallic material contains Cr, the Cr content exceeds 20 atomic percent.

8. The CPP giant magnetoresistive head according to claim 4, wherein part or entirety of the second pinned magnetic layer comprises Fe—Co—Cu (wherein Fe>10 atomic percent, Co>30 atomic percent, and Cu >5 atomic percent), Fe—Co—Cu—X (wherein X is at least one element of Pt, Pd, Mn, Si, Au, and Ag), or $Co_2MnY$ (wherein Y is at least one element of Ge, Si, Sn, and Al).

9. The CPP giant magnetoresistive head according to claim 4, wherein part or entirety of the free magnetic layer comprises Fe—Co—Cu (wherein Fe >10 atomic percent, Co>30 atomic percent, and Cu>5 atomic percent), Fe—Co—Cu—X (wherein X is at least one element of Pt, Pd, Mn, Si, Au, and Ag), or $Co_2MnY$ (wherein Y is at least one element of Ge, Si, Sn, and Al).

10. The CPP giant magnetoresistive head according to claim 4, further comprising an insulating layer interposed between the antiferromagnetic layer and the upper shield layer.

11. The CPP giant magnetoresistive head according to claim 1, wherein the antiferromagnetic layer is an insulating antiferromagnetic layer.

12. The CPP giant magnetoresistive head according to claim 6, wherein the antiferromagnetic layer comprises an antiferromagnetic metal layer in contact with the upper surface of the second pinned magnetic layer and an insulating antiferromagnetic layer laminated on the antiferromagnetic metal layer.

13. The CPP giant magnetoresistive head according to claim 11, wherein the insulating antiferromagnetic layer comprises Ni—O or $\alpha$-$Fe_2O_3$.

14. The CPP giant magnetoresistive head according to claim 12, wherein the antiferromagnetic metal layer comprises Pt—Mn or Ir—Mn.

15. The CPP giant magnetoresistive head according to claim 1;
   wherein the pinned magnetic layer has a laminated ferrimagnetic structure comprising a first pinned magnetic layer and a second pinned magnetic layer which are laminated with a nonmagnetic intermediate layer provided therebetween;
   the nonmagnetic layer and the free magnetic layer are provided below the second pinned magnetic layer;

the first pinned magnetic layer extends to the rear of the free magnetic layer, the nonmagnetic layer, the second pinned magnetic layer and the nonmagnetic intermediate layer in the height direction; and the antiferromagnetic layer is in contact with the upper surface of the rear portion of the first pinned magnetic layer extending in the height direction.

16. The CPP giant magnetoresistive head according to claim 15, further comprising nonmagnetic metal films interposed between the lower shield layer and the free magnetic layer and between the first pinned magnetic layer and the upper shield layer.

17. The CPP giant magnetoresistive head according to claim 16, wherein the nonmagnetic metal film comprises a nonmagnetic metallic material containing at least one element of Au, Ag, Cu, Ru, Rh, Ir, Pd, Ni—Cr, (Ni—Fe)—Cr, and Cr, and when the nonmagnetic metallic material contains Cr, the Cr content exceeds 20 atomic percent.

18. The CPP giant magnetoresistive head according to claim 16, wherein the nonmagnetic metal film interposed between the first pinned magnetic layer and the upper shield layer comprises a first upper nonmagnetic metal film disposed to cover the upper surface of the antiferromagnetic layer, and a second upper nonmagnetic metal film disposed over the first upper nonmagnetic metal film and the first pinned magnetic layer, the first upper nonmagnetic metal film comprising Cr.

19. The CPP giant magnetoresistive head according to claim 16, wherein the nonmagnetic metal film interposed between the lower shield layer and the free magnetic layer comprises any one of Ta/Cu, Ta/Ru/Cu, Ta/Cr, Ta/Ni—Cr, Ta/(Ni—Fe)—Cr, and Cr, and when the material contains Cr, the Cr content exceeds 20 atomic percent.

20. The CPP giant magnetoresistive head according to claim 15, wherein part or entirety of the second pinned magnetic layer comprises Fe—Co—Cu (wherein Fe>10 atomic percent, Co>30 atomic percent, and Cu>5 atomic percent), Fe—Co—Cu—X (wherein X is at least one element of Pt, Pd, Mn, Si, Au, and Ag), or $Co_2MnY$ (wherein Y is at least one element of Ge, Si, Sn, and Al).

21. The CPP giant magnetoresistive head according to claim 15, wherein part or entirety of the free magnetic layer comprises Fe—Co—Cu (wherein Fe >10 atomic percent, Co>30 atomic percent, and Cu>5 atomic percent), Fe—Co—Cu—X (wherein X is at least one element of Pt, Pd, Mn, Si, Au, and Ag), or $Co_2MnY$ (wherein Y is at least one element of Ge, Si, Sn, and Al).

22. The CPP giant magnetoresistive head according to claim 15, further comprising an insulating layer provided below the first pinned magnetic layer and disposed in the rear of the free magnetic layer, the nonmagnetic layer, the second pinned magnetic layer and the nonmagnetic intermediate layer in the height direction.

23. The CPP giant magnetoresistive head according to claim 15, wherein the antiferromagnetic layer is an insulating antiferromagnetic layer.

24. The CPP giant magnetoresistive head according to claim 15, wherein the antiferromagnetic layer comprises an antiferromagnetic metal layer in contact with the first pinned magnetic layer and an insulating antiferromagnetic layer laminated on the antiferromagnetic metal layer.

25. The CPP giant magnetoresistive head according to claim 23, wherein the insulating antiferromagnetic layer comprises Ni—O or $\alpha\text{-}Fe_2O_3$.

26. The CPP giant magnetoresistive head according to claim 24, wherein the antiferromagnetic metal layer comprises Pt—Mn or Ir—Mn.

27. The CPP giant magnetoresistive head according to claim 1;
wherein the pinned magnetic layer has a laminated ferrimagnetic structure comprising a first pinned magnetic layer and a second pinned magnetic layer which are laminated with a nonmagnetic intermediate layer provided therebetween;

the nonmagnetic layer and the free magnetic layer are formed below the second pinned magnetic layer;

each of the second pinned magnetic layer, the nonmagnetic intermediate layer and the first pinned magnetic layer extends to the rear of the nonmagnetic layer and the free magnetic layer in the height direction; and the antiferromagnetic layer is formed in contact with the upper surface of the rear portion of the first pinned magnetic layer which extends in the height direction.

28. The CPP giant magnetoresistive head according to claim 27, further comprising an antioxidative layer comprising an inoxidizable nonmagnetic material and provided between the nonmagnetic layer and the second pinned magnetic layer.

29. The CPP giant magnetoresistive head according to claim 28, wherein the antioxidative layer is formed to a thickness of 5 Å to 10 Å.

30. The CPP giant magnetoresistive head according to claim 27, further comprising nonmagnetic metal films provided between the lower shield layer and the free magnetic layer and between the first pinned magnetic layer and the upper shield layer.

31. The CPP giant magnetoresistive head according to claim 30, wherein each of the nonmagnetic metal film comprises a nonmagnetic metallic material containing at least one element of Au, Ag, Cu, Ru, Rh, Ir, Pd, Ni—Cr, (Ni—Fe)—Cr, and Cr, and when the nonmagnetic metallic material contains Cr, the Cr content exceeds 20 atomic percent.

32. The CPP giant magnetoresistive head according to claim 30, wherein the nonmagnetic metal film interposed between the first pinned magnetic layer and the upper shield layer comprises a first upper nonmagnetic metal film disposed to cover the upper surface of the antiferromagnetic layer, and a second upper nonmagnetic metal film disposed over the first upper nonmagnetic metal film and the first pinned magnetic layer, and the first upper nonmagnetic metal film comprises Cr.

33. The CPP giant magnetoresistive head according to claim 30, wherein the nonmagnetic metal film interposed between the lower shield layer and the free magnetic layer comprises any one of Ta/Cu, Ta/Ru/Cu, Ta/Cr, Ta/Ni—Cr, Ta/(Ni—Fe)—Cr, and Cr, and when the material contains Cr, the Cr content exceeds 20 atomic percent.

34. The CPP giant magnetoresistive head according to claim 27, wherein part or entirety of the second pinned magnetic layer comprises Fe—Co—Cu (wherein Fe>10 atomic percent, Co>30 atomic percent, and Cu>5 atomic percent), Fe—Co—Cu—X (wherein X is at least one element of Pt, Pd, Mn, Si, Au, and Ag), or $Co_2MnY$ (wherein Y is at least one element of Ge, Si, Sn, and Al).

35. The CPP giant magnetoresistive head according to claim 27, wherein pad or entirety of the free magnetic layer comprises Fe—Co—Cu (wherein Fe >10 atomic percent, Co>30 atomic percent, and Cu>5 atomic percent), Fe—Co—Cu—X (wherein X is at least one element of Pt, Pd, Mn, Si, Au, and Ag), or $Co_2MnY$ (wherein Y is at least one element of Ge, Si, Sn, and Al).

36. The CPP giant magnetoresistive head according to claim 27, further comprising an insulating layer interposed below the second pinned magnetic layer and disposed in the rear of the free magnetic layer and the nonmagnetic layer in the height direction.

37. The CPP giant magnetoresistive head according to claim 27, wherein the antiferromagnetic layer is an insulating antiferromagnetic layer.

38. The CPP giant magnetoresistive head according to claim 27, wherein the antiferromagnetic layer comprises an antiferromagnetic metal layer in contact with the first pinned magnetic layer and an insulating antiferromagnetic layer laminated on the antiferromagnetic metal layer.

39. The CPP giant magnetoresistive head according to claim 37, wherein the insulating antiferromagnetic layer comprises Ni—O or $\alpha\text{-Fe}_2\text{O}_3$.

40. The CPP giant magnetoresistive head according to claim 38, wherein the antiferromagnetic metal layer comprises Pt—Mn or Ir—Mn.

* * * * *

UNITED STATES PATENT AND TRADEMARK OFFICE
CERTIFICATE OF CORRECTION

| | |
|---|---|
| PATENT NO. | : 7,220,499 B2 |
| APPLICATION NO. | : 10/823484 |
| DATED | : May 22, 2007 |
| INVENTOR(S) | : Masamichi Saito et al. |

It is certified that error appears in the above-identified patent and that said Letters Patent is hereby corrected as shown below:

In the Claims

Column 52, in claim 35, line 2, before "or entirety of the free" delete "pad" and substitute --part-- in its place.

Signed and Sealed this

Sixth Day of November, 2007

JON W. DUDAS
*Director of the United States Patent and Trademark Office*